US008929161B2

(12) United States Patent
Matsuzaki

(10) Patent No.: US 8,929,161 B2
(45) Date of Patent: Jan. 6, 2015

(54) SIGNAL PROCESSING CIRCUIT

(75) Inventor: Takanori Matsuzaki, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 433 days.

(21) Appl. No.: 13/446,661

(22) Filed: Apr. 13, 2012

(65) Prior Publication Data

US 2012/0269013 A1    Oct. 25, 2012

(30) Foreign Application Priority Data

Apr. 21, 2011  (JP) .................................. 2011-094774
May 14, 2011  (JP) .................................. 2011-108894

(51) Int. Cl.
*G11C 7/00*  (2006.01)
(52) U.S. Cl.
CPC ........................................ *G11C 7/00* (2013.01)
USPC ....... 365/191; 365/154; 365/189.05; 365/149
(58) Field of Classification Search
USPC .............................. 365/191, 154, 189.05, 149
See application file for complete search history.

(56) References Cited

U.S. PATENT DOCUMENTS

| | | | |
|---|---|---|---|
| 5,731,856 A | 3/1998 | Kim et al. | |
| 5,744,864 A | 4/1998 | Cillessen et al. | |
| 6,127,702 A | 10/2000 | Yamazaki et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |

(Continued)

FOREIGN PATENT DOCUMENTS

| | | |
|---|---|---|
| EP | 1 737 044 A1 | 12/2006 |
| EP | 2 226 847 A2 | 9/2010 |

(Continued)

OTHER PUBLICATIONS

Asakuma, N. et al., "Crystallization and Reduction of Sol-Gel-Derived Zinc Oxide Films by Irradiation With Ultraviolet Lamp," Journal of Sol-Gel Science and Technology, 2003, vol. 26. pp. 181-184.

(Continued)

*Primary Examiner* — Toan Le
(74) *Attorney, Agent, or Firm* — Fish & Richardson P.C.

(57) ABSTRACT

A signal processing circuit including a nonvolatile storage circuit with a novel structure. The signal processing circuit includes a circuit that is supplied with a power supply voltage and has a first node to which a first high power supply potential is applied, and a nonvolatile storage circuit for holding a potential of the first node. The nonvolatile storage circuit includes a transistor whose channel is formed in an oxide semiconductor layer, and a second node that is brought into a floating state when the transistor is turned off. A second high power supply potential or a ground potential is input to a gate of the transistor. When the power supply voltage is not supplied, the ground potential is input to the gate of the transistor and the transistor is kept off. The second high power supply potential is higher than the first high power supply potential.

19 Claims, 21 Drawing Sheets

(56) References Cited

U.S. PATENT DOCUMENTS

| | | | |
|---|---|---|---|
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 8,507,907 B2 * | 8/2013 | Takahashi et al. | 257/43 |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0148171 A1 | 6/2010 | Hayashi et al. | |
| 2011/0121878 A1 | 5/2011 | Kato et al. | |
| 2011/0148463 A1 | 6/2011 | Kato et al. | |
| 2011/0187410 A1 | 8/2011 | Kato et al. | |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 10-078836 A | 3/1998 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| WO | 2004/114391 A1 | 12/2004 |

OTHER PUBLICATIONS

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Fung, T et al., "2-D Numerical Simulation of High Performance Amorphous In—Ga—Zn—O TFTs for Flat Panel Displays,"AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTS," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTS) for AMLCDS," Journal of the SID , 2007, vol. 15, No. 1, pp. 17-22.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

(56) References Cited

OTHER PUBLICATIONS

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda., T et al., "Full-Functional System Liquid Crystal Display Using CG-Silicon Technology," SID Digest '04 : SID International Symposium Digest of Technical Papers, 2004, vol. 35, pp. 860-863.

Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kimizuka, N. et al., "Spinel,YBFE2O4, and YB2FE3O7 Types of Structures for Compounds in the In2O3 and Sc2O3-A2O3-Bo Systems [A; Fe, Ga, or Al; B: Mg, Mn, Fe, Ni, Cu,or Zn] at Temperatures Over 1000° C," Journal of Solid State Chemistry, 1985, vol. 60, pp. 382-384.

Kimizuka, N et al., "Syntheses and Single-Crystal Data of Homologous Compounds, In2O3(ZnO)m (m = 3, 4, and 5). InGaO3(ZnO)3, and Ga2O3(ZnO)m (m = 7, 8, 9, and 16) in the In2O3—ZnGa2O4—ZnO System," Journal of Solid State Chemistry, Apr. 1, 1995, vol. 116, No. 1, pp. 170-178.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium—Oxide-Based Thin-Film Transistors by DC Sputtering," SID Digest '09 : SID International Symposium Digest of Technical Papers, May 31, 2009, pp. 191-193.

Miyasaka, M, "SUFTLA Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, M et al., "The phase relations In2O3—Ga2ZnO4—ZnO system at 1350° C," Journal of Solid State Chemistry, Aug. 1, 1991, vol. 93, No. 2, pp. 298-315.

Nomura, K et al., "Thin-Film Transistor Fabricated in Single-Cyrstalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors." Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem OLEDS," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Ohara, H et al., "21.3: 4.0 In. QVGA AMOLED Display Using In—Ga—Zn—Oxide TFTS With a Novel Passivation Layer," SID Digest '09 : SID International Symposium Digest of Technical Papers, May 31, 2009, pp. 284-287.

Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci, Technol. B (Journal of Vacuum Science & Technology B), Mar. 1, 2003, vol. 21, No. 2, pp. 800-803.

Park. J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Park. J et al., "High performance amorphous oxide thin film transistors with self-aligned top-gate structure," IEDM 09: Technical Digest of International Electron Devices Meeting, Dec. 7, 2009, pp. 191-194.

Park, J et al., "Amorphous Indium—Gallium—Zinc Oxide TFTS and Their Application for Large Size AMOLED." AM-FPD '08 Digest of Technical Papers, Jul. 2, 2008, pp. 275-278.

Park. S et al., "Challenge to Future Displays: Transparent AM-OLED Driven by PEALD Grown ZnO TFT," IMID '07 Digest, 2007, pp. 1249-1252.

Sakata, J et al., "Development of 4.0-In. AMOLED Display With Driver Circuit Using Amorphous In—Ga—Zn—Oxide TFTS," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van de Walle, C, "Hydrogen as a Cause of Doping Zinc Oxide," Phys. Rev. Lett. (Physical Review Letters), Jul. 31, 2000, vol. 85, No. 5, pp. 1012-1015.

Sanghun Jeon et al.; "180nm Gate Length Amorphous InGaZnO Thin Film Transistor for High Density Image Sensor Applications"; IEDM 10: Technical Digest of International Electron Devices Meeting; Dec. 6, 2010; pp. 504-507.

Ihun Song et al.; "Short Channel Characteristics of Gallium—Indium—Zinc—Oxide Thin Film Transistors for Three-Dimensional Stacking Memory"; IEEE Electron Device Letters; Jun. 2008; pp. 549-552; vol. 29, No. 6.

(56) References Cited

OTHER PUBLICATIONS

Tomoyuki Ishii et al.; A Poly-Silicon TFT With a Sub-5-nm Thick Channel for Low-Power Gain Cell Memory in Mobile Applications; IEEE Transactions on Electron Devices; Nov. 1, 2004; pp. 1805-1810; vol. 51, No. 11.

Wonchan Kim et al.; "An Experimental High-Density DRAM Cell with a Built-in Gain Stage"; IEEE Journal of Solid-State Circuits; Aug. 1, 1994; pp. 978-981; vol. 29, No. 8.

Shoji Shukuri et al.; "A Complementary Gain Cell Technology for Sub-1V Supply DRAMs"; IEDM 92: Technical Digest of International Electron Devices Meeting; Dec. 13, 1992; pp. 1006-1008.

Shoji Shukuri et al.; "A Semi-Static Complementary Gain Cell Technology for Sub-1 V Supply DRAM's"; IEEE Transactions on Electron Devices; Jun. 1, 1994; pp. 926-931; vol. 41, No. 6.

Toshio Kamiya et al.; "Carrier Transport Properties and Electronic Structures of Amorphous Oxide Semiconductors: The present status"; Solid State Physics; Sep. 1, 2009; pp. 621-633; vol. 44, No. 9; AGNE Gijutsu Center (with full English translation).

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09: SID International Symposium Digest of Technical Papers, 2009, pp. 395-398.

Chern, H et at, "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and SN-Doped Zinc Indium Oxide Thin Film Transistors for Amoled Back-Plane," SID Digest '09: SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., Optical Studies of the Amorphous Liquid-Cholesteric Liquid Crystal Transition: the "Blue Phase," Physics Letters, Sep. 10, 1973, vol. 45A, No. 2, pp. 115-116.

Costello, M et al., "Electron Microscopy of a Cholesteric Liquid Crystal and its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZNO Thin-Film Transistors Produced At Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In-Ga-Zn-O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In-Ga-Zn-Oxide TFT," SID Digest '09: SID International Symposium Digest of Technical Papers, May 31, 2009, pp. 1110-1112.

Godo, H et al., "Temperature Dependence of Characteristics and Electronic Structure for Amorphous In-Ga-Zn-Oxide TFT," AM-FPD '09 Digest of Technical Papers, Jul. 1, 2009, pp. 41-44.

Hayashi, R et al., "42.1: Invited Paper: Improved Amorphous In-Ga-Zn-O Tfts," SID Digest '08: SID International Symposium Digest of Technical Papers, May 20, 2008, vol. 39, pp. 621-624.

Hirao, T et al., "Novel Top-Gate Zinc Oxide Thin-Film Transistors (ZNO TFTS) for AMLCDS," Journal of the SID, 2007, Vol, 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper: Transparent Amorphous Oxide Semiconductors for High Performance TFT," SID Digest '07: SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08: SID International Symposium Digest of Technical Papers, 2008, vol. 39, pp. 1277-1280.

Ikeda., T et al., "Full-Functional System Liquid Crystal Display Using CG-Silicon Technology," SID Digest '04: SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium-Gallium-Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09: SID International Symposium Digest of Technical Papers, May 31, 2009, pp. 983-985.

Kanno, H et al., "White Stacked Electrophosphorecent Organic Light-Emitting Devices Employing M003 As a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," the Electrochemical Society, 214TH Ecs Meeting, 2008, No. 2317, 1 page.

Kimizuka, N. et al., "Spinel, YBFE2O4, and YB2FE3O7 Types of Structures for Compounds in the IN2O3 and SC2O3-A2O3-B0 Systems [A; Fe, Ga, or Al; B: Mg, Mn, Fe, Ni, Cu,or Zn] At Temperatures Over 1000°C," Journal of Solid State Chemistry, 1985, vol. 60, pp. 382-384.

Kimizuka, N et al., "Syntheses and Single-Crystal Data of Homologous Compounds, In2O3(ZnO)m (m =3, 4, and 5), InGaO3(ZnO)3, and Ga2O3(ZnO)m (m =7, 8, 9, and 16) in the In2O3-ZnGa2O4-ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06: Proceedings of the 13th International Display Workshops, Dec. 7, 2006, pp. 663-666.

Lee, J et al., "World'S Largest (15-Inch) XGA AMLCD Panel Using IGZO Oxide TFT," SID Digest '08: SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09: SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

(56) References Cited

OTHER PUBLICATIONS

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "Suftla Flexible Microelectronics on Their Way to Business," SID Digest '07: SID International Symposium Digest of Technical Papers, 2007, vol. 38, pp. 1673-1676.

Mo, Y et al., "Amorphous Oxide TFT Backplanes for Large Size AMOLED Displays," IDW '08: Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the $In_2O_3$-$ga2ZnO4$-ZnO system at 1350°C," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics), 2006, vol. 45, No. 5B, pp. 4303-4308.

Nomura, K et al., "Room-Temperature Fabrication of Transparent Flexible Thin-Film Transistors using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline $InFaO_3(ZnO)_5$ films," Appl. Phys. Lett. (Applied Physics Letters), Sep. 13, 2004, vol. 85, No. 11, pp. 1993-1995.

Nowatari, H et al., "60.2: Intermediate Connector With Suppressed Voltage Loss for White Tandem OLEDS," SID Digest '09: SID International Symposium Digest of Technical Papers, May 31, 2009, vol. 40, pp. 899-902.

Oba, F et al., "Defect energetics in ZnO: A hybrid Haries-Fock density functional study," Phys. Rev. B (Physical Review. B), 2008, vol. 77, pp. 245202-1-245202-6.

Oh, M et al., "Improving the Gate Stability of ZNO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 in. QVGA AMOLED Display Using In-Ga-Zn-Oxide Tfts With a Novel Passivation Layer," SID Digest '09: SID International Symposium Digest of Technical Papers May 31, 2009, pp. 284-287.

Ohara, H et al., "Amorphous In-Ga-Zn-Oxide TFTs with Suppressed Variation for 4.0 inch QVGA AMOLED Display," Am-Fpd '09 Digest of Technical Papers, Jul. 1, 2009, pp. 227-230, the Japan Society of Applied Physics in.

Orita, M et al., "Amorphous transparent conductive oxide $InGaO_3(ZnO)m$ (m<4):a Zn4s conductor," Philosophical Magazine, 2001, vol. 81, No. 5, pp. 501-515.

Orita, M et al., "Mechanism of Electrical Conductivity of Transparent $InGaZn04$," Phys. Rev. B (Physical Review. B), Jan. 15, 2000, vol. 61, No. 3, pp. 1811-1816.

Osada, T et al., "15.2: Development of Driver-Integrated Panel using Amorphous In-Ga-Zn-Oxide TFT," SID Digest '09: SID International Symposium Digest of Technical Papers, May 31, 2009, pp. 184-187.

Osada, T et al., "Development of Driver-Integrated Panel Using Amorphous In-Ga-Zn-Oxide TFT," AM-FpPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium-Gallium-Zinc Oxide TFTS and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZNO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. Amoled Display With Driver Circuit Using Amorphous In-Ga-Zn-Oxide Tfts," IDW '09: Proceedings of the 16TH International Display Workshops, 2009, pp. 689-692.

Son, K et al., "42.4L: Late-News Paper: 4 Inch QVGA AMOLED Driven by the Threshold Voltage Controlled Amorphous GIZO ($Ga2O3$-$In2O3$-ZnO) TFT," SID Digest '08: SID International Symposium Digest of Technical Papers, May 20, 2008, vol. 39, pp. 633-636.

Takahashi, M et al., "Theoretical Analysis of IGZO Transparent Amorphous Oxide Semiconductor," Idw '08: Proceedings of the 15TH International Display Workshops, Dec. 3, 2008, pp. 1637-1640.

Tsuda, K et al., "Ultra Low Power Consumption Technologies for Mobile TFT-LCDs," IDW '02: Proceedings of the 9TH International Display Workshops, Dec. 4, 2002, pp. 295-298.

Ueno, K et al., "Field-Effect Transistor on $SrTiO_3$ With Sputtered $Al_2O_3$ Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

* cited by examiner

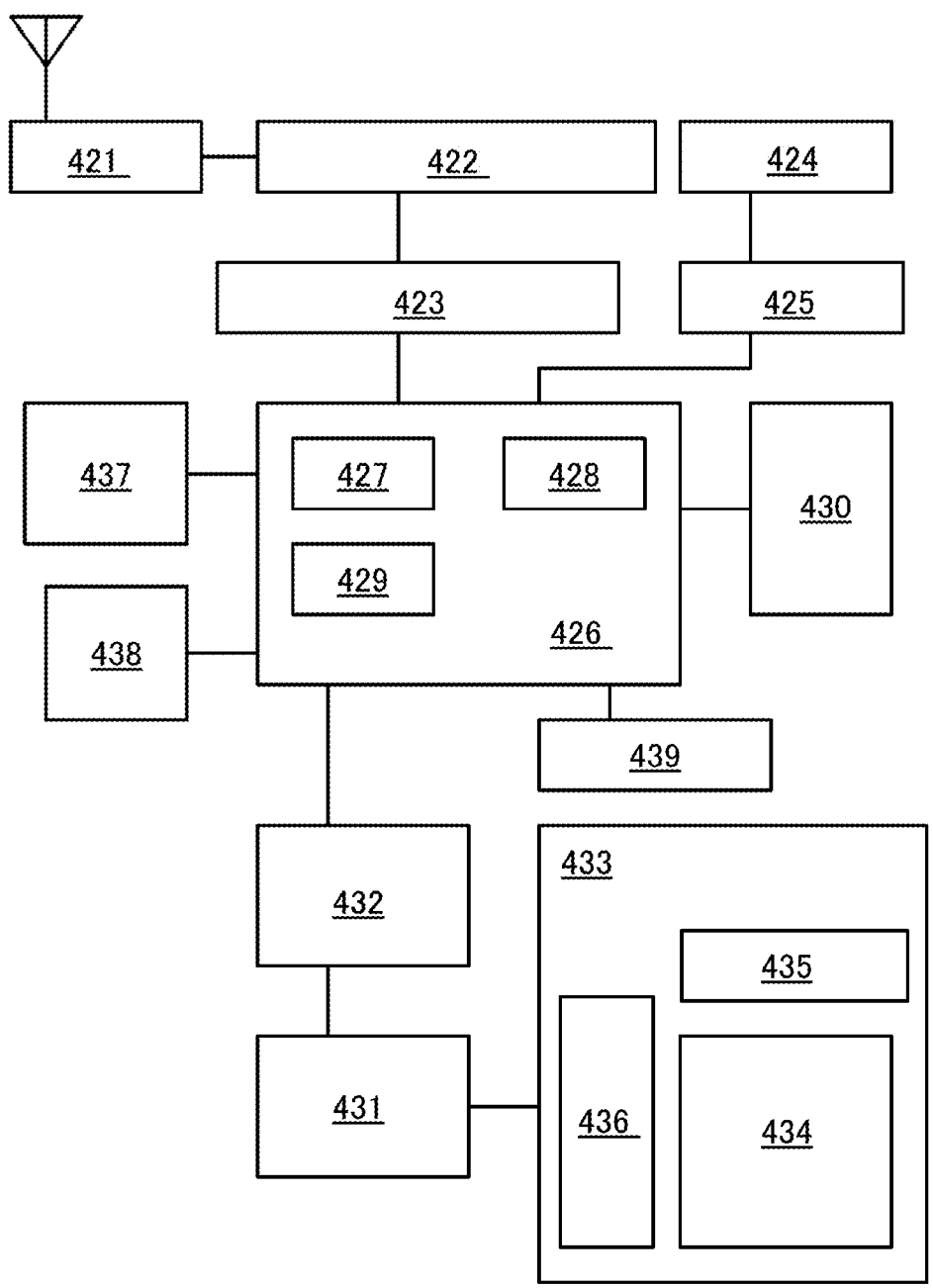

FIG. 12A        FIG. 12B
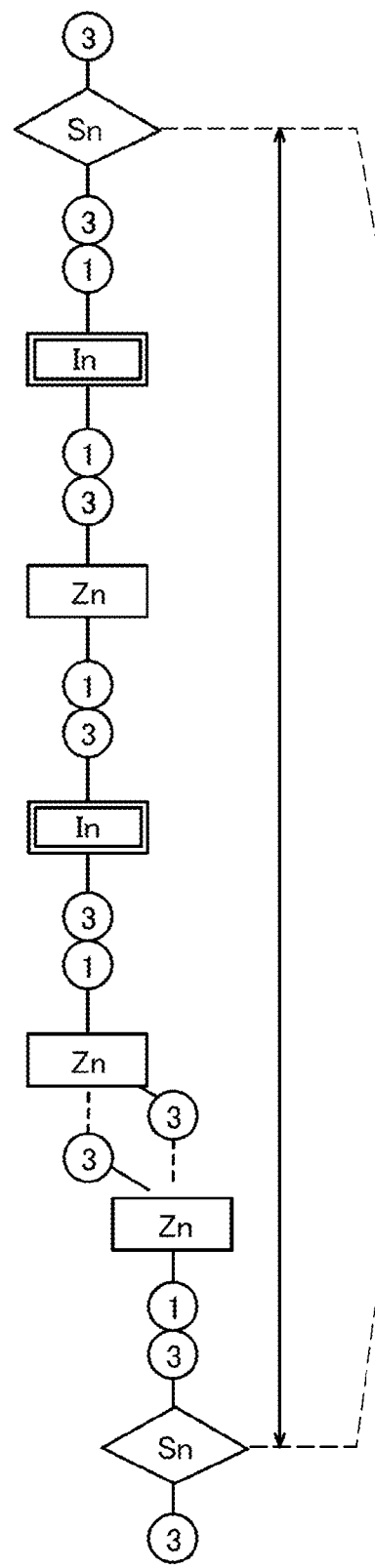
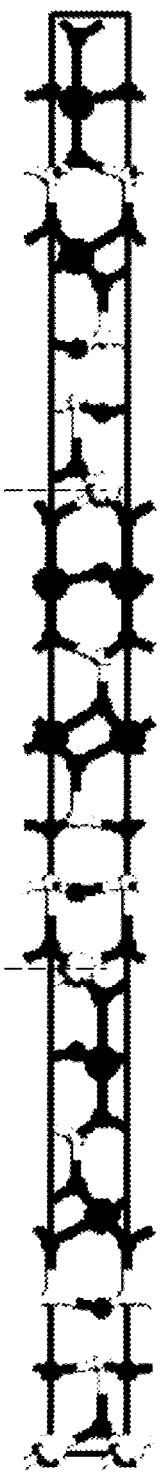
FIG. 12C
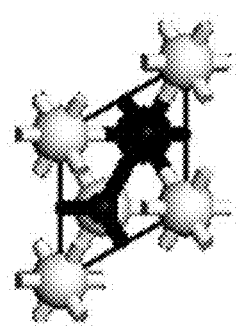
● In
☾ Sn
⌣ Zn
• O

SIGNAL PROCESSING CIRCUIT

BACKGROUND OF THE INVENTION

1. Field of the Invention

The present invention relates to a storage circuit that can keep a stored logic state even when power is off, and a storage device and a signal processing circuit that include the storage circuit. The present invention also relates to an electronic device including the storage circuit or the signal processing circuit.

2. Description of the Related Art

Signal processing circuits such as central processing units (CPUs) have a variety of configurations depending on their application and are generally provided with a variety of storage circuits such as a register and a cache memory as well as a main memory for storing data or a program.

In a storage circuit such as a register or a cache memory, data needs to be read and written at higher speed than in a main memory. Thus, in general, a flip-flop is used as a register, and a static random access memory (SRAM) or the like is used as a cache memory. That is, a volatile storage circuit in which data is erased when supply of power supply voltage is stopped is used for such a register, a cache memory, and the like.

In order to reduce consumed power, there has been suggested a method of temporarily stopping supply of power supply voltage to a signal processing circuit in a period during which data is not input and output. In that method, a nonvolatile storage circuit is located in the periphery of a volatile storage circuit such as a register or a cache memory, and data is temporarily stored in the nonvolatile storage circuit. Thus, the register, the cache memory, or the like holds data even while supply of the power supply voltage is stopped in a signal processing circuit (e.g., see Patent Document 1).

In addition, in the case where supply of the power supply voltage is stopped in a signal processing circuit for a long time, data in a volatile storage circuit may be transferred to an external storage device such as a hard disk or a flash memory before supply of the power supply voltage is stopped, in which case the data can be prevented from being erased.

REFERENCE

Patent Document 1: Japanese Published Patent Application No. H10-078836

SUMMARY OF THE INVENTION

In a signal processing circuit such as that disclosed in Patent Document 1, a ferroelectric is used for a memory element included in a nonvolatile storage circuit. In the memory element containing a ferroelectric, a ferroelectric material is fatigued by repetition of data writing, which causes a problem such as a writing error. As a result, the number of rewrite cycles is limited.

In the case where a flash memory is used as a nonvolatile storage circuit, electrons are injected and released by tunnel current generated by application of high voltage. This leads to a problem such that memory elements deteriorate significantly by repeated data rewriting, and the number of rewrite cycles is therefore limited.

In view of the above problems, an object of one embodiment of the present invention is to provide a signal processing circuit including a nonvolatile storage circuit with a novel structure (a storage circuit in which a stored logic state is kept even when supply of a power supply voltage is stopped).

Specifically, an object is to provide a signal processing circuit including a storage circuit with a novel structure in which a potential difference between a ground potential (0 V) and a high power supply potential (a potential higher than the ground potential) is applied as a power supply voltage and a stored logic state is kept even after supply of the power supply voltage is stopped, that is, even after supply of the high power supply potential is stopped.

According to one embodiment of the present invention, a signal processing circuit includes a circuit having a node to which a first high power supply potential (a potential higher than a ground potential) is selectively applied, and a nonvolatile storage circuit for holding a potential of the node. The circuit can be an arithmetic circuit or a volatile storage circuit, for example. The node can be, for example, an input terminal or an output terminal (i.e., an input terminal or an output terminal of an arithmetic circuit or an input terminal or an output terminal of a volatile storage circuit). Supply of a power supply voltage to the circuit is stopped by stopping supply of the first high power supply potential to the circuit, and the power supply voltage is supplied to the circuit by supplying the first high power supply potential to the circuit. The power supply voltage which corresponds to a difference between the first high power supply potential and the ground potential (0 V, corresponding to a low power supply potential) is selectively supplied to the signal processing circuit. Supply of the power supply voltage to the signal processing circuit is stopped by stopping supply of the first high power supply potential to the signal processing circuit, and the power supply voltage is supplied to the signal processing circuit by supplying the first high power supply potential to the signal processing circuit.

According to one embodiment of the present invention, a signal processing circuit includes a circuit that is selectively supplied with a power supply voltage corresponding to a difference between a first high power supply potential (a potential higher than a ground potential) and a ground potential (0 V, corresponding to a low power supply potential), and a nonvolatile storage circuit for holding an output potential of the circuit. The circuit can be an arithmetic circuit or a volatile storage circuit, for example. Supply of a power supply voltage to the circuit is stopped by stopping supply of the first high power supply potential to the circuit, and the power supply voltage is supplied to the circuit by supplying the first high power supply potential to the circuit. The power supply voltage which corresponds to a difference between the first high power supply potential and the ground potential (0 V, corresponding to a low power supply potential) is selectively supplied to the signal processing circuit. Supply of the power supply voltage to the signal processing circuit is stopped by stopping supply of the first high power supply potential to the signal processing circuit, and the power supply voltage is supplied to the signal processing circuit by supplying the first high power supply potential to the signal processing circuit.

According to one embodiment of the present invention, a signal processing circuit includes a combination of a volatile storage circuit that is selectively supplied with a power supply voltage corresponding to a difference between a first high power supply potential and a ground potential (0 V, corresponding to a low power supply potential), and a nonvolatile storage circuit for storing data held in the volatile storage circuit. Supply of a power supply voltage to the volatile storage circuit is stopped by stopping supply of the first high power supply potential to the volatile storage circuit, and the power supply voltage is supplied to the volatile storage circuit by supplying the first high power supply potential to the volatile storage circuit. The power supply voltage which corresponds to a difference between the first high power supply potential and the ground potential (0 V, corresponding to a low power supply potential) is selectively supplied to the signal processing circuit. Supply of the power supply voltage to the signal processing circuit is stopped by stopping supply of the first high power supply potential to the signal processing circuit, and the power supply voltage is supplied to the signal processing circuit by supplying the first high power supply potential to the signal processing circuit.

The nonvolatile storage circuit includes a transistor with extremely low off-state current, and a capacitor having a pair of electrodes one of which is electrically connected to a node (hereinafter also referred to as retention node) that is brought into a floating state when the transistor is turned off. Note that the gate capacitance of another transistor or the like can be used instead of providing a capacitor. For example, the retention node can be electrically connected to a gate of a transistor included in arithmetic circuit or a storage circuit included in the signal processing circuit. In that case, it is not always necessary to provide the capacitor having a pair of electrodes one of which is electrically connected to the retention node.

In such a nonvolatile storage circuit, the transistor with extremely low off-state current is turned on by inputting a second high power supply potential to the gate of the transistor. Here, the second high power supply potential is higher than the first high power supply potential. For example, (the second high power supply potential)>(the first high power supply potential)+Vth is set, where Vth is the threshold voltage of the transistor with extremely low off-state current. Then, a predetermined potential is input to the retention node through the transistor in the on state. After that, the transistor is turned off by inputting the ground potential (0 V, corresponding to the low power supply potential) to the gate of the transistor, and the predetermined potential is held. Note that the transistor with extremely low off-state current is an enhancement-mode (normally-off) n-channel transistor. When supply of the power supply voltage to the whole signal processing circuit or some circuits included in the signal processing circuit is stopped, the ground potential (0 V) continues to be input to the gate of the transistor. For example, the gate of the transistor is grounded through a load such as a resistor. Accordingly, the transistor can be kept off even after supply of the power supply voltage to the whole signal processing circuit or some circuits included in the signal processing circuit is stopped; thus, the potential of the retention node can be held for a long time.

Further, such a nonvolatile storage circuit stores data in such a manner that a signal potential corresponding to data is input to the retention node, the transistor with extremely low off-state current is turned off, and the retention node is brought into a floating state. Thus, in the nonvolatile storage circuit, it is possible to reduce fatigue of the element due to repetition of data rewriting and to increase data rewrite cycles.

The signal processing circuit according to one embodiment of the present invention may include a step-up circuit for boosting the first high power supply potential to generate the second high power supply potential, in addition to the above components. The step-up circuit can include a first to (n+1)th transistors (n is a natural number) electrically connected in series with each other, and an i-th capacitor (i is a natural number of n or less) having a pair of electrodes one of which is electrically connected to a portion where the i-th transistor and the (i+1)th transistor among these transistors are connected to each other. At least one or all of the first to (n+1)th transistors may be transistors with extremely low off-state current. By using the transistors with extremely low off-state current in the step-up circuit as above, the stepped-up voltage (the voltage held in the i-th capacitor) can be retained for a long time even after supply of the power supply voltage is stopped. Consequently, the step-up circuit can generate the second high power supply potential quickly after supply of the power supply voltage is selected. Accordingly, the transistor with extremely low off-state current included in the nonvolatile storage circuit can be turned off quickly after supply of the power supply voltage is selected.

In addition, the step-up circuit can be constituted by a bootstrap circuit. Note that the signal processing circuit may include a plurality of nonvolatile storage circuits described above, and a step-up circuit constituted by a bootstrap circuit may be provided for each of the nonvolatile storage circuits.

As a transistor with extremely low off-state current, it is possible to use a transistor whose channel is formed in a layer or in a substrate containing a semiconductor having a wider band gap than silicon. An example of the semiconductor having a wider band gap than silicon is a compound semiconductor, such as an oxide semiconductor and a nitride semiconductor. For example, as a transistor with extremely low off-state current, a transistor whose channel is formed in an oxide semiconductor layer can be used.

The volatile storage circuit can include at least two arithmetic circuits, and have a feedback loop such that an output of one of the arithmetic circuits is input to the other arithmetic circuit and an output of the other arithmetic circuit is input to the one arithmetic circuit. Examples of the storage circuit with such a structure are a flip-flop circuit and a latch circuit.

As the arithmetic circuit, an inverter, a clocked inverter, a three-state buffer, a NAND circuit, a NOR circuit, or the like can be used.

Note that a signal processing circuit of the present invention includes, in its category, large scale integrated circuits (LSIs) such as a CPU, a microprocessor, an image processing circuit, a digital signal processor (DSP), and a field programmable gate array (FPGA), and the like.

The above-described signal processing circuit can employ a driving method by which the power supply voltage is supplied only when necessary (hereinafter also referred to as normally-off driving method).

One embodiment of a method for driving the signal processing circuit in the case of employing a normally-off driving method is as follows.

While the power supply voltage is supplied, the potential of a predetermined node (e.g., an input terminal or an output terminal of the arithmetic circuit or an input terminal or an output terminal of the volatile storage circuit) included in the signal processing circuit is input to and stored in the nonvolatile storage circuit (hereinafter also "data storage"). Specifically, in the nonvolatile storage circuit, the second high power supply potential is input to the gate of the transistor with extremely low off-state current to turn on the transistor. Then, the potential of the predetermined node (e.g., the input terminal or output terminal of the arithmetic circuit or the input terminal or output terminal of the volatile storage circuit) in the signal processing circuit is input to the retention node through the transistor in the on state. Here, the potential input to the gate of the transistor with extremely low off-state current to turn on the transistor (i.e., the second high power supply potential) is higher than the first high power supply potential and, for example, higher than (the first high power supply potential)+Vth.

Here, the first high power supply potential is selectively applied to the predetermined node (e.g., the input terminal or output terminal of the arithmetic circuit or the input terminal or output terminal of the volatile storage circuit) in the signal processing circuit. Given that the potential input to the gate of the transistor with extremely low off-state current to turn on the transistor (i.e., the second high power supply potential) is the same as the first high power supply potential when the potential of the predetermined node is the first high power supply potential, a potential input to the retention node is a potential that is decreased from the first high power supply potential by Vth.

On the other hand, when the potential input to the gate of the transistor with extremely low off-state current to turn on the transistor (i.e., the second high power supply potential) is higher than the first high power supply potential, for example, higher than (the first high power supply potential)+Vth, the above-described potential loss can be suppressed. As a result, the potential of the predetermined node (e.g., the input terminal or output terminal of the arithmetic circuit or the input terminal or output terminal of the volatile storage circuit) in the signal processing circuit can be precisely input to the retention node. Thus, the potential of the predetermined node can be precisely stored in the nonvolatile storage circuit.

Then, the potential of the retention node is prevented from varying in response to the potential of the predetermined node (hereinafter also "data standby"). Specifically, the transistor with extremely low off-state current is turned off by inputting the ground potential (0 V, corresponding to the low power supply potential) to the gate of the transistor. Thus, the retention node in the nonvolatile storage circuit is brought into a floating state. By employing a structure where the gate of the transistor with extremely low off-state current is grounded through a load such as a resistor, the ground potential (0 V, corresponding to the low power supply potential) can be input to the gate of the transistor when the second high power supply potential is not input to the gate.

After the data standby, supply of the power supply voltage to the circuit having the predetermined node is stopped. With a structure where the ground potential (0 V) continues to be input to the gate of the transistor with extremely low off-state current even after supply of the power supply voltage is stopped, the potential of the predetermined node can be held by the nonvolatile storage circuit.

Then, the power supply voltage is selectively supplied to the circuit having the predetermined node when needed. That is, the first high power supply potential is selectively supplied to the circuit having the predetermined node. After supply of the power supply voltage to the circuit having the predetermined node is selected, the potential held in the nonvolatile storage circuit is transferred to the predetermined node (hereinafter also "data supply"). In such a manner, a predetermined operation can be performed in the circuit which is selectively supplied with the power supply voltage. Note that data supply can be performed, for example, by turning off the transistor with extremely low off-state current by input of the second high power supply potential to the gate. In that case, when the potential input to the gate of the transistor with extremely low off-state current to turn on the transistor (i.e., the second high power supply potential) is higher than the first high power supply potential, for example, higher than (the first high power supply potential)+Vth, the signal potential corresponding to data held in the nonvolatile storage circuit can be precisely returned to the predetermined node. Thus, the potential held in the nonvolatile storage circuit can be precisely supplied to the predetermined node. In the circuit which is selectively supplied with the power supply voltage, a predetermined operation is performed using the potential supplied from the nonvolatile storage circuit.

Specifically, the following is one embodiment of a driving method in the case where a signal processing circuit that includes a storage circuit composed of a combination of a volatile storage circuit and a nonvolatile storage circuit employs a normally-off driving method.

While the power supply voltage is supplied, data held in the volatile storage circuit is input to and stored in the nonvolatile storage circuit (data storage). Specifically, in the nonvolatile storage circuit, the second high power supply potential is input to the gate of the transistor with extremely low off-state current to turn on the transistor. Then, a signal potential corresponding to the data held in the volatile storage circuit is input to the retention node through the transistor in the on state. Here, the potential input to the gate of the transistor with extremely low off-state current to turn on the transistor (i.e., the second high power supply potential) is higher than the first high power supply potential, for example, higher than (the first high power supply potential)+Vth.

Here, the signal potential corresponding to the data held in the volatile storage circuit is the first high power supply potential or the ground potential (0 V, corresponding to the low power supply potential). Given that the potential input to the gate of the transistor with extremely low off-state current to turn on the transistor (i.e., the second high power supply potential) is the same as the first high power supply potential when the signal potential corresponding to the data held in the volatile storage circuit is the first high power supply potential, a potential input to the retention node is a potential that is decreased from the first high power supply potential by Vth.

On the other hand, when the potential input to the gate of the transistor with extremely low off-state current to turn on the transistor (i.e., the second high power supply potential) is higher than the first high power supply potential, for example, higher than (the first high power supply potential)+Vth, the above potential loss can be suppressed. As a result, the signal potential corresponding to the data held in the volatile storage circuit can be precisely input to the retention node. Thus, the data held in the volatile storage circuit can be precisely stored in the nonvolatile storage circuit.

The data storage can be performed at the same time as or after retention of predetermined data in the volatile storage circuit. Then, the data stored in the nonvolatile storage circuit is prevented from varying in response to the signal from the volatile storage circuit (data standby). Specifically, the transistor with extremely low off-state current is turned off by inputting the ground potential (0 V, corresponding to the low power supply potential) to the gate of the transistor. Thus, the retention node in the nonvolatile storage circuit is brought into a floating state. By employing a structure where the gate of the transistor with extremely low off-state current is grounded through a load such as a resistor, the ground potential (0 V, corresponding to the low power supply potential) can be input to the gate of the transistor when the second high power supply potential is not input to the gate.

After the data standby, supply of the power supply voltage to the volatile storage circuit is stopped. With a structure where the ground potential (0 V) continues to be input to the gate of the transistor with extremely low off-state current even after supply of the power supply voltage is stopped, data stored in the volatile storage circuit can be held by the nonvolatile storage circuit.

Then, the power supply voltage is selectively supplied to the volatile storage circuit when needed. That is, the first high power supply potential is selectively supplied to the volatile storage circuit. After supply of the power supply voltage to the volatile storage circuit is selected, the data held in the nonvolatile storage circuit is transferred to the volatile storage circuit (data supply). In such a manner, a predetermined operation can be performed in the volatile storage circuit which is selectively supplied with the power supply voltage. Note that data supply can be performed, for example, by turning off the transistor with extremely low off-state current by input of the second high power supply potential to the gate. In that case, when the potential input to the gate of the transistor with extremely low off-state current to turn on the transistor (i.e., the second high power supply potential) is higher than the first high power supply potential, for example, higher than (the first high power supply potential)+Vth, the signal potential corresponding to the data held in the nonvolatile storage circuit can be precisely returned to the volatile storage circuit. Thus, the data held in the nonvolatile storage circuit can be precisely supplied to the volatile storage circuit. The volatile storage circuit performs a predetermined operation by using the potential supplied from the nonvolatile storage circuit.

In the signal processing circuit according to the present invention, the potential of a predetermined node in the signal processing circuit can be stored in a nonvolatile storage circuit. Moreover, the potential held in the nonvolatile storage circuit can be precisely supplied to the predetermined node. Accordingly, employing a normally-off driving method makes it possible to reduce writing errors and reading errors caused when data is stored or supplied. It is therefore possible to provide a signal processing circuit with significantly low power consumption and high reliability. In addition, since a circuit with a large number of write cycles and high reliability is used as the nonvolatile storage circuit, the endurance and reliability of the signal processing circuit can be increased.

One of features of the present invention is that a potential input to a gate of a transistor with extremely low off-state current to turn on the transistor is higher than a potential input to a source or a drain of the transistor, for example, by the threshold voltage of the transistor, and thus a signal potential can be precisely transmitted through the transistor. Therefore, the present invention is not limited to a signal processing circuit and is applicable to any semiconductor device including a transistor having the following structure: a potential input to its gate to turn it on is higher than a potential input to its source or drain, for example, by the threshold voltage. The use of such a transistor makes it possible to increase the quality of a semiconductor device. For example, the present invention can be a display device including the transistor in each pixel. Examples of a display device are a liquid crystal display device and an electroluminescent display device. That is, the transistor may be used as a transistor for controlling input of a signal voltage to a liquid crystal element or an electroluminescent element; thus, a display device with high display quality can be provided. For example, the present invention can be a storage device including the transistor in a memory cell, and a highly reliable storage device can be provided as a result. Furthermore, the present invention can be, for instance, an image sensor and a touch panel that include the transistor in each pixel for taking images. Thus, a highly reliable image sensor and a highly reliable touch panel can be provided.

BRIEF DESCRIPTION OF THE DRAWINGS

In the accompanying drawings.

FIG. 9 is a block diagram of a portable electronic device;
FIGS. 12A to 12C are examples of oxide semiconductors.

DETAILED DESCRIPTION OF THE INVENTION

Figure 1A:
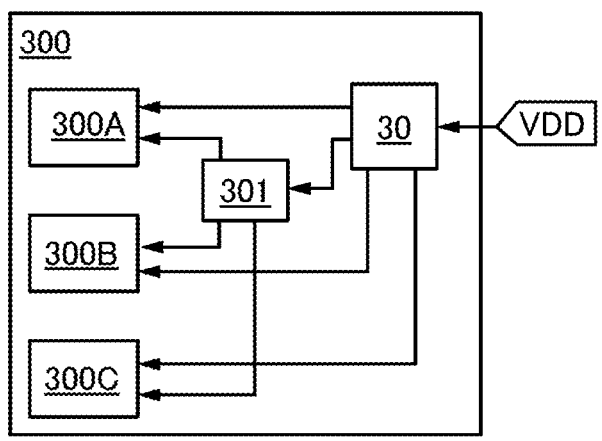
FIG. 1A is a block diagram of a signal processing circuit and FIG. 1B is a circuit diagram of a step-up circuit.

Embodiments of the present invention will be described below with reference to the accompanying drawings. Note that the present invention is not limited to the following description, and it is easily understood by those skilled in the art that the mode and details can be variously changed without departing from the scope and spirit of the present invention. Therefore, the present invention should not be construed as being limited to the description of the embodiments below.

Note that functions of a "source" and a "drain" may be interchanged in the case where transistors of different polarities are employed or in the case where the direction of current flow changes in a circuit operation, for example. Therefore, the terms "source" and "drain" can be interchanged in this specification.

The term "electrically connected" includes the case where components are connected through an "object having any electric function". There is no particular limitation on the object having any electric function as long as electric signals can be transmitted and received between the components connected through the object. Examples of the object having any electric function are a switching element such as a transistor, a resistor, an inductor, a capacitor, and an element with a variety of functions as well as an electrode and a wiring.

Even when a circuit diagram illustrates independent components as if they are electrically connected to each other, one conductive film may have functions of a plurality of components, for example, part of a wiring may also function as an electrode. The "electrical connection" in this specification includes in its category such a case where one conductive film has functions of a plurality of components.

The term "over" or "below" does not necessarily mean that a component is placed "directly on" or "directly under" another component. For example, the expression "a gate electrode over a gate insulating layer" can mean the case where a component is placed between the gate insulating layer and the gate electrode.

The position, size, range, or the like of each component illustrated in drawings and the like is not accurately represented in some cases for easy understanding. Therefore, the disclosed invention is not necessarily limited to the position, size, range, or the like as disclosed in the drawings and the like.

The ordinal number such as "first", "second", and "third" are used in order to avoid confusion among components.

Embodiment 1

FIG. 1A illustrates a signal processing circuit according to one embodiment of the present invention. In FIG. 1A, a signal processing circuit 300 includes a circuit unit 300A, a circuit unit 300B, a circuit unit 300C, a power supply circuit 30, and a step-up circuit 301. A first high power supply potential (hereinafter also "VDD") input to the signal processing circuit 300 is input to the power supply circuit 30. The power supply circuit 30 selectively supplies the first high power supply potential (VDD) to each of the circuit units (the circuit unit 300A, the circuit unit 300B, and the circuit unit 300C). Power consumption of the signal processing circuit can be reduced with a normally-off driving method by which the first high power supply potential (VDD), that is, the power supply voltage is selectively supplied only to a circuit unit intended to be operated. The power supply circuit 30 also supplies the first high power supply potential (VDD) to the step-up circuit 301. The step-up circuit 301 boosts the first high power supply potential (VDD) to generate a second high power supply potential (hereinafter also "VDDH"). The generated second high power supply potential (VDDH) is selectively input to each of the circuit units (the circuit units 300A, 300B, and 300C). Although FIG. 1A illustrates the example in which three circuit units are provided, the number of circuit units is not limited to three. Further, FIG. 1A illustrates the example in which one step-up circuit 301 is provided in common for the circuit units 300A, 300B, and 300C; however, the structure is not limited to this, and a step-up circuit may be provided for each circuit unit or for every group of circuit units.

(Configuration 1 of Circuit Unit)

Each of the circuit units (the circuit units 300A, 300B, and 300C) can include a circuit having a node to which the first high power supply potential is selectively applied, and a nonvolatile storage circuit that holds a potential of the node. One embodiment of a configuration of the circuit and the nonvolatile storage circuit will be described with reference to FIGS. 2A to 2D.

Figure 2A:
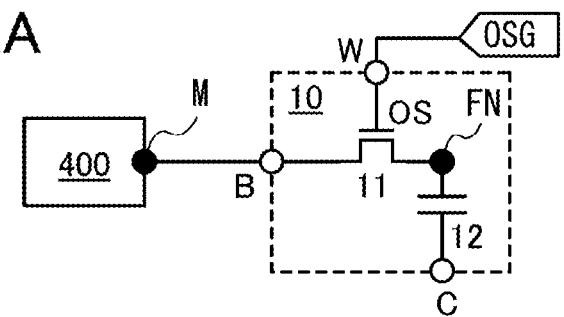
FIGS. 2A to 2D each illustrate part of a signal processing circuit and a configuration of a nonvolatile storage circuit.

FIG. 2A illustrates a circuit 400 having a node (represented by M in the drawing and hereinafter referred to as node M) to which the first high power supply potential is selectively applied, and a nonvolatile storage circuit 10 that holds a potential of the node M. Each of the circuit units (the circuit units 300A, 300B, and 300C) can include a plurality of combinations of the circuits 400 and the nonvolatile storage circuits 10. The circuit 400 can be an arithmetic circuit, for example, and the node M can be an input terminal or an output terminal of the arithmetic circuit. As the arithmetic circuit, an inverter, a clocked inverter, a three-state buffer, a NAND circuit, a NOR circuit, or the like can be used. Alternatively, for example, the circuit 400 can be a volatile storage circuit such as a flip-flop circuit or a latch circuit, and the node M can be an input terminal or an output terminal of the volatile storage circuit.

Figure 3A:
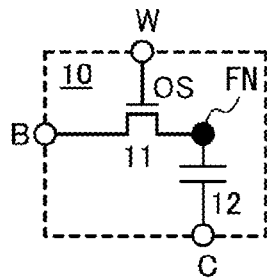
FIGS. 3A to 3E illustrate configurations of combinations of volatile storage circuits and nonvolatile storage circuits.

FIG. 3A illustrates a configuration of the nonvolatile storage circuit 10 in FIG. 2A. In FIG. 3A, the nonvolatile storage circuit 10 includes a transistor 11 and a capacitor 12. Note that in FIG. 3A, "OS" is written beside the transistor 11 in order to indicate that a channel of the transistor 11 is formed in an oxide semiconductor layer. A gate of the transistor 11 is electrically connected to a terminal W. One of a source and a drain of the transistor 11 is electrically connected to a terminal B. The other of the source and the drain of the transistor 11 is electrically connected to one of a pair of electrodes of the capacitor 12. The other of the pair of electrodes of the capacitor 12 is electrically connected to a terminal C. The one of the pair of electrodes of the capacitor 12 is referred to as a retention node and represented by FN in the drawings. In FIG. 2A, the terminal B of the nonvolatile storage circuit 10 is electrically connected to the node M, to which the first high power supply potential is selectively applied, in the circuit 400. A control signal OSG is input to the terminal W of the nonvolatile storage circuit 10. Note that a given potential, for example, a ground potential (0 V, corresponding to a low power supply potential) can be input to the terminal C of the nonvolatile storage circuit 10.

The power supply voltage corresponding to a difference between the first high power supply potential (VDD) and the ground potential (0 V, corresponding to the low power supply potential) is selectively supplied to the circuit 400. The first high power supply potential (VDD) is selectively applied to the node M. The control signal OSG which is to be the second high power supply potential (VDDH) or the ground potential (0 V, corresponding to the low power supply potential) is input to the gate of the transistor 11 (the terminal W). Note that the transistor 11 is an enhancement-mode (normally-off) n-channel transistor. The transistor 11 is turned on when the control signal OSG is the second high power supply potential (VDDH), whereas the transistor 11 is turned off when the control signal OSG is the ground potential (0 V, corresponding to the low power supply potential). By employing a structure where the gate of the transistor 11 is grounded through a load such as a resistor, the ground potential (0 V, corresponding to the low power supply potential) can be input to the gate of the transistor 11 when the second high power supply potential (VDDH) is not input to the gate. Here, as described with reference to FIG. 1A, the second high power supply potential (VDDH) is generated by boosting the first high power supply potential (VDD) by the step-up circuit 301 and is higher than the first high power supply potential (VDD). For example, VDDH>VDD+Vth is set, where Vth is the threshold voltage of the transistor 11.

Figure 2B:
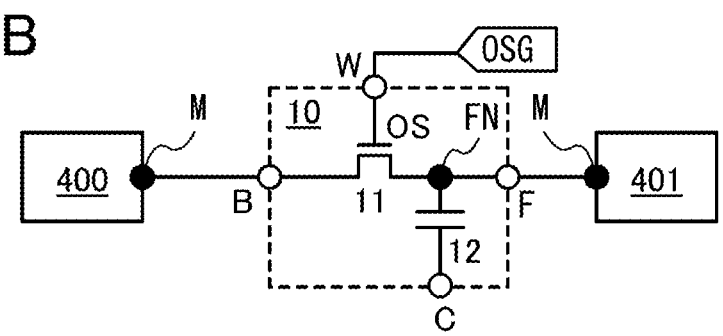

In the configuration illustrated in FIG. 2A, the retention node FN in the nonvolatile storage circuit 10 may be electrically connected to another circuit included in the signal processing circuit. FIG. 2B illustrates a configuration in that case. In FIG. 2B, the nonvolatile storage circuit 10 is provided between the circuit 400 and a circuit 401. The nonvolatile storage circuit 10 in FIG. 2B can have a configuration illustrated in FIG. 3C. A terminal F electrically connected to the retention node FN is electrically connected to a node M in the circuit 401. In the circuit 401, the first high power supply potential is selectively applied to the node M. The circuit 400 can be an arithmetic circuit, for example, and the node M can be an input terminal or an output terminal of the arithmetic circuit. As the arithmetic circuit, an inverter, a clocked inverter, a three-state buffer, a NAND circuit, a NOR circuit, or the like can be used. Alternatively, for example, the circuit 400 can be a volatile storage circuit such as a flip-flop circuit or a latch circuit, and the node M can be an input terminal or an output terminal of the volatile storage circuit. In addition, the circuit 401 can be an arithmetic circuit, for example, and the node M can be an input terminal or an output terminal of the arithmetic circuit. As the arithmetic circuit, an inverter, a clocked inverter, a three-state buffer, a NAND circuit, a NOR circuit, or the like can be used. Alternatively, for example, the circuit 401 can be a volatile storage circuit such as a flip-flop circuit or a latch circuit, and the node M can be an input terminal or an output terminal of the volatile storage circuit.

The power supply voltage, which corresponds to a difference between the first high power supply potential (VDD) and the ground potential (0 V, corresponding to the low power supply potential), is selectively supplied to each of the circuits 400 and 401. The first high power supply potential (VDD) is selectively applied to the node M. The control signal OSG which is to be the second high power supply potential (VDDH) or the ground potential (0 V, corresponding to the low power supply potential) is input to the gate of the transistor 11 (the terminal W). Note that the transistor 11 is an enhancement-mode (normally-off) n-channel transistor. The transistor 11 is turned on when the control signal OSG is the second high power supply potential (VDDH), whereas the transistor 11 is turned off when the control signal OSG is the ground potential (0 V, corresponding to the low power supply potential). By employing a structure where the gate of the transistor 11 is grounded through a load such as a resistor, the ground potential (0 V, corresponding to the low power supply potential) can be input to the gate of the transistor 11 when the second high power supply potential (VDDH) is not input to the gate. Here, as described with reference to FIG. 1A, the second high power supply potential (VDDH) is generated by boosting the first high power supply potential (VDD) by the step-up circuit 301 and is higher than the first high power supply potential (VDD). For example, VDDH>VDD+Vth is set, where Vth is the threshold voltage of the transistor 11.

Note that in the configurations illustrated in FIGS. 2A and 2B, the capacitor 12 is not necessarily provided. For example, the retention node FN may be electrically connected to a gate of a transistor included in the signal processing circuit to use gate capacitance of the transistor, in which case the capacitor 12 can be omitted. For example, in the configuration in FIG. 2B, the capacitor 12 can be omitted when the node M of the circuit 401 is electrically connected to a gate of a transistor included in the circuit 401.

Figure 2C:
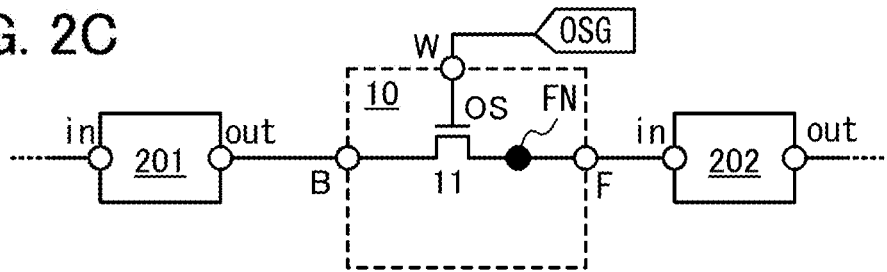

FIG. 2C illustrates an example of a variation of the configuration in FIG. 2B, in which an arithmetic circuit 201 is used as the circuit 400 and an output terminal (represented by "out" in the drawing) of the arithmetic circuit 201 serves as the node M of the circuit 400; an arithmetic circuit 202 is used as the circuit 401 and an input terminal (represented by "in" in the drawing) of the arithmetic circuit 202 serves as the node M of the circuit 401; and the capacitor 12 is omitted.

Figure 2D:
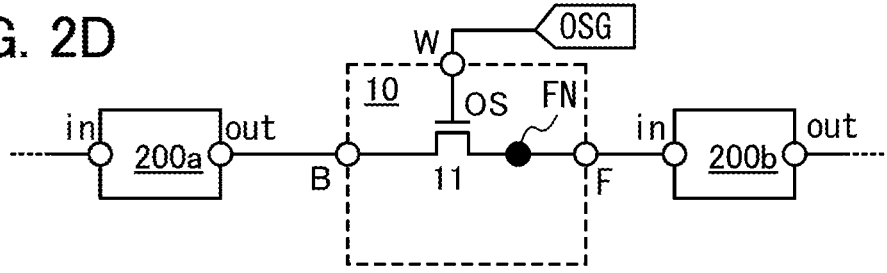

FIG. 2D illustrates an example of a variation of the configuration in FIG. 2B, in which a volatile storage circuit 200*a* is used as the circuit 400 and an output terminal (represented by "out" in the drawing) of the volatile storage circuit 200*a* serves as the node M of the circuit 400; a volatile storage circuit 200*b* is used as the circuit 401 and an input terminal (represented by "in" in the drawing) of the volatile storage circuit 200*b* serves as the node M of the circuit 401; and the capacitor 12 is omitted.

In the nonvolatile storage circuit 10 illustrated in each of FIGS. 2A to 2D, the off-state current of the transistor 11 is extremely low; consequently, by turning off the transistor 11, the potential of the retention node FN can be held for a long time even after supply of the power supply voltage is stopped. Further, the nonvolatile storage circuit 10 stores a signal potential (data) in such a manner that a signal potential is input to the retention node FN, the transistor 11 is turned off, and the retention node FN is brought into a floating state. In the nonvolatile storage circuit 10, it is thus possible to reduce fatigue of the element due to repetition of data rewriting and to increase data rewrite cycles.

The following is one embodiment of a method for driving the signal processing circuit in FIG. 1A in the case where each of the circuit units in FIG. 1A (the circuit units 300A, 300B, and 300C) has the configuration illustrated in FIG. 2A or FIG. 2B and a normally-off driving method is employed.

(Data Storage Operation)

While the power supply voltage is supplied to a given circuit unit (e.g., the circuit unit 300A) by the power supply circuit 30, the potential of the node M of the circuit 400 included in the circuit unit is input to and stored in the nonvolatile storage circuit 10 (data storage). Specifically, in the nonvolatile storage circuit 10, the second high power supply potential (VDDH) is input to the gate of the transistor 11 to turn on the transistor 11. Then, the potential of the node M of the circuit 400 in the signal processing circuit 300 is input to the retention node FN through the transistor 11. Here, the second high power supply potential (VDDH), which is input to the gate of the transistor 11 to turn on the transistor 11, is higher than the first high power supply potential (VDD), for example, higher than VDD+Vth. Thus, the potential of the node M of the circuit 400 can be precisely stored in the nonvolatile storage circuit 10.

(Data Standby Operation)

After the data is stored, the transistor 11 in the nonvolatile storage circuit 10 is turned off, which prevents the data stored in the nonvolatile storage circuit 10 from varying in response to a signal from the volatile circuit 400. Thus, data standby can be performed. The off-state current of the transistor 11 in the nonvolatile storage circuit 10 is extremely low; consequently, by turning off the transistor 11, the potential of the retention node FN, that is, the potential of the node M can be held for a long time even after supply of the power supply voltage is stopped.

As above, supply of the power supply voltage to the circuit unit including the circuit 400 is stopped after data standby is performed. Moreover, input of the first high power supply potential (VDD) to the step-up circuit 301 can also be stopped.

(Data Supply Operation)

The power supply voltage is supplied again to a given circuit unit (e.g., the circuit unit 300A) by the power supply circuit 30. Moreover, the first high power supply potential (VDD) is input to the step-up circuit 301. Then, in the nonvolatile storage circuit 10 included in the circuit unit, the control signal OSG is set to the second high power supply potential (VDDH) output from the step-up circuit 301, thereby turning on the transistor 11. Thus, the potential of the retention node FN of the nonvolatile storage circuit 10 (or the amount of charge corresponding to the potential) is input to the node M of the circuit 400. In such a manner, the potential held in the nonvolatile storage circuit 10 can be returned to the node M of the circuit 400.

At this time, since the second high power supply potential (VDDH) is higher than the first high power supply potential (VDD), for example, higher than VDD+Vth, the potential held in the nonvolatile storage circuit 10 can be precisely input to the node M of the circuit 400.

The above is the description of the normally-off driving method in the signal processing circuit including the circuit unit having the configuration illustrated in FIG. 2A or FIG. 2B.

(Configuration 2 of Circuit Unit)

Each of the circuit units (the circuit units 300A, 300B, and 300C) can include a storage circuit composed of a combination of a volatile storage circuit and a nonvolatile storage circuit. One embodiment of a configuration of a storage circuit having a combination of a volatile storage circuit and a nonvolatile storage circuit will be described with reference to FIGS. 3A to 3E.

(Configuration 1 of Combination of Volatile Storage Circuit and Nonvolatile Storage Circuit)

Figure 3B:
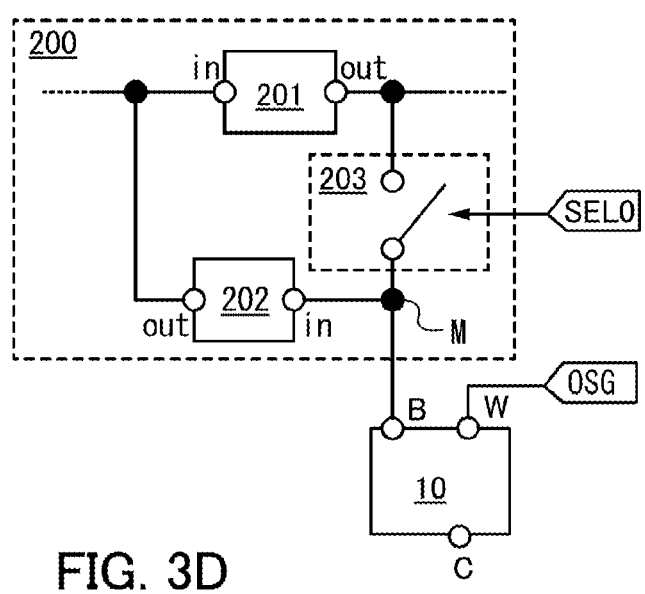

FIG. 3B illustrates one embodiment of a storage circuit composed of a combination of a volatile storage circuit 200 and the nonvolatile storage circuit 10. Each of the circuit units (the circuit units 300A, 300B, and 300C) can include a plurality of the storage circuits.

FIG. 3A illustrates the configuration of the nonvolatile storage circuit 10 in FIG. 3B. The configuration of the nonvolatile storage circuit 10 in FIG. 3A is as previously described.

In the nonvolatile storage circuit 10, data is stored by controlling the potential of the retention node FN (or the amount of charge corresponding to the potential) in accordance with the data. For example, one-bit data can be stored when a state where the capacitor 12 is charged with given charge corresponds to "1" and a state where the capacitor 12 is not charged with charge corresponds to "0". In the nonvolatile storage circuit 10, the off-state current of the transistor 11 is extremely low; consequently, by turning off the transistor 11, the potential of the retention node FN, that is, data can be held for a long time even after supply of the power supply voltage is stopped. Further, the nonvolatile storage circuit 10 stores data in such a manner that a signal potential corresponding to data is input to the retention node FN, the transistor 11 is turned off, and the retention node FN is brought into a floating state. In the nonvolatile storage circuit 10, it is thus possible to reduce fatigue of the element due to repetition of data rewriting and to increase data rewrite cycles.

The volatile storage circuit 200 in FIG. 3B includes the arithmetic circuit 201 and the arithmetic circuit 202, and has a feedback loop such that an output of the arithmetic circuit 201 is input to the arithmetic circuit 202 and an output of the arithmetic circuit 202 is input to the arithmetic circuit 201. As the volatile storage circuit 200, a flip-flop circuit or a latch circuit is used. Note that a clock signal may be input to one or both of the arithmetic circuits 201 and 202.

In FIG. 3B, the terminal B of the nonvolatile storage circuit 10 is electrically connected to the node M, which is positioned between the input terminal of the arithmetic circuit 202 and the output terminal of the arithmetic circuit 201. The volatile storage circuit 200 includes a switch 203 that selects whether to electrically connect the node M and the output terminal of the arithmetic circuit 201, and the on/off state of the switch 203 is selected in accordance with a control signal SEL0. In the case where the arithmetic circuit 201 is a circuit that selectively outputs a signal in accordance with a control signal (e.g., a clock signal), the switch 203 is not necessarily provided and can be omitted. The control signal OSG is input to the terminal W of the nonvolatile storage circuit 10. Note that a given potential, for example, the ground potential (0 V, corresponding to the low power supply potential) can be input to the terminal C of the nonvolatile storage circuit 10.

The power supply voltage, which corresponds to a difference between the first high power supply potential (VDD) and the ground potential (0 V, corresponding to the low power supply potential), is selectively supplied to each of the arithmetic circuits 201 and 202 in the volatile storage circuit 200. The control signal OSG which is to be the second high power supply potential (VDDH) or the ground potential (0 V, corresponding to the low power supply potential) is input to the gate of the transistor 11 (the terminal W). Note that the transistor 11 is an enhancement-mode (normally-off) n-channel transistor. The transistor 11 is turned on when the control signal OSG is the second high power supply potential (VDDH), whereas the transistor 11 is turned off when the control signal OSG is the ground potential (0 V, corresponding to the low power supply potential). By employing a structure where the gate of the transistor 11 is grounded through a load such as a resistor, the ground potential (0 V, corresponding to the low power supply potential) can be input to the gate of the transistor 11 when the second high power supply potential (VDDH) is not input to the gate. Here, as described with reference to FIG. 1A, the second high power supply potential (VDDH) is generated by boosting the first high power supply potential (VDD) by the step-up circuit 301 and is higher than the first high power supply potential (VDD). For example, VDDH>VDD+Vth is set, where Vth is the threshold voltage of the transistor 11.

The following is one embodiment of a method for driving the signal processing circuit in FIG. 1A in the case where each of the circuit units in FIG. 1A (the circuit units 300A, 300B, and 300C) includes a combination of the volatile storage circuit 200 and the nonvolatile storage circuit 10 in FIG. 3B and a normally-off driving method is employed.

(Operation in Supplying Power Supply Voltage)

While the power supply voltage is supplied to a given circuit unit (e.g., the circuit unit 300A) by the power supply circuit 30, the switch 203 in the combination in FIG. 3B, which is included in the circuit unit, is kept on by the control signal SEL0. Thus, in the combination, the volatile storage circuit 200 holds data with a feedback loop of the arithmetic circuits 201 and 202. That is, in the combination in FIG. 3B, inputted data is held with the feedback loop in the volatile storage circuit 200, and data is output from the feedback loop in the volatile storage circuit 200. With the feedback loop in the volatile storage circuit 200, data can be retained and output at high speed.

(Data Storage Operation)

As described above, at the same time as or after retention of data with the feedback loop in the volatile storage circuit 200, the control signal OSG is set to the second high power supply potential (VDDH) output from the step-up circuit 301 while the switch 203 is kept on by the control signal SEL0, thereby turning on the transistor 11 in the nonvolatile storage circuit 10. Thus, the potential of the node M of the volatile storage circuit 200 is input to the retention node FN of the nonvolatile storage circuit 10, so that data held in the volatile storage circuit 200 can be stored in the nonvolatile storage circuit 10. In this manner, data can be stored.

At this time, the second high power supply potential (VDDH) is higher than the first high power supply potential (VDD), for example, higher than VDD+Vth. Here, a signal potential corresponding to data held in the volatile storage circuit 200 is the first high power supply potential (VDD) or the ground potential (0 V, corresponding to the low power supply potential). Given that a potential input to the gate of the transistor 11 to turn on the transistor 11 is the same as the first high power supply potential (VDD) when the signal potential corresponding to data held in the volatile storage circuit 200 is the first high power supply potential (VDD), a potential input to the retention node FN is a potential that is decreased from the first high power supply potential (VDD) by Vth.

On the other hand, when the second high power supply potential (VDDH) is higher than the first high power supply potential (VDD), for example, higher than VDD+Vth, the above-described potential loss can be suppressed. As a result, the signal potential corresponding to data held in the volatile storage circuit 200 can be precisely input to the retention node FN. Thus, data held in the volatile storage circuit 200 can be precisely stored in the nonvolatile storage circuit 10.

(Data Standby Operation)

After the data is stored, the transistor 11 in the nonvolatile storage circuit 10 is turned off, which prevents the data stored in the nonvolatile storage circuit 10 from varying in response to a signal from the volatile storage circuit 200. Thus, data standby can be performed. The off-state current of the transistor 11 in the nonvolatile storage circuit 10 is extremely low; consequently, by turning off the transistor 11, the potential of the retention node FN, that is, data can be held for a long time even after supply of the power supply voltage is stopped.

As above, supply of the power supply voltage to the circuit unit including the combination is stopped after data standby is performed. Moreover, input of the first high power supply potential (VDD) to the step-up circuit 301 can also be stopped.

(Data Supply Operation)

The power supply voltage is supplied again to a given circuit unit (e.g., the circuit unit 300A) by the power supply circuit 30. Moreover, the first high power supply potential (VDD) is input to the step-up circuit 301. Then, in the combination included in the circuit unit, the switch 203 is turned off by the control signal SEL0 and the control signal OSG is set to the second high power supply potential (VDDH) output from the step-up circuit 301, thereby turning on the transistor 11 in the nonvolatile storage circuit 10. Thus, the potential of the retention node FN in the nonvolatile storage circuit 10 (or the amount of charge corresponding to the potential) is input to the node M of the volatile storage circuit 200. Then, the switch 203 is turned on by the control signal SEL0. In such a manner, data held in the nonvolatile storage circuit 10 can be input to the volatile storage circuit 200 and held with the feedback loop. Accordingly, data can be supplied to the volatile storage circuit 200.

At this time, since the second high power supply potential (VDDH) is higher than the first high power supply potential (VDD), for example, higher than VDD+Vth, the signal potential corresponding to data held in the nonvolatile storage circuit 10 can be precisely input to the node M of the volatile storage circuit 200. Thus, data held in the nonvolatile storage circuit 10 can be precisely supplied to the volatile storage circuit 200.

Here, the speed of data writing and reading in the volatile storage circuit 200 is higher than that in the nonvolatile storage circuit 10; consequently, the operation speed of the combination which is selectively supplied with the power supply voltage can be increased.

In the case where the arithmetic circuit 201 is a circuit that selectively outputs a signal in accordance with a control signal (e.g., a clock signal) and the switch 203 is omitted, the arithmetic circuit 201 is controlled so that there is no output from the arithmetic circuit 201 (an output of the arithmetic circuit 201 is indeterminate) in a period during which the switch 203 is off in the above description. The driving method can be the same as above except for the arithmetic circuit 201.

The above is the description of the normally-off driving method in the signal processing circuit including the circuit unit having the storage circuit composed of the combination of the volatile storage circuit 200 and the nonvolatile storage circuit 10 illustrated in FIG. 3B.

(Configuration 2 of Combination of Volatile Storage Circuit and Nonvolatile Storage Circuit)

Figure 3C:
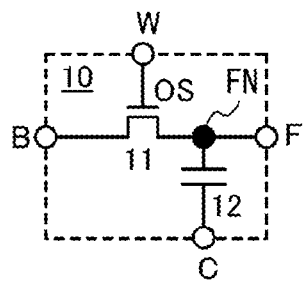

The configuration of the storage circuit composed of a combination of the volatile storage circuit and the nonvolatile storage circuit is not limited to that illustrated in FIG. 3B. For example, the storage circuit can have a configuration illustrated in FIG. 3E. In the volatile storage circuit 200 in FIG. 3E, the switch 203 in FIG. 3B is not always necessary and therefore is not provided. The terminal F of the nonvolatile storage circuit 10 in FIG. 3E is electrically connected to one of a pair of electrodes of the capacitor 12 as illustrated in FIG. 3C. In FIG. 3E, the terminal F of the nonvolatile storage circuit 10 is electrically connected to the output terminal of the arithmetic circuit 202 and the input terminal of the arithmetic circuit 201 in the volatile storage circuit through an arithmetic circuit 204 and a switch 205. As the arithmetic circuit 204, an inverter 224 can be used, for example. The on/off state of the switch 205 is selected in accordance with a control signal SELR.

The following is one embodiment of a method for driving the signal processing circuit in FIG. 1A in the case where each of the circuit units in FIG. 1A (the circuit units 300A, 300B, and 300C) includes a combination of the volatile storage circuit 200 and the nonvolatile storage circuit 10 in FIG. 3E and a normally-off driving method is employed.

(Operation in Supplying Power Supply Voltage)

While the power supply voltage is supplied to a given circuit unit (e.g., the circuit unit 300A) by the power supply circuit 30, the switch 205 in the combination in FIG. 3E, which is included in the circuit unit, is kept off by the control signal SELR. Thus, in the combination, the volatile storage circuit 200 holds data with a feedback loop of the arithmetic circuits 201 and 202. That is, in the combination in FIG. 3E, inputted data is held with the feedback loop in the volatile storage circuit 200, and data is output from the feedback loop in the volatile storage circuit 200. With the feedback loop in the volatile storage circuit 200, data can be retained and output at high speed.

(Data Storage Operation)

As described above, at the same time as or after retention of data with the feedback loop in the volatile storage circuit 200, the control signal OSG is set to the second high power supply potential (VDDH) output from the step-up circuit 301 while the switch 205 is kept off by the control signal SELR, thereby turning on the transistor 11 in the nonvolatile storage circuit 10. Thus, the potential of the node M of the volatile storage circuit 200 is input to the retention node FN of the nonvolatile storage circuit 10, so that data held in the volatile storage circuit 200 can be stored in the nonvolatile storage circuit 10. In this manner, data can be stored.

At this time, the second high power supply potential (VDDH) is higher than the first high power supply potential (VDD), for example, higher than VDD+Vth. Here, a signal potential corresponding to data held in the volatile storage circuit 200 is the first high power supply potential (VDD) or the ground potential (0 V, corresponding to the low power supply potential). Given that a potential input to the gate of the transistor 11 to turn on the transistor 11 is the same as the first high power supply potential (VDD) when the signal potential corresponding to data held in the volatile storage circuit 200 is the first high power supply potential (VDD), a potential input to the retention node FN is a potential that is decreased from the first high power supply potential (VDD) by Vth.

On the other hand, when the second high power supply potential (VDDH) is higher than the first high power supply potential (VDD), for example, higher than VDD+Vth, the above-described potential loss can be suppressed. As a result, the signal potential corresponding to data held in the volatile storage circuit 200 can be precisely input to the retention node FN. Thus, data held in the volatile storage circuit 200 can be precisely stored in the nonvolatile storage circuit 10.

(Data Standby Operation)

After the data storage, the control signal OSG is set to the ground potential (0 V, corresponding to the low power supply potential) to turn off the transistor 11 in the nonvolatile storage circuit 10, which prevents the data stored in the nonvolatile storage circuit 10 from varying in response to a signal from the volatile storage circuit 200. Thus, data standby can be performed. Since the off-state current of the transistor 11 in the nonvolatile storage circuit 10 is extremely low, by turning off the transistor 11, the potential of the retention node FN, that is, data can be held for a long time after supply of the power supply voltage is stopped.

As above, supply of the power supply voltage to the circuit unit including the combination is stopped after data standby is performed. Moreover, input of the first high power supply potential (VDD) to the step-up circuit 301 can also be stopped.

(Data Supply Operation)

The power supply voltage is supplied again to a given circuit unit (e.g., the circuit unit 300A) by the power supply circuit 30. Moreover, the first high power supply potential (VDD) is input to the step-up circuit 301. After that, the switch 205 in the combination included in the circuit unit is turned on by the control signal SELR. Thus, a signal corresponding to the potential of the retention node FN of the nonvolatile storage circuit 10 (or the amount of charge corresponding to the potential) can be inverted by the inverter 224 and input to a node Mb of the volatile storage circuit 200. In such a manner, data held in the nonvolatile storage circuit 10 can be input to the volatile storage circuit 200 and held with the feedback loop. Accordingly, data can be supplied to the volatile storage circuit 200. In this case, when the current drive capability of the arithmetic circuit 204 is higher than that of the arithmetic circuit 202, data can be rapidly returned to the volatile storage circuit 200. Here, the speed of data writing and reading in the volatile storage circuit 200 is higher than that in the nonvolatile storage circuit 10; consequently, the operation speed of the combination which is selectively supplied with the power supply voltage can be increased.

It is possible to employ a structure in which a circuit that selectively outputs a signal in accordance with a control signal (e.g., a clock signal) is used as the arithmetic circuit 204 and the switch 205 is omitted. In that case, the arithmetic circuit 204 is controlled so that there is no output from the arithmetic circuit 204 (an output of the arithmetic circuit 204 is indeterminate) in a period during which the switch 205 is off in the above description. The driving method can be the same as above except for the arithmetic circuit 204.

The above is the description of the normally-off driving method in the signal processing circuit including the circuit unit having the storage circuit composed of the combination of the volatile storage circuit 200 and the nonvolatile storage circuit 10 illustrated in FIG. 3E.

(Configuration 3 of Combination of Volatile Storage Circuit and Nonvolatile Storage Circuit)

The configuration of the storage circuit composed of a combination of the volatile storage circuit and the nonvolatile storage circuit is not limited to those illustrated in FIGS. 3B and 3E. For example, the storage circuit can have a configuration illustrated in FIG. 3D. In the storage circuit illustrated in FIG. 3D, the nonvolatile storage circuit 10 is provided in the volatile storage circuit 200. The terminal F of the nonvolatile storage circuit 10 in FIG. 3D is electrically connected to the retention node FN as illustrated in FIG. 3C.

Figure 3D:
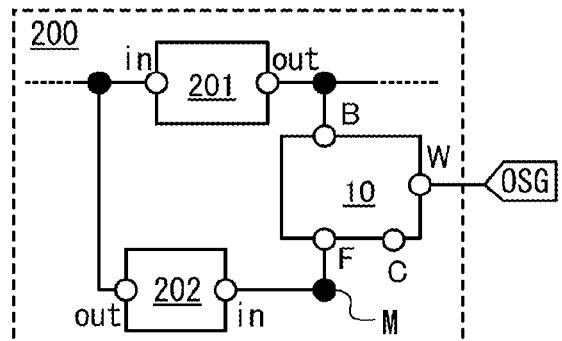
Figure 3E:
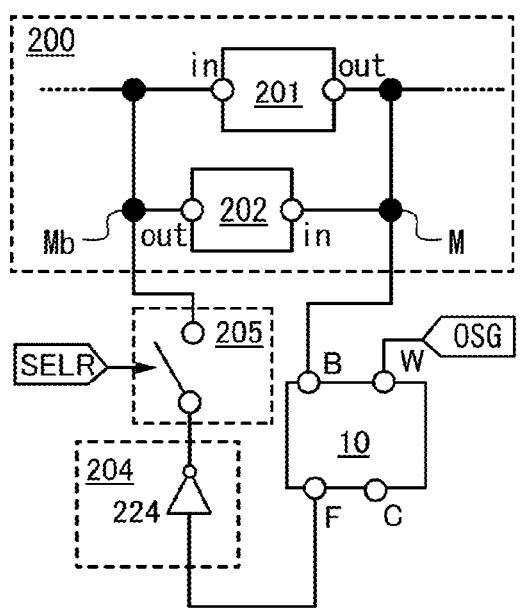

The following is one embodiment of a method for driving the signal processing circuit in FIG. 1A in the case where each of the circuit units in FIG. 1A (the circuit units 300A, 300B, and 300C) includes a combination of the volatile storage circuit 200 and the nonvolatile storage circuit 10 in FIG. 3D and a normally-off driving method is employed.

(Operation in Supplying Power Supply Voltage)

While the power supply voltage is supplied to a given circuit unit (e.g., the circuit unit 300A) by the power supply circuit 30, in the combination which is illustrated in FIG. 3D and included in the circuit unit, the control signal OSG is set to the second high power supply potential (VDDH) output from the step-up circuit 301 and as a result, the transistor 11 in the nonvolatile storage circuit 10 is on. Thus, the volatile storage circuit 200 holds data with a feedback loop of the arithmetic circuits 201 and 202. That is, in the combination in FIG. 3D, inputted data is held with the feedback loop in the volatile storage circuit 200, and data is output from the feedback loop in the volatile storage circuit 200. With the feedback loop in the volatile storage circuit 200, data can be retained and output at high speed.

At this time, the second high power supply potential (VDDH) is higher than the first high power supply potential (VDD), for example, higher than VDD+Vth. Here, a signal potential corresponding to the output of the arithmetic circuit 201 is the first high power supply potential (VDD) or the ground potential (0 V, corresponding to the low power supply potential). Given that a potential input to the gate of the transistor 11 to turn on the transistor 11 is the same as the first high power supply potential (VDD) when the signal potential corresponding to the output of the arithmetic circuit 201 is the first high power supply potential, a potential input to the retention node FN is a potential that is decreased from the first high power supply potential (VDD) by Vth.

On the other hand, when the second high power supply potential (VDDH) is higher than the first high power supply potential (VDD), for example, higher than VDD+Vth, the above potential loss can be suppressed. As a result, the signal potential corresponding to the output of the arithmetic circuit 201 can be precisely input to the retention node FN. Thus, data held in the volatile storage circuit 200 can be precisely stored in the nonvolatile storage circuit 10. Further, data can be held more precisely with the feedback loop in the volatile storage circuit 200.

(Data Storage Operation)

As described above, the potential signal corresponding to the output of the arithmetic circuit 201 is input to the retention node FN of the nonvolatile storage circuit 10 at the same time as retention of data with the feedback loop in the volatile storage circuit 200, so that data held in the volatile storage circuit 200 can be stored in the nonvolatile storage circuit 10. In this manner, data can be stored.

(Data Standby Operation)

After the data storage, the control signal OSG is set to the ground potential (0 V, corresponding to the low power supply potential) to turn off the transistor 11 in the nonvolatile storage circuit 10, which prevents the data stored in the nonvolatile storage circuit 10 from varying in response to a signal from the arithmetic circuit 201 in the volatile storage circuit 200.

As above, supply of the power supply voltage to the circuit unit including the combination is stopped after data standby is performed. Moreover, input of the first high power supply potential (VDD) to the step-up circuit 301 can also be stopped.

(Data Supply Operation)

The power supply voltage is supplied again to a given circuit unit (e.g., the circuit unit 300A) by the power supply circuit 30. Moreover, the first high power supply potential (VDD) is input to the step-up circuit 301. Then, in the combination included in the circuit unit, the control signal OSG is set to the second high power supply potential (VDDH) output from the step-up circuit 301, thereby turning on the transistor 11 in the nonvolatile storage circuit 10. Thus, the potential of the retention node FN in the nonvolatile storage circuit 10 (or corresponding charge) is input to the node M of the volatile storage circuit 200. Thus, data held in the nonvolatile storage circuit 10 can be held with the feedback loop in the volatile storage circuit 200. In the above manner, data can be supplied to the volatile storage circuit 200.

At this time, since the second high power supply potential (VDDH) is higher than the first high power supply potential (VDD), for example, higher than VDD+Vth, the signal potential corresponding to data held in the nonvolatile storage circuit 10 can be precisely input to the node M of the volatile storage circuit 200. Thus, data held in the nonvolatile storage circuit 10 can be precisely supplied to the volatile storage circuit 200.

Note that at the time of supplying data, it is preferable that there be no output from the arithmetic circuit 201 (an output of the arithmetic circuit 201 be indeterminate) when the transistor 11 in the nonvolatile storage circuit 10 is turned on by the control signal OSG after supply of the power supply voltage is selected. For example, as the arithmetic circuit 201, a circuit that selectively outputs a signal in accordance with a control signal (e.g., a clock signal) is preferably used. In addition, for instance, in the case of employing a structure in which a switch or the like is provided between the output terminal of the arithmetic circuit 201 and the terminal B of the nonvolatile storage circuit 100, the switch is preferably turned off when the transistor 11 in the nonvolatile storage circuit 10 is turned on by the control signal OSG after supply of the power supply voltage is selected.

The above is the description of the normally-off driving method in the signal processing circuit including the circuit unit having the storage circuit composed of the combination of the volatile storage circuit 200 and the nonvolatile storage circuit 10 illustrated in FIG. 3D.

As above, employing a normally-off driving method makes it possible to reduce writing errors and reading errors caused when data is stored or supplied. It is therefore possible to provide a signal processing circuit with significantly low power consumption and high reliability. In addition, since a circuit with a large number of write cycles and high reliability is used as the nonvolatile storage circuit, the endurance and reliability of the signal processing circuit can be increased.

One of features of the present invention is that a potential input to a gate of a transistor with extremely low off-state current to turn on the transistor is higher than a potential input to a source or a drain of the transistor, for example, by the threshold voltage of the transistor, and thus a signal potential can be precisely transmitted through the transistor. Therefore, the present invention is not limited to a signal processing circuit and is applicable to any semiconductor device including a transistor having the following structure: a potential input to its gate to turn it on is higher than a potential input to its source or drain, for example, by the threshold voltage. The use of such a transistor makes it possible to increase the quality of a semiconductor device. For example, the present invention can be a display device including the transistor in each pixel. Examples of a display device are a liquid crystal display device and an electroluminescent display device. That is, the transistor may be used as a transistor for controlling input of a signal voltage to a liquid crystal element or an electroluminescent element; thus, a display device with high display quality can be provided. For example, the present invention can be a storage device including the transistor in a memory cell, and a highly reliable storage device can be provided as a result. Furthermore, the present invention can be, for instance, an image sensor and a touch panel that include the transistor in a pixel for taking images. Thus, a highly reliable image sensor and a highly reliable touch panel can be provided.

This embodiment can be implemented in combination with any of the other embodiments as appropriate.

Embodiment 2

In this embodiment, one embodiment of the step-up circuit 301 in FIG. 1A of Embodiment 1 will be described.

Figure 1B:
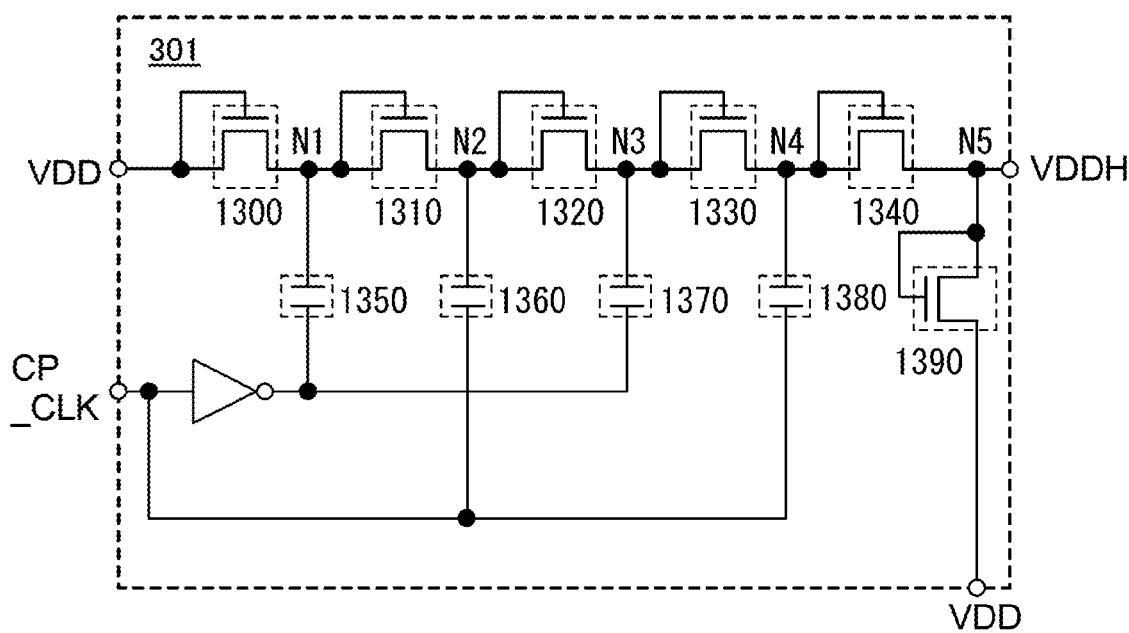

FIG. 1B illustrates one embodiment of the step-up circuit 301. FIG. 1B illustrates an example of a four-stage step-up circuit. Typically, a step-up circuit performing n-stage step-up operations (n: a natural number) can be used. The first high power supply potential (VDD) is supplied to an input terminal (here, referring to a source terminal or a drain terminal that is electrically connected to a gate terminal) of a first transistor 1300. An output terminal (here, referring to the source terminal or the drain terminal that is not electrically connected to the gate terminal) of the first transistor 1300 is electrically connected to an input terminal of a second transistor 1310 and one of a pair of electrodes of a first capacitor 1350. Similarly, an output terminal of the second transistor 1310 is electrically connected to an input terminal of a third transistor 1320 and one of a pair of electrodes of a second capacitor 1360. Although connections of the other parts are similar to the above and detailed explanation is therefore omitted, the connection can be represented as follows: an output terminal of an i-th transistor (i: a natural number of n or less) is connected to one of a pair of electrodes of an i-th capacitor. In FIG. 1B, an output terminal of a transistor of the last stage (a fifth transistor 1340) is electrically connected to one of a source and a drain of a transistor 1390, and the first high power supply potential (VDD) is input to the other of the source and the drain of the transistor 1390; however, the structure is not limited to this. For example, one of a pair of electrodes of a capacitor may be electrically connected to the output terminal of the transistor of the last stage (the fifth transistor 1340), and the ground potential (0 V, corresponding to the low power supply potential) may be input to the other of the pair of electrodes of the capacitor. Note that in FIG. 1B, an output of the fifth transistor 1340 serves as an output of the step-up circuit 301, that is, the second high power supply potential (VDDH).

In addition, a clock signal CP_CLK is input to the other of the pair of electrodes of the second capacitor 1360 and the other of a pair of electrodes of a fourth capacitor 1380. A clock signal obtained by inverting the clock signal CP_CLK is input to the other of the pair of electrodes of the first capacitor 1350 and the other of a pair of electrodes of a third capacitor 1370. That is, the clock signal CP_CLK is input to the other of a pair of electrodes of a 2k-th capacitor (k: a natural number) and the inverted clock signal is input to the other of a pair of electrodes of a (2k−1)th capacitor. Needless to say, the clock signal CP_CLK and the inverted clock signal can be interchanged.

When the clock signal CP_CLK is low, that is, when the inverted clock signal is high, the first capacitor 1350 and the third capacitor 1370 are charged, and potentials of a node N1 and a node N3 that are capacitively coupled with a wiring (or an electrode) to which the inverted clock signal is input are raised by a predetermined voltage (a voltage corresponding to a difference between high and low potentials of the clock signal CP_CLK). On the other hand, potentials of a node N2 and a node N4 that are capacitively coupled with a wiring (or an electrode) to which the clock signal CP_CLK is input are dropped by the above predetermined voltage.

Accordingly, charge is transferred through the first transistor 1300, the third transistor 1320, and the fifth transistor 1340, and the potentials of the node N2 and the node N4 are raised to a predetermined value.

Next, when the clock signal CP_CLK is set high and the inverted clock signal is set low, the potentials of the node N2 and the node N4 are further raised. In contrast, the potentials of the node N1, the node N3, and a node N5 are dropped by a predetermined voltage.

Accordingly, charge is transferred through the second transistor 1310 and the fourth transistor 1330, and as a result, the potentials of the node N3 and the node N5 are raised to a predetermined potential. Thus, the potentials of the nodes satisfy $V_{N5} > V_{N4\ (CP\_CLK=Low)} > V_{N3\ (CP\_CLK=High)} > V_{N2\ (CP\_CLK=Low)} > V_{N1\ (CP\_CLK=High)} > VDD$, whereby the voltage is stepped up. Here, $V_{N5}$ represents the potential of the node N5; $V_{N4\ (CP\_CLK=Low)}$, the potential of the node N4 at the time when the clock signal CP_CLK is low; $V_{N3\ (CP\_CLK=High)}$, the potential of the node N3 at the time when the clock signal CP_CLK is high; $V_{N2\ (CP\_CLK=Low)}$, the potential of the node N2 at the time when the clock signal CP_CLK is low; and $V_{N1\ (CP\_CLK=High)}$, the potential of the node N1 at the time when the clock signal CP_CLK is high.

At least one or all of the transistors (the first transistor 1300, the second transistor 1310, the third transistor 1320, the fourth transistor 1330, the fifth transistor 1340, and the transistor 1390 in FIG. 1B) included in the step-up circuit 301 may be a transistor with extremely low off-state current. As a transistor with extremely low off-state current, a transistor whose channel is formed in an oxide semiconductor layer can be used, for example. With the use of a transistor with extremely low off-state current in the step-up circuit 301, the stepped-up voltage (the voltages of the nodes N1 to N5) can be held for a long time even if supply of the first high power supply potential (VDD) is stopped and supply of the power supply voltage is stopped. Consequently, the step-up circuit 301 can generate the second high power supply potential (VDDH) rapidly after supply of the first high power supply potential (VDD) is selected again, that is, after supply of the power supply voltage is selected. In such a manner, the data supply operation, which is described in Embodiment 1, can be performed at high speed; thus, a signal processing circuit can rapidly return to a state before stop of the supply of the power supply voltage.

This embodiment can be implemented in combination with any of the other embodiments as appropriate.

Embodiment 3

A method for manufacturing a signal processing circuit will be described. This embodiment explains a method for manufacturing a signal processing circuit, using the transistor 11 whose channel is formed in the oxide semiconductor layer, the capacitor 12, and a transistor 133 included in the arithmetic circuits 201 and 202 as an example of components included in the combination of the volatile storage circuit 200 and the nonvolatile storage circuit 10 illustrated in FIGS. 3A to 3E. Here, the case where a transistor whose channel is formed in a silicon layer is used as the transistor 133 is described as an example.

Note that the transistors (the first transistor 1300, the second transistor 1310, the third transistor 1320, the fourth transistor 1330, the fifth transistor 1340, and the transistor 1390 in FIG. 1B) included in the step-up circuit 301 can be formed in a manner similar to that of the transistor 11. Further, the capacitors (the first capacitor 1350, the second capacitor 1360, the third capacitor 1370, and the fourth capacitor 1380 in FIG. 1B) included in the step-up circuit 301 can be formed in a manner similar to that of the capacitor 12.

Figure 4A:
FIGS. 4A to 4D illustrate steps for manufacturing a signal processing circuit.

First, as illustrated in FIG. 4A, an insulating film 701 and a semiconductor film 702 that is separated from a single crystal semiconductor substrate are formed over a substrate 700.

Although there is no particular limitation on a material that can be used as the substrate 700, the material needs to have at least heat resistance high enough to withstand heat treatment to be performed later. For example, the substrate 700 can be a glass substrate formed by a fusion process or a float process, a quartz substrate, a semiconductor substrate, a ceramic substrate, or the like. In the case where a glass substrate is used and the temperature of the heat treatment to be performed later is high, a glass substrate whose strain point is 730° C. or higher is preferably used.

In this embodiment, a method for forming the transistor 133 in which the semiconductor film 702 is formed using single crystal silicon is described below. Here, a specific example of a method for forming the single crystal semiconductor film 702 is briefly described. First, an ion beam including ions which are accelerated by an electric field enters a bond substrate which is the single crystal semiconductor substrate and a fragile layer which is fragile because of local disorder of the crystal structure is formed in a region at a certain depth from a surface of the bond substrate. The depth at which the fragile layer is formed can be adjusted by the acceleration energy of the ion beam and the angle at which the ion beam enters. Then, the bond substrate and the substrate 700 which is provided with the insulating film 701 are attached to each other so that the insulating film 701 is sandwiched therebetween. After the bond substrate and the substrate 700 overlap with each other, a pressure of approximately 1 N/cm² to 500 N/cm², preferably 11 N/cm² to 20 N/cm² is applied to part of the bond substrate and part of the substrate 700 so that the substrates are attached to each other. When the pressure is applied, bonding between the bond substrate and the insulating film 701 starts from the parts, which results in bonding of the entire surface where the bond substrate and the insulating film 701 are in close contact with each other. Next, heat treatment is performed, so that microvoids that exist in the fragile layer are combined, and the volume of the microvoids is increased. Accordingly, a single crystal semiconductor film which is part of the bond substrate is separated from the bond substrate along the fragile layer. The heat treatment is performed at a temperature not exceeding the strain point of the substrate 700. Then, the single crystal semiconductor film is processed into a desired shape by etching or the like, so that the semiconductor film 702 can be formed.

In order to control the threshold voltage, an impurity element imparting p-type conductivity, such as boron, aluminum, or gallium, or an impurity element imparting n-type conductivity, such as phosphorus or arsenic, may be added to the semiconductor film 702. An impurity element for controlling the threshold voltage may be added to the semiconductor film which is not etched to have a predetermined shape or may be added to the semiconductor film 702 which has been etched into a predetermined shape. Alternatively, the impurity element for controlling the threshold voltage may be added to the bond substrate. Alternatively, it is possible that the impurity element is added to the bond substrate in order to roughly control the threshold voltage, and the impurity element is also added to the semiconductor film which is not etched to have a predetermined shape or the semiconductor film 702 which has been etched into a predetermined shape in order to finely control the threshold voltage.

Note that although an example in which a single crystal semiconductor film is used is described in this embodiment, the present invention is not limited to this structure. For example, a bulk semiconductor substrate where elements are isolated from each other by shallow trench isolation (STI) or the like may be used. For example, a polycrystalline, microcrystalline, or amorphous semiconductor film that is formed over the insulating film 701 by vapor deposition may be used. The semiconductor film may be crystallized by a known technique. Examples of the known technique of crystallization are a laser crystallization method using a laser beam and a crystallization method using a catalytic element. Alternatively, a crystallization method using a catalytic element and a laser crystallization method may be used in combination. In the case of using a heat-resistant substrate such as a quartz substrate, it is possible to combine any of the following crystallization methods: a thermal crystallization method using an electrically heated oven, a lamp heating crystallization method using infrared light, a crystallization method using a catalytic element, and a high-temperature heating method at approximately 950° C.

Figure 4B:
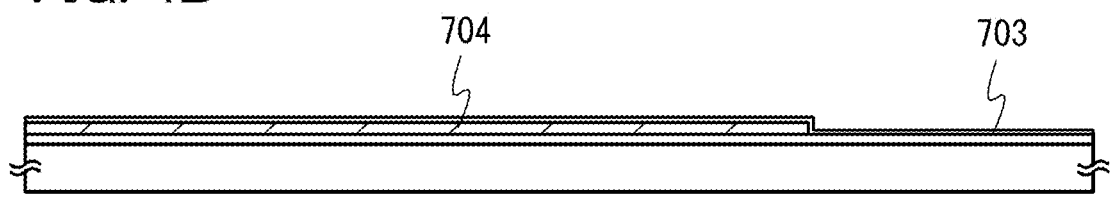

Next, as illustrated in FIG. 4B, a semiconductor layer 704 is formed using the semiconductor film 702. Then, a gate insulating film 703 is formed over the semiconductor layer 704.

The gate insulating film 703 can be a single layer or a stack of layers containing silicon oxide, silicon nitride oxide, silicon oxynitride, silicon nitride, hafnium oxide, aluminum oxide, tantalum oxide, yttrium oxide, hafnium silicate (Hf-$Si_xO_y$, (x>0, y>0)), hafnium silicate to which nitrogen is added (Hf$Si_xO_yN_z$ (x>0, y>0, z>0)), hafnium aluminate to which nitrogen is added (Hf$Al_xO_yN_z$, (x>0, y>0, z>0)), or the like by, for example, plasma-enhanced CVD or sputtering.

In this specification, oxynitride refers to a material containing a higher quantity of oxygen than that of nitrogen, and nitride oxide refers to a material containing a higher quantity of nitrogen than that of oxygen.

The thickness of the gate insulating film 703 can be, for example, 1 nm to 100 nm, preferably 10 nm to 50 nm. In this embodiment, a single-layer insulating film containing silicon oxide is formed as the gate insulating film 703 by plasma-enhanced CVD.

Figure 4C:
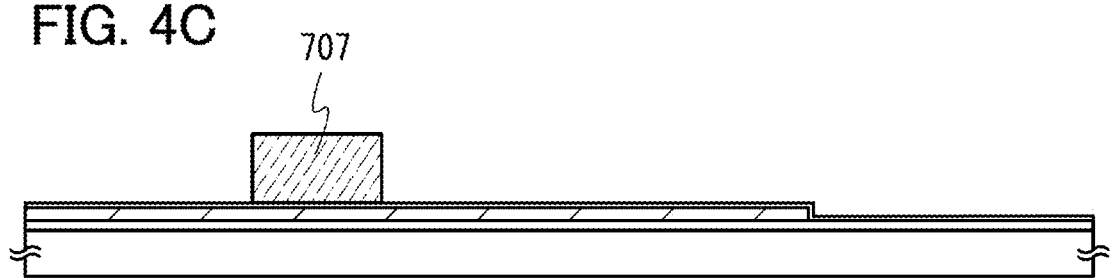

Then, a gate electrode 707 is formed as illustrated in FIG. 4C.

A conductive film is formed and then processed into a predetermined shape, so that the gate electrode 707 can be formed. The conductive film can be formed by CVD, sputtering, vapor deposition, spin coating, or the like. For the conductive film, tantalum (Ta), tungsten (W), titanium (Ti), molybdenum (Mo), aluminum (Al), copper (Cu), chromium (Cr), niobium (Nb), or the like can be used. Alternatively, an alloy containing the above metal as a main component or a compound containing the above metal may be used. Alternatively, the conductive film may be formed using a semiconductor such as polycrystalline silicon doped with an impurity element that imparts conductivity to the semiconductor film, such as phosphorus.

Note that although the gate electrode 707 is formed using a single-layer conductive film in this embodiment, this embodiment is not limited to this structure. The gate electrode 707 may be formed using a plurality of stacked conductive films.

As a combination of two conductive films, tantalum nitride or tantalum can be used for a first conductive film and tungsten can be used for a second conductive film. Other examples of the combination of two conductive films are tungsten nitride and tungsten, molybdenum nitride and molybdenum, aluminum and tantalum, and aluminum and titanium. Since tungsten and tantalum nitride have high heat resistance, heat treatment aimed at thermal activation can be performed in subsequent steps after forming the two conductive films. Moreover, as the combination of the two conductive films, it is possible to use, for example, nickel silicide and silicon doped with an impurity element imparting n-type conductivity, tungsten silicide and silicon doped with an impurity element imparting n-type conductivity, or the like.

In the case of using a three-layer structure in which three conductive films are stacked, it is preferable to employ a layered structure of a molybdenum film, an aluminum film, and a molybdenum film.

Further, a light-transmitting oxide conductive film of indium oxide, indium oxide-tin oxide, indium oxide-zinc oxide, zinc oxide, zinc aluminum oxide, zinc aluminum oxynitride, zinc gallium oxide, or the like can be used as the gate electrode 707.

Alternatively, the gate electrode 707 may be selectively formed by a droplet discharge method without using a mask. A droplet discharge method is a method for forming a predetermined pattern by discharge or ejection of a droplet containing a predetermined composition from an orifice, and includes an inkjet method in its category.

The gate electrode 707 can be formed in such a manner that a conductive film is formed and etched to have a desired tapered shape by inductively coupled plasma (ICP) etching with appropriate control of the etching conditions (e.g., the amount of power applied to a coil-shaped electrode layer, the amount of power applied to an electrode layer on the substrate side, and the electrode temperature on the substrate side). In addition, angles and the like of the tapered shapes can also be controlled by a shape of a mask. Note that as an etching gas, a chlorine-based gas such as chlorine, boron chloride, silicon chloride, or carbon tetrachloride; a fluorine-based gas such as carbon tetrafluoride, sulfur fluoride, or nitrogen fluoride; or oxygen can be used as appropriate.

Figure 4D:
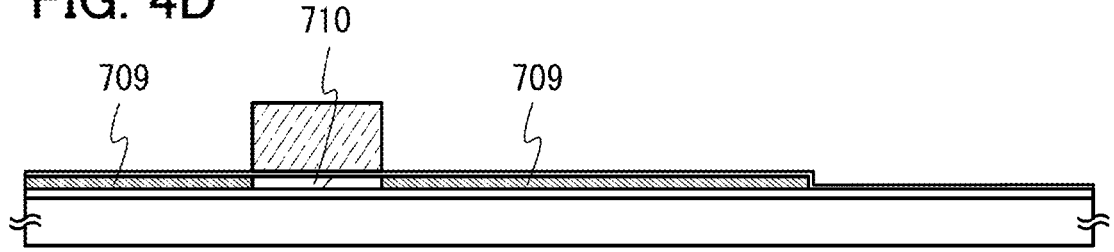

Next, as illustrated in FIG. 4D, an impurity element imparting one conductivity is added to the semiconductor layer 704 with the gate electrode 707 used as a mask, whereby a channel formation region 710 overlapping with the gate electrode 707, and a pair of impurity regions 709 between which the channel formation region 710 is placed are formed in the semiconductor layer 704.

In this embodiment, the case where an impurity element imparting p-type conductivity (e.g., boron) is added to the semiconductor layer 704 is described as an example.

Figure 5A:
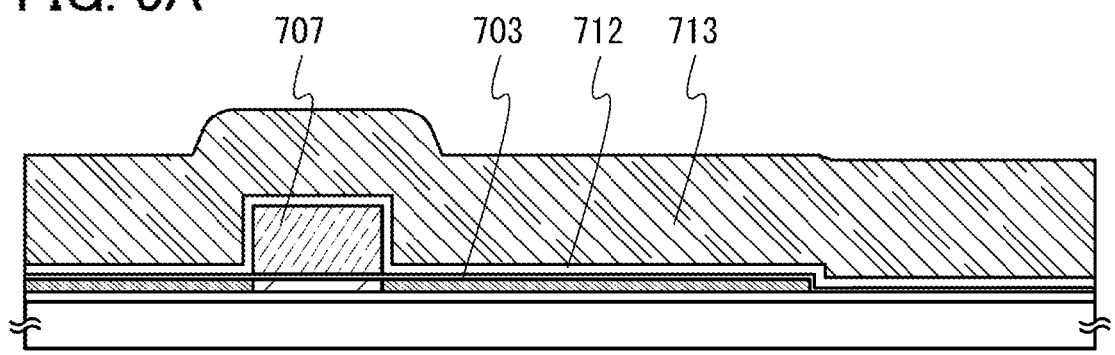
FIGS. 5A to 5C illustrate steps for manufacturing a signal processing circuit.

Next, as illustrated in FIG. 5A, an insulating film 712 and an insulating film 713 are formed so as to cover the gate insulating film 703 and the gate electrode 707. Specifically, an inorganic insulating film of silicon oxide, silicon nitride, silicon nitride oxide, silicon oxynitride, aluminum nitride, aluminum nitride oxide, or the like can be used as the insulating films 712 and 713. In particular, the insulating films 712 and 713 are preferably formed using a low dielectric constant (low-k) material, in which case capacitance due to overlapping of electrodes or wirings can be sufficiently reduced. Note that a porous insulating film containing any of the above materials may be used as the insulating films 712 and 713. Since the porous insulating film has lower dielectric constant than a dense insulating film, parasitic capacitance due to electrodes or wirings can be further reduced.

In this embodiment, the case where silicon oxynitride is used for the insulating film 712 and silicon nitride oxide is used for the insulating film 713 is described as an example. In addition, the example in which the insulating films 712 and 713 are formed over the gate electrode 707 is described in this embodiment; however, in the present invention, only one insulating film may be formed over the gate electrode 707 or a stack of three or more insulating films may be formed over the gate electrode 707.

Figure 5B:
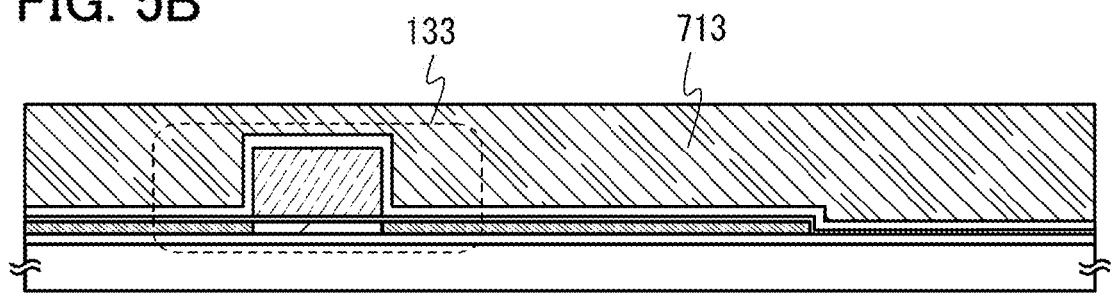

Next, as illustrated in FIG. 5B, the insulating film 713 is subjected to chemical mechanical polishing (CMP) or etching to planarize a top surface of the insulating film 713. Note that in order to improve the characteristics of the transistor 11 which is formed later, the surface of the insulating film 713 is preferably flattened as much as possible.

Through the above steps, the transistor 133 can be formed.

Figure 5C:
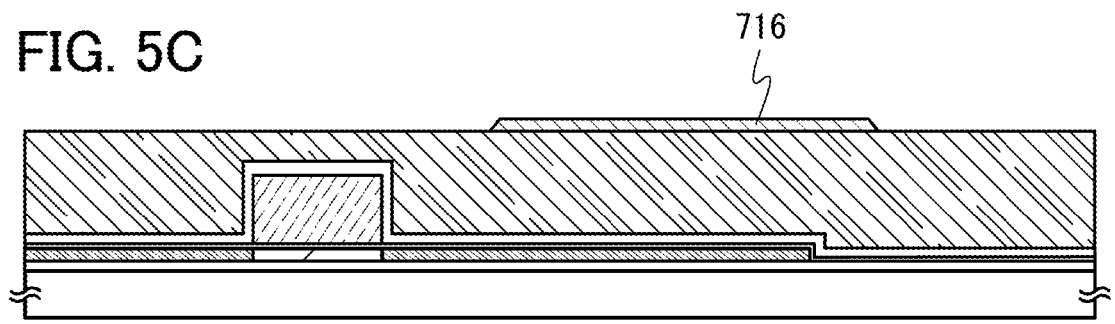

Next, a method for forming the transistor 11 is described. First, as illustrated in FIG. 5C, an oxide semiconductor layer 716 is formed over the insulating film 713.

The oxide semiconductor layer contains at least one element selected from In, Ga, Sn, and Zn. For example, it is possible to use any of the following oxide semiconductors: an In—Sn—Ga—Zn—O-based oxide semiconductor which is an oxide of four metal elements; an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, a Sn—Al—Zn—O-based oxide semiconductor, and a Hf—In—Zn—O-based oxide semiconductor which are metal oxides of three metal elements; an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, an In—Mg—O-based oxide semiconductor, and an In—Ga—O-based oxide semiconductor which are metal oxides of two metal elements; and an In—O-based oxide semiconductor, a Sn—O-based oxide semiconductor, and a Zn—O-based oxide semiconductor which are metal oxides of one metal element. In addition, any of the above oxide semiconductors may contain an element other than In, Ga, Sn, and Zn, for example, $SiO_2$.

For example, an In—Sn—Zn—O-based oxide semiconductor refers to an oxide semiconductor containing indium (In), tin (Sn), and zinc (Zn), and there is no particular limitation on the composition ratio thereof. Further, for example, an In—Ga—Zn—O-based oxide semiconductor refers to an oxide semiconductor containing indium (In), gallium (Ga), and zinc (Zn), and there is no limitation on the composition ratio thereof.

In the case where an In—Sn—Zn—O-based material is used as an oxide semiconductor, a target having a composition ratio of In:Sn:Zn=1:2:2, 2:1:3, 1:1:1, or the like in an atomic ratio is used.

For the oxide semiconductor layer, a thin film expressed by a chemical formula of $InMO_3(ZnO)_m$ (m>0) can be used. Here, M represents one or more metal elements selected from Zn, Ga, Al, Mn, and Co. For example, M can be Ga, Ga and Al, Ga and Mn, or Ga and Co.

In the case where an In—Zn—O-based material is used as an oxide semiconductor, a target has a composition ratio of In:Zn=50:1 to 1:2 in an atomic ratio ($In_2O_3$:ZnO=25:1 to 1:4 in a molar ratio), preferably In:Zn=20:1 to 1:1 in an atomic ratio ($In_2O_3$:ZnO=10:1 to 1:2 in a molar ratio), further preferably In:Zn=15:1 to 1.5:1 in an atomic ratio ($In_2O_3$:ZnO=15:2 to 3:4 in a molar ratio). For example, in a target used for forming an In—Zn—O-based oxide semiconductor that has an atomic ratio of In:Zn:O=X:Y:Z, the relation of Z>1.5X+Y is satisfied.

Note that it is preferable that the oxide semiconductor layer 716 be highly purified by a reduction of impurities such as moisture and hydrogen which serve as electron donors (donors), in which case current generated while the channel is not formed in the oxide semiconductor layer 716 can be reduced. Specifically, the concentration of hydrogen in the highly purified oxide semiconductor layer 716 which is measured by secondary ion mass spectrometry (SIMS) is $5\times10^{19}/cm^3$ or lower, preferably $5\times10^{18}/cm^3$ or lower, further preferably $5\times10^{17}/cm^3$ or lower, still further preferably $1\times10^{16}/cm^3$ or lower. The carrier density of the oxide semiconductor layer measured by Hall effect measurement is less than $1\times10^{14}/cm^3$, preferably less than $1\times10^{12}/cm^3$, further preferably less than $1\times10^{11}/cm^3$.

The analysis of the hydrogen concentration in the oxide semiconductor layer is described here. The hydrogen concentration of the semiconductor layer is measured by SIMS. It is known that it is difficult, in principle, to obtain correct data in the proximity of a surface of a sample or in the proximity of an interface between stacked layers formed using different materials by the SIMS analysis. Thus, in the case where the distribution of the concentration of hydrogen in the layer in the thickness direction is analyzed by SIMS, an average value in a region of the layer in which the value is not greatly changed and substantially the same value can be obtained is employed as the hydrogen concentration. Further, in the case where the thickness of the layer is small, a region where almost the same value is obtained cannot be found in some cases due to the influence of the hydrogen concentration of an adjacent layer. In that case, the maximum value or the minimum value of the hydrogen concentration in the region of the layer is employed as the hydrogen concentration of the layer. Moreover, in the case where a mountain-shaped peak having the maximum value or a valley-shaped peak having the minimum value do not exist in the region of the layer, the value at the inflection point is employed as the hydrogen concentration.

The oxide semiconductor layer 716 can be formed by processing an oxide semiconductor film formed over the insulating film 713 into a desired shape. The thickness of the oxide semiconductor film is 2 nm to 200 nm, preferably 3 nm to 50 nm, further preferably 3 nm to 20 nm. The oxide semiconductor film is formed by sputtering using an oxide semiconductor as a target. Moreover, the oxide semiconductor film can be formed by sputtering in a rare gas (e.g., argon) atmosphere, an oxygen atmosphere, or a mixed atmosphere of a rare gas (e.g., argon) and oxygen.

When the oxide semiconductor layer 716 is to be formed by sputtering, it is important to reduce water and hydrogen existing in the chamber as much as possible, in addition to the hydrogen concentration of the target. Specifically, for example, it is effective to perform baking of the chamber before deposition of the oxide semiconductor layer 716, to reduce the concentration of water and hydrogen in a gas introduced into the chamber, and to prevent the counter flow in an evacuation system for exhausting a gas from the chamber.

Before the oxide semiconductor film is formed by sputtering, dust on the surface of the insulating film 713 may be removed by reverse sputtering in which an argon gas is introduced and plasma is generated. The reverse sputtering is a method in which voltage is applied to a substrate, not to a target side, under an argon atmosphere by using an RF power source and plasma is generated in the vicinity of the substrate to modify a surface. Note that instead of an argon atmosphere, a nitrogen atmosphere, a helium atmosphere, or the like may be used. Alternatively, an argon atmosphere to which oxygen, nitrous oxide, or the like is added may be used. Further alternatively, an argon atmosphere to which chlorine, carbon tetrafluoride, or the like is added may be used.

In order that the oxide semiconductor film contains as little hydrogen, a hydroxyl group, and moisture as possible, impurities adsorbed on the substrate 700, such as moisture or hydrogen, may be eliminated and removed by preheating the substrate 700, over which the insulating films 712 and 713 are formed, in a preheating chamber of a sputtering apparatus as a pretreatment for film formation. The temperature for the preheating is 100° C. to 400° C., preferably 150° C. to 300° C. As an evacuation unit provided in the preheating chamber, a cryopump is preferably used. Note that this preheating treatment can be omitted. This preheating may be similarly performed on the substrate 700 over which conductive layers 719 and 720 are formed before the formation of a gate insulating film 721.

In this embodiment, a 30-nm-thick In—Ga—Zn—O-based oxide semiconductor thin film which is obtained by sputtering using a target including indium (In), gallium (Ga), and zinc (Zn), is used as the oxide semiconductor film. As the target, a target having a composition ratio of In:Ga:Zn=1:1:0.5, 1:1:1, or 1:1:2 can be used, for example. The filling rate of the target including In, Ga, and Zn is 90% or higher and 100% or lower, preferably 95% or higher and lower than 100%. With the use of the target with high filling rate, a dense oxide semiconductor film is formed.

In this embodiment, the oxide semiconductor film is deposited in such a manner that the substrate is held in a treatment chamber kept in a reduced-pressure state, a sputtering gas from which hydrogen and moisture are removed is introduced while moisture remaining in the treatment chamber is removed, and the target is used. The substrate temperature at the time of film formation may be 100° C. to 600° C., preferably 200° C. to 400° C. By forming the oxide semiconductor film while the substrate is heated, the concentration of impurities included in the formed oxide semiconductor film can be reduced. In addition, damage by sputtering is reduced. In order to remove remaining moisture in the treatment chamber, an entrapment vacuum pump is preferably used. For example, a cryopump, an ion pump, or a titanium sublimation pump is preferably used. The evacuation unit may be a turbo pump provided with a cold trap. In the treatment chamber which is evacuated with the cryopump, for example, a hydrogen atom, a compound containing a hydrogen atom, such as water ($H_2O$) (preferably, a compound containing a carbon atom as well), and the like are removed, whereby the impurity concentration of the oxide semiconductor film formed in the treatment chamber can be reduced.

As an example of the deposition conditions, the distance between the substrate and the target is 100 mm, the pressure is 0.6 Pa, the direct-current (DC) power is 0.5 kW, and the atmosphere is an oxygen atmosphere (the proportion of the oxygen flow rate is 100%). Note that a pulsed direct-current (DC) power source is preferable because dust generated in deposition can be reduced and the film thickness can be made uniform.

When the leakage rate of the treatment chamber of the sputtering apparatus is set to $1 \times 10^{-10}$ Pa·m$^3$/s or lower, entry of impurities such as an alkali metal or hydride into the oxide semiconductor film that is being formed by sputtering can be reduced. Further, with the use of the entrapment vacuum pump as an evacuation system, counter flow of impurities, such as alkali metal, hydrogen atoms, hydrogen molecules, water, a hydroxyl group, or hydride, from the evacuation system can be reduced.

When the purity of the target is set to 99.99% or higher, entry of alkali metal, hydrogen atoms, hydrogen molecules, water, a hydroxyl group, hydride, or the like into the oxide semiconductor film can be suppressed. In addition, the use of such a target leads to a reduction in the concentration of alkali metal such as lithium, sodium, or potassium in the oxide semiconductor film.

Note that the oxide semiconductor layer may be either amorphous or crystalline. In the latter case, the oxide semiconductor layer may be single crystalline or polycrystalline, or may have a structure in which part of the oxide semiconductor layer is crystalline, an amorphous structure including a crystalline portion, or a non-amorphous structure. For example, as the oxide semiconductor layer, an oxide semiconductor including a crystal with c-axis alignment (also referred to as a c-axis aligned crystalline oxide semiconductor (CAAC-OS)), which has a triangular or hexagonal atomic arrangement when seen from the direction of an a-b plane, a surface, or an interface can be used. In the crystal, metal atoms are arranged in a layered manner or metal atoms and oxygen atoms are arranged in a layered manner along the c-axis, and the direction of the a-axis or the b-axis is varied in the a-b plane (the crystal rotates around the c-axis).

The CAAC-OS is not a single crystal, but this does not mean that the CAAC-OS is composed of only an amorphous component. Although the CAAC-OS includes a crystallized portion (crystalline portion), a boundary between one crystalline portion and another crystalline portion is not clear in some cases.

In the case where oxygen is included in the CAAC-OS, nitrogen may be substituted for part of oxygen included in the CAAC-OS. The c-axes of individual crystalline portions included in the CAAC-OS may be aligned in one direction (e.g., a direction perpendicular to a surface of a substrate over which the CAAC-OS is formed or a surface of the CAAC-OS). Alternatively, the normals of the a-b planes of the individual crystalline portions included in the CAAC-OS may be aligned in one direction (e.g., a direction perpendicular to a surface of a substrate over which the CAAC-OS is formed or a surface of the CAAC-OS).

The CAAC-OS becomes a conductor, a semiconductor, or an insulator depending on its composition or the like. The CAAC-OS transmits or does not transmit visible light depending on its composition or the like.

An example of such a CAAC-OS is a crystal which is formed into a film shape and has a triangular or hexagonal atomic arrangement when observed from the direction perpendicular to a surface of the film or a surface of a substrate, and in which metal atoms are arranged in a layered manner or metal atoms and oxygen atoms (or nitrogen atoms) are arranged in a layered manner when a cross section of the film is observed.

An oxide semiconductor film containing the CAAC-OS (hereinafter also referred to as CAAC-OS film) can be formed by sputtering. The proportion of oxygen gas in an atmosphere at the time when a CAAC-OS film is deposited by sputtering is preferably high. For sputtering in a mixed gas atmosphere of argon and oxygen, for example, the proportion of oxygen gas is preferably set 30% or higher, further preferably 40% or higher. This is because supply of oxygen from the atmosphere promotes crystallization of the CAAC-OS film.

When a CAAC-OS film is deposited by sputtering, a substrate over which the CAAC-OS film is deposited is heated preferably to 150° C. or higher, further preferably to 170° C. or higher. This is because the higher the substrate temperature, the more the crystallization of the CAAC-OS is promoted.

After being subjected to heat treatment in a nitrogen atmosphere or in vacuum, the CAAC-OS film is preferably subjected to heat treatment in an oxygen atmosphere or a mixed atmosphere of oxygen and another gas. This is because oxygen vacancies due to the former heat treatment can be compensated by supply of oxygen from the atmosphere in the latter heat treatment.

A film surface on which the CAAC-OS film is deposited (deposition surface) is preferably flat. This is because the c-axes of crystalline portions in the CAAC-OS film are substantially perpendicular to the deposition surface, and thus irregularities of the deposition surface cause grain boundaries in the CAAC-OS film. For that reason, the deposition surface is preferably subjected to planarization treatment such as chemical mechanical polishing (CMP) before the CAAC-OS film is formed. The average roughness of the deposition surface is preferably 0.5 nm or less, further preferably 0.3 nm or less.

The oxide semiconductor film formed in the above-described manner is etched, thereby forming the oxide semiconductor layer 716. Etching for forming the oxide semiconductor layer 716 may be dry etching, wet etching, or both dry etching and wet etching. As an etching gas used for dry etching, it is preferable to use a gas containing chlorine (a chlorine-based gas such as chlorine ($Cl_2$), boron trichloride ($BCl_3$), silicon tetrachloride ($SiCl_4$), or carbon tetrachloride ($CCl_4$)). Alternatively, it is possible to use a gas containing fluorine (a fluorine-based gas such as carbon tetrafluoride ($CF_4$), sulfur hexafluoride ($SF_6$), nitrogen trifluoride ($NF_3$), or trifluoromethane ($CHF_3$)), hydrogen bromide (HBr), oxygen ($O_2$), any of these gases to which a rare gas such as helium (He) or argon (Ar) is added, or the like.

As the dry etching method, a parallel plate RIE (reactive ion etching) method or an ICP (inductively coupled plasma) etching method can be used. In order to etch the film into a desired shape, the etching conditions (e.g., the amount of power applied to a coiled electrode, the amount of power applied to an electrode on the substrate side, and the electrode temperature on the substrate side) are adjusted as appropriate.

As an etchant used for the wet etching, a mixed solution of phosphoric acid, acetic acid, and nitric acid, or organic acid such as citric acid or oxalic acid can be used. In this embodiment, ITO-07N (produced by Kanto Chemical Co., Inc.) is used.

A resist mask used for forming the oxide semiconductor layer 716 may be formed by an inkjet method. Formation of the resist mask by an inkjet method needs no photomask; thus, manufacturing costs can be reduced.

Note that it is preferable to perform reverse sputtering before the formation of a conductive film in a subsequent step to remove resist residues and the like that attach onto surfaces of the oxide semiconductor layer 716 and the insulating film 713.

Note that the oxide semiconductor film deposited by sputtering or the like contains a large amount of moisture or hydrogen (including a hydroxyl group) as an impurity in some cases. Moisture or hydrogen easily forms donor levels and thus serves as an impurity in the oxide semiconductor. Therefore, in one embodiment of the present invention, in order to reduce impurities such as moisture and hydrogen in the oxide semiconductor film (dehydrate or dehydrogenate the oxide semiconductor film), the oxide semiconductor layer 716 is subjected to heat treatment in a reduced-pressure atmosphere, an inert gas atmosphere of nitrogen, a rare gas, or the like, an oxygen gas atmosphere, or an ultra dry air atmosphere (with a moisture content of 20 ppm (−55° C. by conversion into a dew point) or less, preferably 1 ppm or less, further preferably 10 ppb or less, in the case where the measurement is performed by a dew point meter of a cavity ring down laser spectroscopy (CRDS) system).

By performing heat treatment on the oxide semiconductor layer 716, moisture or hydrogen in the oxide semiconductor layer 716 can be eliminated. Specifically, heat treatment may be performed at a temperature higher than or equal to 250° C. and lower than or equal to 750° C., preferably higher than or equal to 400° C. and lower than the strain point of the substrate. For example, heat treatment may be performed at 500° C. for 3 to 6 minutes. When RTA is used for the heat treatment, dehydration or dehydrogenation can be performed in a short time; thus, treatment can be performed even at a temperature higher than the strain point of a glass substrate.

In this embodiment, an electrical furnace which is one of heat treatment apparatuses is used.

Note that the heat treatment apparatus is not limited to an electric furnace, and may have a device for heating an object by heat conduction or heat radiation from a heating element such as a resistance heating element. For example, an RTA (rapid thermal annealing) apparatus such as a GRTA (gas rapid thermal annealing) apparatus or an LRTA (lamp rapid thermal annealing) apparatus can be used. An LRTA apparatus is an apparatus for heating an object by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the gas, an inert gas which does not react with an object by heat treatment, for example, nitrogen or a rare gas such as argon is used.

In the heat treatment, it is preferable that moisture, hydrogen, and the like be not contained in nitrogen or a rare gas such as helium, neon, or argon. Alternatively, the purity of nitrogen or a rare gas such as helium, neon, or argon which is introduced into the heat treatment apparatus is preferably 6 N (99.9999%) or higher, further preferably 7 N (99.99999%) or higher (i.e., the impurity concentration is preferably 1 ppm or lower, further preferably 0.1 ppm or lower).

Note that it has been pointed out that an oxide semiconductor is insensitive to impurities, there is no problem when a considerable amount of metal impurities is contained in the film, and therefore, soda-lime glass which contains a large amount of alkali metal such as sodium (Na) and is inexpensive can be used (Kamiya, Nomura, and Hosono, "Carrier Transport Properties and Electronic Structures of Amorphous Oxide Semiconductors: The present status", *KOTAI BUTSURI (SOLID STATE PHYSICS)*, 2009, Vol. 44, pp. 621-633). Such consideration, however, is not appropriate. Alkali metal is not a constituent element of an oxide semiconductor and is therefore an impurity. Alkaline earth metal also serves as an impurity in the case where alkaline earth metal is not a constituent element of an oxide semiconductor. When an insulating film in contact with the oxide semiconductor layer is an oxide, Na, among the alkali metals, diffuses into the insulating film and becomes $Na^+$. Further, in the oxide semiconductor layer, Na cuts or enters a bond between metal and oxygen which are included in the oxide semiconductor, causing deterioration of transistor characteristics (e.g., normally-on state of the transistor due to a negative shift of the threshold voltage or the decrease in mobility) and variations in the characteristics. Such deterioration of characteristics and variations in the characteristics of the transistor due to the impurity are significant especially in the case where the hydrogen concentration of the oxide semiconductor layer is extremely low. Therefore, the concentration of the above impurity is preferably reduced when the hydrogen concentration of the oxide semiconductor layer is $1\times10^{18}/cm^3$ or lower, preferably $1\times10^{17}/cm^3$ or lower. Specifically, the measurement value of a Na concentration by secondary ion mass spectrometry is preferably $5\times10^{16}/cm^3$ or lower, further preferably $1\times10^{16}/cm^3$ or lower, still further preferably $1\times10^{15}/cm^3$ or lower. Similarly, the measurement value of a Li concentration is preferably $5\times10^{15}/cm^3$ or lower, further preferably $1\times10^{15}/cm^3$ or lower. Similarly, the measurement value of a K concentration is preferably $5\times10^{15}/cm^3$ or lower, further preferably $1\times10^{15}/cm^3$ or lower.

Through the above steps, the concentration of hydrogen in the oxide semiconductor layer 716 can be reduced and the oxide semiconductor layer can be highly purified; consequently, the oxide semiconductor layer can be stable. In addition, heat treatment at a temperature that is lower than or equal to the glass transition temperature makes it possible to form an oxide semiconductor layer with extremely low carrier density and a wide band gap. Thus, the transistor can be manufactured using a large-sized substrate, so that the productivity can be increased. Further, by using the highly purified oxide semiconductor layer in which the hydrogen concentration is reduced, it is possible to fabricate a transistor with high withstand voltage and extremely low off-state current. The above heat treatment can be performed at any time as long as it is performed after the oxide semiconductor layer is formed.

Figure 6A:
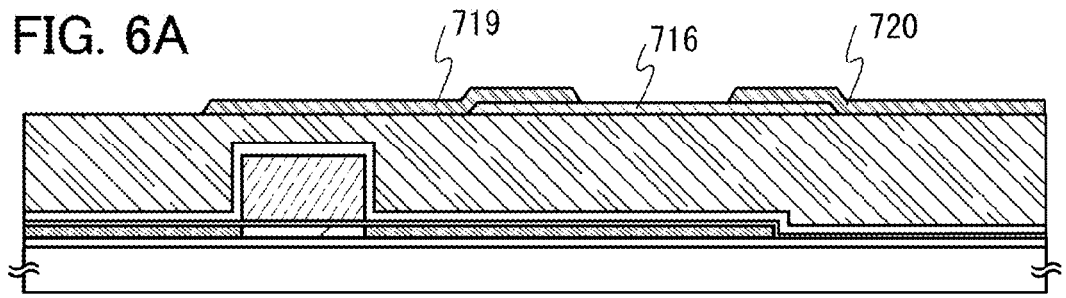
FIGS. 6A to 6D illustrate steps for manufacturing a signal processing circuit.

Next, as illustrated in FIG. 6A, the conductive layer 719 and the conductive layer 720 each of which is in contact with the oxide semiconductor layer 716 are formed. The conductive layers 719 and 720 function as source and drain electrodes.

Specifically, the conductive layers 719 and 720 can be formed in such a manner that a conductive film is formed by sputtering or vacuum vapor deposition and then processed into a predetermined shape.

The conductive film serving as the conductive layers 719 and 720 can be formed using any of the following materials: an element selected from aluminum, chromium, copper, tantalum, titanium, molybdenum, or tungsten; an alloy containing any of these elements; an alloy containing the above elements in combination; and the like. Alternatively, the conductive film may have a structure in which a film of a refractory metal such as chromium, tantalum, titanium, molybdenum, or tungsten is stacked over or below a metal film of aluminum, copper, or the like. Aluminum or copper is preferably used in combination with a refractory metal material in order to avoid problems with heat resistance and corrosion. As the refractory metal material, molybdenum, titanium, chromium, tantalum, tungsten, neodymium, scandium, yttrium, or the like can be used.

Further, the conductive film serving as the conductive layers 719 and 720 may have a single-layer structure or a layered structure of two or more layers. For example, the conductive film may have a single-layer structure of an aluminum film containing silicon, a two-layer structure in which a titanium film is stacked over an aluminum film, or a three-layer structure in which a titanium film, an aluminum film, and a titanium film are stacked in that order. A Cu—Mg—Al alloy, a Mo—Ti alloy, Ti, and Mo have high adhesiveness with an oxide film. For that reason, when the conductive layers 719 and 720 have a layered structure in which a conductive film of Cu is stacked over a conductive film of a Cu—Mg—Al alloy, a Mo—Ti alloy, Ti, or Mo, the adhesion between an insulating film which is an oxide film and the conductive layers 719 and 720 can be increased.

Alternatively, the conductive film serving as the conductive layers 719 and 720 may be formed using a conductive metal oxide. As the conductive metal oxide, indium oxide, tin oxide, zinc oxide, indium oxide-tin oxide, indium oxide-zinc oxide, or the conductive metal oxide material containing silicon or silicon oxide can be used.

In the case where heat treatment is performed after formation of the conductive film, the conductive film preferably has heat resistance high enough to withstand the heat treatment.

Note that the materials and etching conditions are adjusted as appropriate so that the oxide semiconductor layer 716 is not removed as much as possible in etching of the conductive film. Depending on the etching conditions, an exposed portion of the oxide semiconductor layer 716 is partially etched and thus a groove (a depression portion) is formed in some cases.

In this embodiment, a titanium film is used as the conductive film. For that reason, wet etching can be selectively performed on the conductive film using a solution containing ammonia and hydrogen peroxide water (i.e., an ammonia hydrogen peroxide mixture). As the ammonia hydrogen peroxide mixture, a solution in which hydrogen peroxide water of 31 wt %, ammonia water of 28 wt %, and water are mixed at a volume ratio of 5:2:2 is specifically used. Alternatively, dry etching may be performed on the conductive film with the use of a gas containing chlorine ($Cl_2$), boron chloride ($BCl_3$), or the like.

In order to reduce the number of photomasks and steps in a photolithography step, etching may be performed with the use of a resist mask formed using a multi-tone mask which is a light-exposure mask through which light is transmitted so as to have a plurality of intensities. A resist mask formed using a multi-tone mask has a plurality of thicknesses and can be changed in shape by etching; thus, the resist mask can be used in a plurality of etching processes for processing films into different patterns. That is, a resist mask corresponding to at least two kinds of different patterns can be formed by one multi-tone mask. Thus, the number of light-exposure masks can be reduced and the number of corresponding photolithography steps can be also reduced, whereby the process can be simplified.

Further, an oxide conductive film functioning as a source region and a drain region may be provided between the oxide semiconductor layer 716 and the conductive layers 719 and 720 functioning as the source and drain electrodes. The material of the oxide conductive film preferably contains zinc oxide as a component and preferably does not contain indium oxide. For such an oxide conductive film, zinc oxide, zinc aluminum oxide, zinc aluminum oxynitride, gallium zinc oxide, or the like can be used.

For example, in the case where the oxide conductive film is formed, etching for forming the oxide conductive film and etching for forming the conductive layers 719 and 720 may be performed concurrently.

With the provision of the oxide conductive film functioning as the source and drain regions, the resistance between the oxide semiconductor layer 716 and the conductive layers 719 and 720 can be lowered, so that the transistor can operate at high speed. In addition, with the provision of the oxide conductive film functioning as the source and drain regions, the withstand voltage of the transistor can be increased.

Next, plasma treatment may be performed using a gas such as $N_2O$, $N_2$, or Ar. By this plasma treatment, water or the like adhering to an exposed surface of the oxide semiconductor layer is removed. Alternatively, plasma treatment may be performed using a mixed gas of oxygen and argon.

Figure 6B:
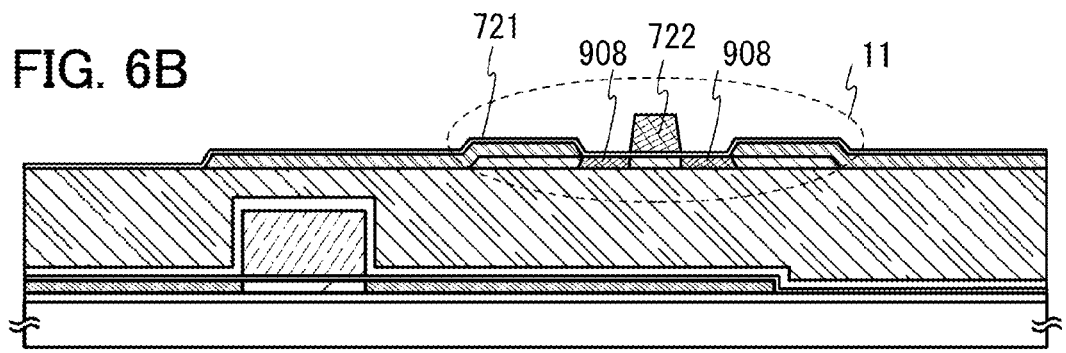

After the plasma treatment, as illustrated in FIG. 6B, the gate insulating film 721 is formed so as to cover the conductive layers 719 and 720 and the oxide semiconductor layer 716. Then, a gate electrode 722 is formed over the gate insulating film 721 to overlap with the oxide semiconductor layer 716.

Next, after the formation of the gate electrode 722, dopant imparting n-type conductivity is added to the oxide semiconductor layer 716 with the use of the gate electrode 722 as a mask, so that a pair of heavily doped regions 908 is formed. Note that in the oxide semiconductor layer 716, a region that overlaps with the gate electrode 722 with the gate insulating film 721 placed therebetween serves as a channel formation region. In the oxide semiconductor layer 716, the channel formation region is provided between the pair of heavily doped regions 908. The dopant for forming the heavily doped regions 908 can be added by an ion implantation method. The dopant can be a rare gas such as helium, argon, and xenon; an atom belonging to Group 15, such as nitrogen, phosphorus, arsenic, and antimony; or the like. For example, when nitrogen is used as the dopant, the concentration of nitrogen atoms in the heavily doped regions 908 is preferably higher than or equal to $5 \times 10^{19}/cm^3$ and lower than or equal to $1 \times 10^{22}/cm^3$. The heavily doped regions 908, to which the dopant imparting n-type conductivity is added, has higher conductivity than other regions in the oxide semiconductor layer 716. Therefore, by providing the heavily doped regions 908 in the oxide semiconductor layer 716, the resistance between the source electrode and the drain electrode (the conductive layer 719 and the conductive layer 720) can be lowered.

The decrease in the resistance between the source electrode and the drain electrode (the conductive layer 719 and the conductive layer 720) can ensure high on-state current and high-speed operation even when the transistor 11 is miniaturized. Moreover, the miniaturization of the transistor 11 can reduce the size of the signal processing circuit 300.

In the case where an In—Ga—Zn—O-based oxide semiconductor is used for the oxide semiconductor layer 716, an oxide semiconductor in the heavily doped regions 908 has a wurtzite crystal structure by heat treatment at 300° C. to 600° C. for about 1 hour after the addition of nitrogen. When the oxide semiconductor in the heavily doped regions 908 has a wurtzite crystal structure, the conductivity of the heavily doped regions 908 can be further increased and the resistance between the source electrode and the drain electrode (the conductive layer 719 and the conductive layer 720) can be further reduced. Note that in order to effectively reduce the resistance between the source electrode and the drain electrode (between the conductive layer 719 and the conductive layer 720) by forming the oxide semiconductor with a wurtzite crystal structure, when nitrogen is used as the dopant, the nitrogen atom concentration of the heavily doped regions 908 is preferably higher than or equal to $1 \times 10^{20}/cm^3$ and lower than or equal to 7 at. %. However, even when the nitrogen atom concentration is lower than the above range, the oxide semiconductor with a wurtzite crystal structure is obtained in some cases.

The gate insulating film 721 can be formed using a material and a layered structure that are similar to those of the gate insulating film 703. Note that the gate insulating film 721 preferably includes impurities such as moisture and hydrogen as little as possible, and may be formed using a single-layer insulating film or a stack of a plurality of insulating films. When hydrogen is contained in the gate insulating film 721, hydrogen enters the oxide semiconductor layer 716 or oxygen in the oxide semiconductor layer 716 is extracted by hydrogen, whereby the oxide semiconductor layer 716 has lower resistance (n-type conductivity) and a parasitic channel might be formed as a result. Therefore, it is important that a deposition method in which hydrogen is not used be employed in order to form the gate insulating film 721 containing hydrogen as little as possible. A material having a high barrier property is preferably used for the gate insulating film 721. As the insulating film having a high barrier property, a silicon nitride film, a silicon nitride oxide film, an aluminum nitride film, an aluminum nitride oxide film, or the like can be used, for example. When a stack of a plurality of insulating films is used, an insulating film having a lower proportion of nitrogen, such as a silicon oxide film or a silicon oxynitride film, is formed closer to the oxide semiconductor layer 716 than the insulating film having a high barrier property is. Then, the insulating film having a high barrier property is formed so as to overlap with the conductive layers 719 and 720 and the oxide semiconductor layer 716 with the insulating film having low proportion of nitrogen placed therebetween. When the insulating film having a high barrier property is used, impurities such as moisture and hydrogen can be prevented from entering the oxide semiconductor layer 716, the gate insulating film 721, or the interface between the oxide semiconductor layer 716 and another insulating film and the vicinity thereof. In addition, the insulating film having low proportion of nitrogen, such as a silicon oxide film or a silicon oxynitride film, is formed so as to be in contact with the oxide semiconductor layer 716, so that the insulating film having a high barrier property can be prevented from being in direct contact with the oxide semiconductor layer 716.

In this embodiment, the gate insulating film 721 has a structure in which a 100-nm-thick silicon nitride film formed by sputtering is stacked over a 200-nm-thick silicon oxide film formed by sputtering. The substrate temperature in film formation may be higher than or equal to room temperature and lower than or equal to 300° C., and is 100° C. in this embodiment.

After the gate insulating film 721 is formed, heat treatment may be performed. The heat treatment is performed in a nitrogen atmosphere, ultra-dry air, or a rare gas (e.g., argon or helium) atmosphere preferably at 200° C. to 400° C., for example, 250° C. to 350° C. It is preferable that the water content in the gas be 20 ppm or less, preferably 1 ppm or less, further preferably 10 ppb or less. In this embodiment, for example, heat treatment is performed at 250° C. for 1 hour in a nitrogen atmosphere. Alternatively, RTA treatment for a short time at a high temperature may be performed before the formation of the conductive layers 719 and 720 in a manner similar to that of the heat treatment performed on the oxide semiconductor layer for reduction of moisture or hydrogen. Even when oxygen deficiency is generated in the oxide semiconductor layer 716 by the previous heat treatment performed on the oxide semiconductor layer 716, oxygen is supplied to the oxide semiconductor layer 716 from the gate insulating film 721 by performing heat treatment after the gate insulating film 721 containing oxygen is provided. By supplying oxygen to the oxide semiconductor layer 716, oxygen deficiency that serves as a donor can be reduced in the oxide semiconductor layer 716 and the stoichiometric ratio can be satisfied. The oxide semiconductor layer 716 preferably contains oxygen whose composition exceeds the stoichiometric composition. As a result, the oxide semiconductor layer 716 can be made to be substantially i-type and variation in electrical characteristics of the transistor due to oxygen deficiency can be reduced; thus, electrical characteristics can be improved. There is no particular limitation on the timing of this heat treatment as long as it is after the formation of the gate insulating film 721. When this heat treatment doubles as another step such as heat treatment for formation of a resin film or heat treatment for reduction of the resistance of a transparent conductive film, the oxide semiconductor layer 716 can be made to be substantially i-type without the increase in the number of steps.

Moreover, the oxygen deficiency that serves as a donor in the oxide semiconductor layer 716 may be reduced by subjecting the oxide semiconductor layer 716 to heat treatment in an oxygen atmosphere so that oxygen is added to the oxide semiconductor. The heat treatment is performed at a temperature of, for example, higher than or equal to 100° C. and lower than 350° C., preferably higher than or equal to 150° C. and lower than 250° C. It is preferable that an oxygen gas used for the heat treatment under an oxygen atmosphere do not include water, hydrogen, or the like. Alternatively, the purity of the oxygen gas introduced into the heat treatment apparatus is preferably 6N (99.9999%) or higher, further preferably 7N (99.99999%) or higher (i.e., the impurity concentration in the oxygen gas is preferably 1 ppm or lower, further preferably 0.1 ppm or lower).

Alternatively, oxygen may be added to the oxide semiconductor layer 716 by ion implantation, ion doping, or the like to reduce oxygen deficiency serving as a donor. For example, oxygen which is made into a plasma state with a microwave at 2.45 GHz may be added to the oxide semiconductor layer 716.

The gate electrode 722 can be formed in such a manner that a conductive film is formed over the gate insulating film 721 and then processed by etching. The gate electrode 722 can be formed using a material similar to that of the gate electrode 707 or the conductive layers 719 and 720.

The thickness of the gate electrode 722 is 10 nm to 400 nm, preferably 100 nm to 200 nm. In this embodiment, after a 150-nm-thick conductive film for the gate electrode is formed by sputtering using a tungsten target, the conductive film is etched into a desired shape, so that the gate electrode 722 is formed. Note that a resist mask may be formed by an inkjet method. Formation of the resist mask by an inkjet method needs no photomask; thus, manufacturing costs can be reduced.

Through the above steps, the transistor 11 is formed.

In the transistor 11, the source and drain electrodes (the conductive layers 719 and 720) do not overlap with the gate electrode 722. That is, the distance between the source electrode (the conductive layer 719) and the gate electrode 722 and the distance between the drain electrode (the conductive layer 720) and the gate electrode 722 are each larger than the thickness of the gate insulating film 721. Thus, in the transistor 11, parasitic capacitance formed between the source electrode and the gate electrode and between the drain electrode and the gate electrode can be reduced; consequently, the transistor 11 can operate at high speed.

Note that the transistor 11 is not limited to a transistor whose channel is formed in an oxide semiconductor layer, and can be a transistor whose channel formation region contains a semiconductor material having a wider band gap and lower intrinsic carrier density than silicon. As such a semiconductor material, for example, silicon carbide or gallium nitride can be used instead of an oxide semiconductor. With a channel formation region containing such a semiconductor material, a transistor whose off-state current is extremely low can be provided.

Although the transistor 11 is described as a single-gate transistor, it is possible, if necessary, to fabricate a multi-gate transistor that includes a plurality of gate electrodes electrically connected to each other and thus includes a plurality of channel formation regions.

Note that an insulating film in contact with the oxide semiconductor layer 716 (which corresponds to the gate insulating film 721 in this embodiment) may be formed using an insulating material containing a Group 13 element and oxygen. Many of oxide semiconductor materials contain elements of Group 13, and an insulating material containing a Group 13 element is compatible with an oxide semiconductor. Thus, when an insulating material containing a Group 13 element is used for the insulating film in contact with the oxide semiconductor layer, the state of the interface between the oxide semiconductor layer and the insulating film can be kept favorable.

An insulating material containing a Group 13 element is an insulating material containing one or more elements that belong to Group 13. Examples of the insulating material containing a Group 13 element are gallium oxide, aluminum oxide, aluminum gallium oxide, and gallium aluminum oxide. Here, aluminum gallium oxide refers to a material in which the aluminum content is higher than the gallium content in atomic percent, and gallium aluminum oxide refers to a material in which the gallium content is higher than or equal to the aluminum content in atomic percent.

For example, when a material containing gallium oxide is used for an insulating film that is in contact with an oxide semiconductor layer containing gallium, characteristics at the interface between the oxide semiconductor layer and the insulating film can be kept favorable. For example, the oxide semiconductor layer and an insulating film containing gallium oxide are provided in contact with each other, so that pile up of hydrogen at the interface between the oxide semiconductor layer and the insulating film can be reduced. Note that a similar effect can be obtained in the case where an element in the same group as a constituent element of the oxide semiconductor is used in an insulating film. For example, it is effective to form an insulating film with the use of a material containing aluminum oxide. Note that water is less likely to permeate aluminum oxide, and it is therefore preferable to use a material containing aluminum oxide in terms of preventing entry of water to the oxide semiconductor layer.

The insulating film in contact with the oxide semiconductor layer 716 preferably contains oxygen in a proportion higher than that in the stoichiometric composition by heat treatment in an oxygen atmosphere or by oxygen doping. "Oxygen doping" refers to addition of oxygen into a bulk. Note that the term "bulk" is used in order to clarify that oxygen is added not only to a surface of a thin film but also to the inside of the thin film. In addition, "oxygen doping" includes "oxygen plasma doping" in which oxygen which is made to be plasma is added to a bulk. The oxygen doping may be performed by ion implantation or ion doping.

For example, in the case where the insulating film in contact with the oxide semiconductor layer 716 is formed using gallium oxide, the composition of gallium oxide can be set to be $Ga_2O_x$ ($x=3+\alpha$, $0<\alpha<1$) by heat treatment in an oxygen atmosphere or by oxygen doping.

In the case where the insulating film in contact with the oxide semiconductor layer 716 is formed using aluminum oxide, the composition of aluminum oxide can be set to be $Al_2O_x$ ($x=3+\alpha$, $0<\alpha<1$) by heat treatment in an oxygen atmosphere or by oxygen doping.

In the case where the insulating film in contact with the oxide semiconductor layer 716 is formed using gallium aluminum oxide (aluminum gallium oxide), the composition of gallium aluminum oxide (aluminum gallium oxide) can be set to be $Ga_xAl_{2-x}O_{3+\alpha}$ ($0<x<2$, $0<\alpha<1$) by heat treatment in an oxygen atmosphere or by oxygen doping.

By oxygen doping, an insulating film that includes a region where the proportion of oxygen is higher than that in the stoichiometric composition can be formed. When the insulating film including such a region is in contact with the oxide semiconductor layer, excess oxygen in the insulating film is supplied to the oxide semiconductor layer, and oxygen defects in the oxide semiconductor layer or at the interface between the oxide semiconductor layer and the insulating film are reduced. Thus, the oxide semiconductor layer can be made to be an i-type or substantially i-type oxide semiconductor.

Note that the insulating film including a region where the proportion of oxygen is higher than that in the stoichiometric composition may be applied to either the insulating film placed above the oxide semiconductor layer 716 or the insulating film placed below the oxide semiconductor layer 716 of the insulating films in contact with the oxide semiconductor layer 716; however, it is preferable to apply such an insulating film to both of the insulating films in contact with the oxide semiconductor layer 716. The above-described effect can be enhanced with a structure where the insulating films including a region where the proportion of oxygen is higher than that in the stoichiometric composition are used as insulating films placed above and below the insulating films in contact with the oxide semiconductor layer 716, in order that the oxide semiconductor layer 716 is sandwiched between the insulating films.

The insulating films placed above and below the oxide semiconductor layer 716 may contain the same constituent elements or different constituent elements. For example, both of the insulating films placed above and below the oxide semiconductor layer 716 may be formed using gallium oxide whose composition is $Ga_2O_x$ ($x=3+\alpha$, $0<\alpha<1$). Alternatively, one of these insulating films may be formed using gallium oxide whose composition is $Ga_2O_x$ ($x=3+\alpha$, $0<\alpha<1$) and the other thereof may be formed using aluminum oxide whose composition is $Al_2O_x$ ($x=3+\alpha$, $0<\alpha<1$).

The insulating film in contact with the oxide semiconductor layer 716 may be a stack of insulating films each including a region where the proportion of oxygen is higher than that in the stoichiometric composition. For example, the insulating film placed above the oxide semiconductor layer 716 may be formed as follows: gallium oxide whose composition is $Ga_2O_x$ ($x=3+\alpha$, $0<\alpha<1$) is formed and gallium aluminum oxide (aluminum gallium oxide) whose composition is $Ga_xAl_{2-x}O_3$ ($0<x<2$, $0<\alpha<1$) is formed thereover. Note that it is possible that the insulating film placed below the oxide semiconductor layer 716, or both of the insulating films placed above and below the oxide semiconductor layer 716 may be a stack of insulating films each including a region where the proportion of oxygen is higher than that in the stoichiometric composition.

Figure 6C:
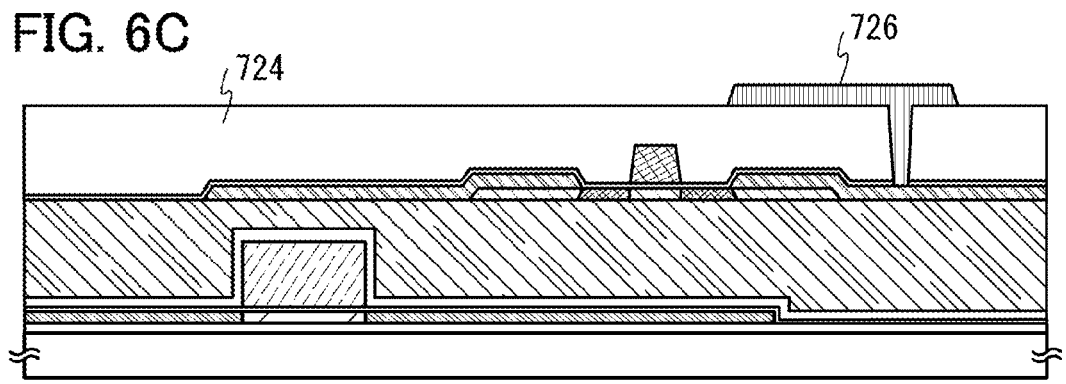

Next, as illustrated in FIG. 6C, an insulating film 724 is formed so as to cover the gate insulating film 721 and the gate electrode 722. The insulating film 724 can be formed by PVD, CVD, or the like. The insulating film 724 can be formed using a material including an inorganic insulating material such as silicon oxide, silicon oxynitride, silicon nitride, hafnium oxide, gallium oxide, or aluminum oxide. Note that for the insulating film 724, a material with a low dielectric constant or a structure with a low dielectric constant (e.g., a porous structure) is preferably used. When the dielectric constant of the insulating film 724 is lowered, parasitic capacitance generated between wirings or electrodes can be reduced, which results in higher speed operation. Note that although the insulating film 724 has a single-layer structure in this embodiment, one embodiment of the present invention is not limited to this structure. The insulating film 724 may have a layered structure of two or more layers.

Next, an opening is formed in the gate insulating film 721 and the insulating film 724, so that part of the conductive layer 720 is exposed. After that, a wiring 726 that is in contact with the conductive layer 720 through the opening is formed over the insulating film 724.

The wiring 726 is formed in such a manner that a conductive film is formed by PVD or CVD and then processed by etching. As the material of the conductive film, an element selected from aluminum, chromium, copper, tantalum, titanium, molybdenum, and tungsten; an alloy containing any of these elements as a component; or the like can be used. Alternatively, one or more materials selected from manganese, magnesium, zirconium, beryllium, neodymium, and scandium may be used.

Specifically, for example, it is possible to employ a method in which a thin titanium film (with a thickness of about 5 nm) is formed by PVD in a region including the opening of the insulating film 724 and then, an aluminum film is formed so as to be embedded in the opening. Here, the titanium film formed by PVD has a function of reducing an oxide film (e.g., a natural oxide film) formed on a surface where the titanium film is formed, to decrease contact resistance with a lower electrode (here, the conductive layer 720). In addition, hillock of the aluminum film can be prevented. A copper film may be formed by a plating method after the formation of the barrier film of titanium, titanium nitride, or the like.

Figure 6D:
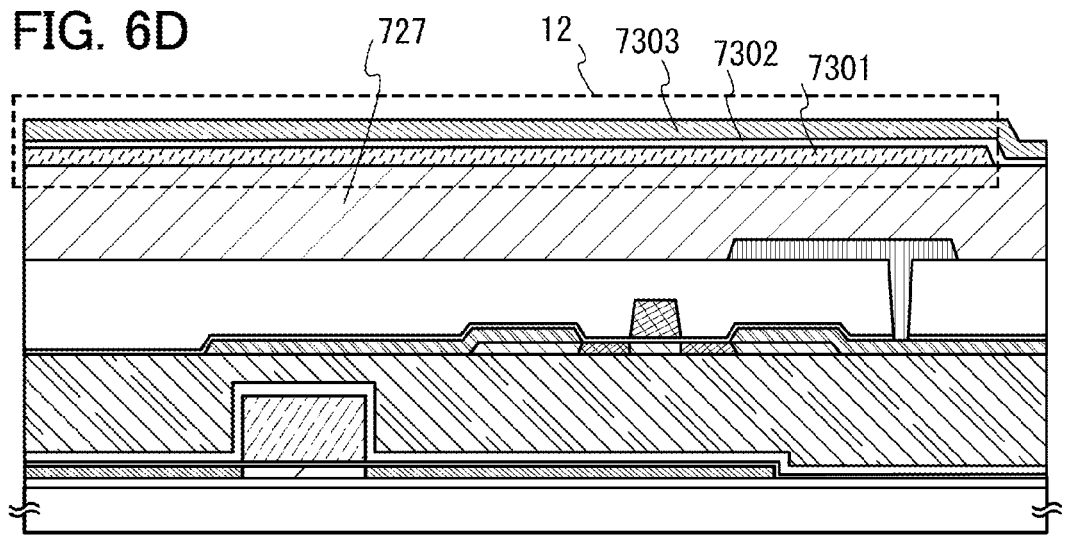

Next, as illustrated in FIG. 6D, an insulating film 727 is formed so as to cover the wiring 726. Then, a conductive film is formed over the insulating film 727 and processed by etching, thereby forming a conductive layer 7301. After that, an insulating film 7302 is formed so as to cover the conductive layer 7301, and a conductive film 7303 is formed over the insulating film 7302. Thus, the capacitor 12 can be formed. One of a pair of electrodes of the capacitor 12 corresponds to the conductive layer 7301; the other of the pair of electrodes, the conductive film 7303; and a dielectric layer, the insulating film 7302. Here, materials of the insulating film 727, the conductive layer 7301, the insulating film 7302, and the conductive film 7303 can be similar to those of other insulating films and conductive layers.

Through the series of steps, the signal processing circuit can be manufactured.

Through the above process, the transistor 11 and the capacitor 12 included in the nonvolatile storage circuit 10 in the signal processing circuit can be positioned to overlap the transistor 133 included in the volatile storage circuit 200. In this manner, the size of the signal processing circuit can be reduced. Moreover, electrical connection between the nonvolatile storage circuit 10 and the volatile storage circuit 200 can be easily established.

This embodiment can be implemented in combination with any of the other embodiments as appropriate.

Embodiment 4

In this embodiment, the transistor 11 that includes an oxide semiconductor layer and has a structure different from that in Embodiment 3 will be described. Note that the same portions as those in FIGS. 6A to 6D are denoted by the same reference numerals and the description thereof is not repeated.

Figure 7A:
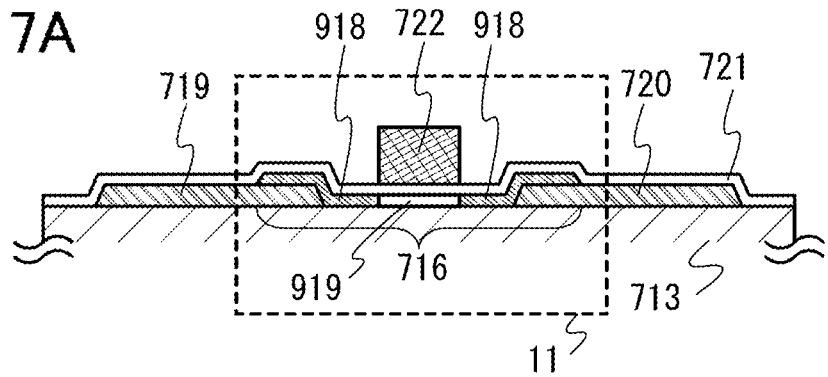
FIGS. 7A to 7C are cross-sectional views each illustrating a structure of a transistor whose channel is formed in an oxide semiconductor layer.

The transistor 11 illustrated in FIG. 7A has a top-gate structure where the gate electrode 722 is formed over the oxide semiconductor layer 716, and has a bottom-contact structure where the source and drain electrodes (the conductive layers 719 and 720) are formed below the oxide semiconductor layer 716.

The oxide semiconductor layer 716 includes a pair of heavily doped regions 918 that are obtained by addition of a dopant imparting n-type conductivity to the oxide semiconductor layer 716 after the formation of the gate electrode 722. Further, the oxide semiconductor layer 716 includes a channel formation region 919 that overlaps with the gate electrode 722 with the gate insulating film 721 placed therebetween. In the oxide semiconductor layer 716, the channel formation region 919 is provided between the pair of heavily doped regions 918.

The heavily doped regions 918 can be formed in a manner similar to that of the heavily doped regions 908 described in Embodiment 3.

Figure 7B:
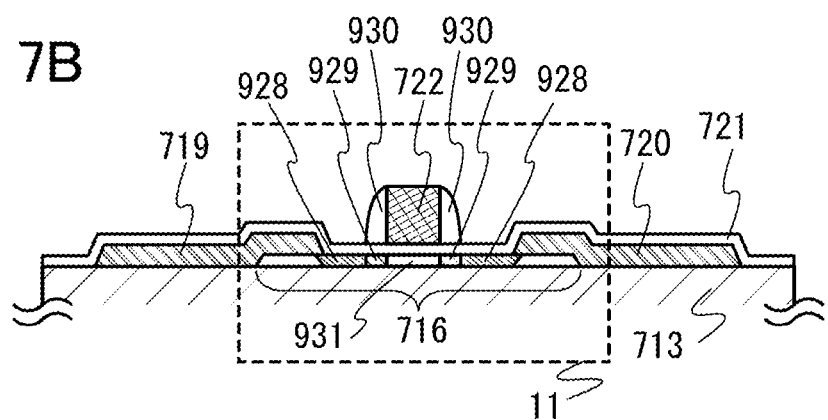

The transistor 11 illustrated in FIG. 7B has a top-gate structure where the gate electrode 722 is formed over the oxide semiconductor layer 716, and has a top-contact structure where the source and drain electrodes (the conductive layers 719 and 720) are formed over the oxide semiconductor layer 716. The transistor 11 also includes sidewalls 930 that are provided at ends of the gate electrode 722 and formed using an insulating film.

The oxide semiconductor layer 716 includes a pair of heavily doped regions 928 and a pair of lightly doped regions 929 that are obtained by addition of dopant imparting n-type conductivity to the oxide semiconductor layer 716 after the formation of the gate electrode 722. Further, the oxide semiconductor layer 716 includes a channel formation region 931 that overlaps with the gate electrode 722 with the gate insulating film 721 placed therebetween. In the oxide semiconductor layer 716, the pair of lightly doped regions 929 is provided between the pair of heavily doped regions 928, and the channel formation region 931 is provided between the pair of lightly doped regions 929. Further, the pair of lightly doped regions 929 is provided in a region of the oxide semiconductor layer 716 that overlaps with the sidewalls 930 with the gate insulating film 721 placed therebetween.

The heavily doped regions 928 and the lightly doped regions 929 can be formed in a manner similar to that of the heavily doped regions 908 described in Embodiment 3.

Figure 7C:
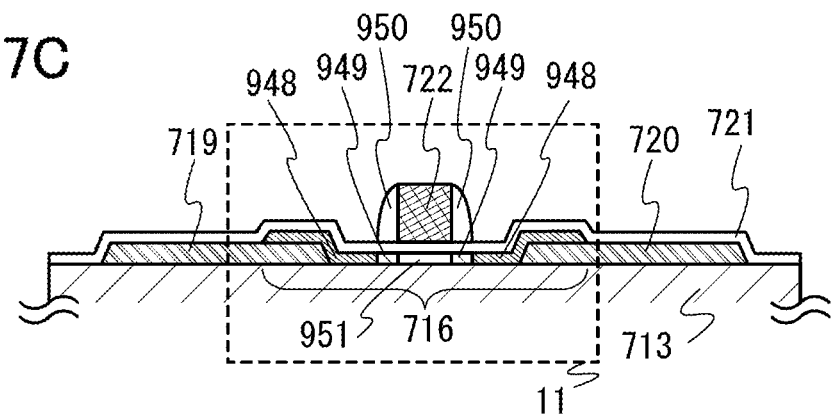

The transistor 11 illustrated in FIG. 7C has a top-gate structure where the gate electrode 722 is formed over the oxide semiconductor layer 716, and has a bottom-contact structure where the source and drain electrodes (the conductive layers 719 and 720) are formed below the oxide semiconductor layer 716. The transistor 11 also includes sidewalls 950 that are provided at ends of the gate electrode 722 and formed using an insulating film.

The oxide semiconductor layer 716 includes a pair of heavily doped regions 948 and a pair of lightly doped regions 949 that are obtained by addition of dopant imparting n-type conductivity to the oxide semiconductor layer 716 after the formation of the gate electrode 722. Further, the oxide semiconductor layer 716 includes a channel formation region 951 that overlaps with the gate electrode 722 with the gate insulating film 721 placed therebetween. In the oxide semiconductor layer 716, the pair of lightly doped regions 949 is provided between the pair of heavily doped regions 948, and the channel formation region 951 is provided between the pair of lightly doped regions 949. Further, the pair of lightly doped regions 949 is provided in a region of the oxide semiconductor layer 716 that overlaps with the sidewalls 950 with the gate insulating film 721 placed therebetween.

The heavily doped regions 948 and the lightly doped regions 949 can be formed in a manner similar to that of the heavily doped regions 908 described in Embodiment 3.

Note that as one of methods for forming heavily doped regions functioning as a source region and a drain region in a transistor including an oxide semiconductor through a self-aligned process, there is disclosed a method by which a surface of an oxide semiconductor layer is exposed, argon plasma treatment is performed, and the resistance of a region exposed to plasma in the oxide semiconductor layer is lowered (S. Jeon et al., "180 nm Gate Length Amorphous InGaZnO Thin Film Transistor for High Density Image Sensor Applications", IEDM Tech. Dig., pp. 504-507, 2010).

However, in the above manufacturing method, after a gate insulating film is formed, the gate insulating film needs to be partly removed so that portions which are to serve as the source and drain regions are exposed. Consequently, at the time of removing the gate insulating film, the oxide semiconductor layer which is below the gate insulating film is partially over-etched; thus, the thickness of the portions which are to be the source and drain regions becomes small. As a result, the resistance of the source and drain regions is increased, and defects in characteristics of the transistor due to over-etching tends to be caused.

For further miniaturization of a transistor, it is necessary to employ a dry etching method with high process accuracy. However, the over-etching is likely to occur remarkably with a dry etching method when the selectivity of a gate insulating film to an oxide semiconductor layer is not sufficiently high.

For example, the problem of over-etching does not arise when the oxide semiconductor layer has a sufficiently large thickness. However, when the channel length is 200 nm or less, the thickness of the portion to be a channel formation region in the oxide semiconductor layer needs to be 20 nm or less, preferably 10 nm or less so as to prevent a short-channel effect. When the thickness of the oxide semiconductor layer is small as in the above case, over-etching of the oxide semiconductor layer is unfavorable because the resistance of the source and drain regions is increased and defective characteristics of the transistor occur as described above.

In contrast, when dopant is added to an oxide semiconductor layer while a gate insulating film is left so as not to expose the oxide semiconductor layer as in one embodiment of the present invention, the over-etching of the oxide semiconductor layer can be prevented and excessive damage to the oxide semiconductor layer can be reduced. In addition, the interface between the oxide semiconductor layer and the gate insulating film is kept clean. Accordingly, the characteristics and reliability of the transistor can be improved.

This embodiment can be implemented in combination with any of the other embodiments as appropriate.

Embodiment 5

In this embodiment, a transistor that includes an oxide semiconductor layer and has a structure different from those in Embodiments 3 and 4 will be described. Note that the same portions as those in FIGS. 6A to 6D are denoted by the same reference numerals, and the description thereof is not repeated. In the transistor 11 shown in this embodiment, the gate electrode 722 is provided so as to overlap the conductive layers 719 and 720. Further, the transistor 11 in this embodiment differs from the transistor 11 in Embodiments 3 and 4 in that the oxide semiconductor layer 716 is not subjected to addition of an impurity element imparting conductivity with the use of the gate electrode 722 as a mask.

Figure 8A:
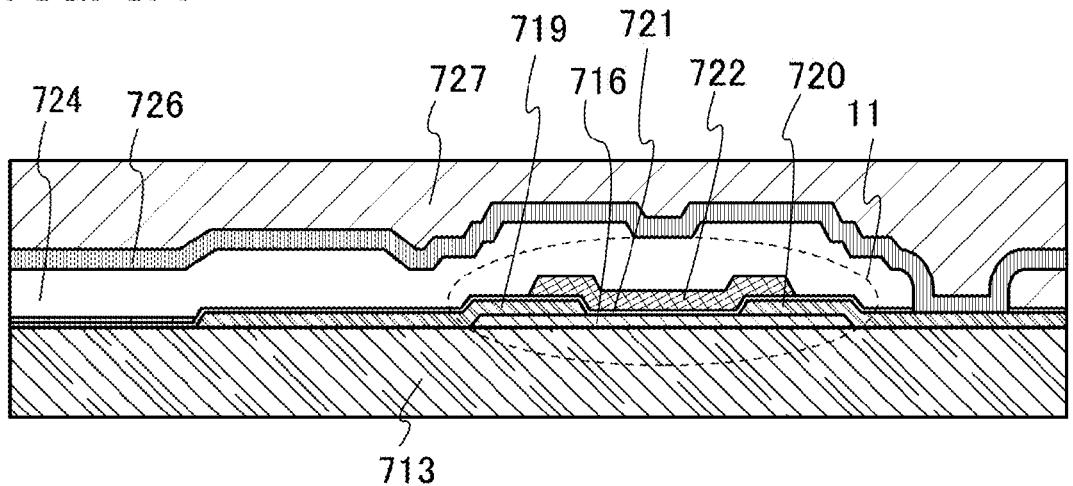
FIGS. 8A and 8B are cross-sectional views each illustrating a structure of a transistor whose channel is formed in an oxide semiconductor layer.
Figure 8B:
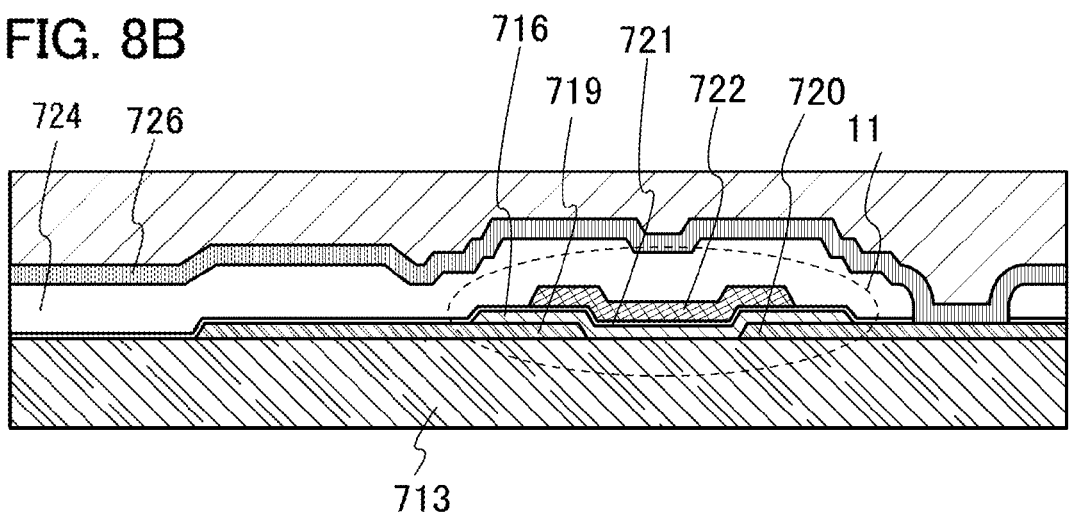

FIG. 8A illustrates an example of the transistor 11 in which the oxide semiconductor layer 716 is provided below the conductive layers 719 and 720. FIG. 8B illustrates an example of the transistor 11 in which the oxide semiconductor layer 716 is provided above the conductive layers 719 and 720. Note that FIGS. 8A and 8B each illustrate the structure where a top surface of the insulating film 724 is not planarized; however, this embodiment is not limited to this structure, and a top surface of the insulating film 724 may be planarized.

This embodiment can be implemented in combination with any of the other embodiments as appropriate.

Embodiment 6

An oxide semiconductor preferably contains at least indium (In) or zinc (Zn). In particular, an oxide semiconductor preferably contains In and Zn.

As a stabilizer for reducing variation in electric characteristics of a transistor including the oxide semiconductor containing In and Zn, it is preferable that one or more elements selected from gallium (Ga), tin (Sn), hafnium (Hf), aluminum (Al), and lanthanoid be contained.

As lanthanoid, there are lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu).

Note that there is no limitation on the ratio of In to Zn in an oxide semiconductor containing In and Zn. Moreover, the oxide semiconductor may contain another metal element in addition to In and Zn.

For example, it is possible to use an In—Ga—Zn—O-based oxide with an atomic ratio of In:Ga:Zn=1:1:1 ($1/3$:$1/3$:$1/3$) or In:Ga:Zn=2:2:1 (=$2/5$:$2/5$:$1/5$), or any of oxides whose composition is in the neighborhood of the above compositions.

Alternatively, it is possible to use an In—Sn—Zn—O-based oxide with an atomic ratio of In:Sn:Zn=1:1:1 (=$1/3$:$1/3$:$1/3$), In:Sn:Zn=2:1:3 (=$1/3$:$1/6$ $1/2$), or In:Sn:Zn=2:1:5 (=$1/4$:$1/8$:$5/8$), or any of oxides whose composition is in the neighborhood of the above compositions.

Without limitation to the materials given above, a material with an appropriate composition may be used depending on needed semiconductor characteristics (e.g., mobility, threshold voltage, and variation). In order to obtain the needed semiconductor characteristics, an oxide semiconductor preferably has appropriate carrier density, impurity concentration, defect density, atomic ratio between a metal element and oxygen, interatomic distance, density, and the like.

The oxide semiconductor may be either single crystal or non-single-crystal.

In the case where the oxide semiconductor is non-single-crystal, the oxide semiconductor may be either amorphous or polycrystalline. Further, the oxide semiconductor may have a structure including a crystalline portion in an amorphous portion. Note that a non-amorphous structure is preferred since an amorphous structure has many defects.

The contents of this embodiment or part thereof can be implemented in combination with any of the other embodiments and examples.

Embodiment 7

Examples of a crystal structure of the CAAC-OS will be described with reference to FIGS. 11A to 11E, FIGS. 12A to 12C, and FIGS. 13A to 13C.

In FIGS. 11A to 11E, FIGS. 12A to 12C, and FIGS. 13A to 13C, the vertical direction corresponds to the c-axis direction and a plane perpendicular to the c-axis direction corresponds to the a-b plane.

In this embodiment, an "upper half" and a "lower half" refer to an upper half above the a-b plane and a lower half below the a-b plane (an upper half and a lower half with respect to the a-b plane).

Figure 11A:
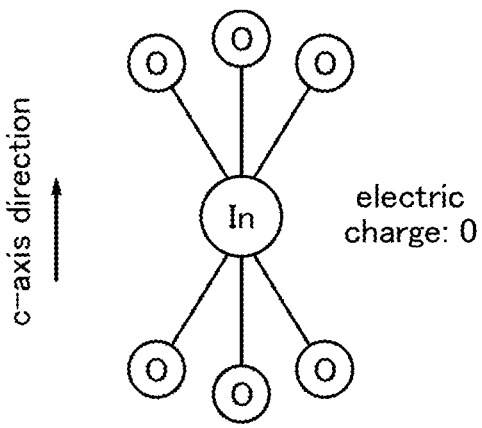
FIGS. 11A to 11E are examples of oxide semiconductors.

FIG. 11A illustrates a structure A including one hexacoordinate In atom and six tetracoordinate oxygen (hereinafter referred to as tetracoordinate O) atoms proximate to the In atom.

In this specification, a structure showing only oxygen atoms proximate to one metal atom is referred to as a small group.

The structure A is actually an octahedral structure, but is illustrated as a planar structure for simplicity.

Three tetracoordinate O atoms exist in each of the upper half and the lower half in the structure A. The electric charge of the small group in the structure A is 0.

Figure 11D:
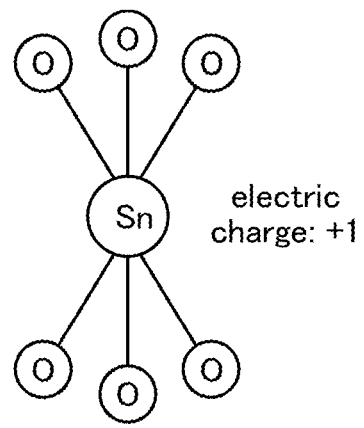
Figure 11B:
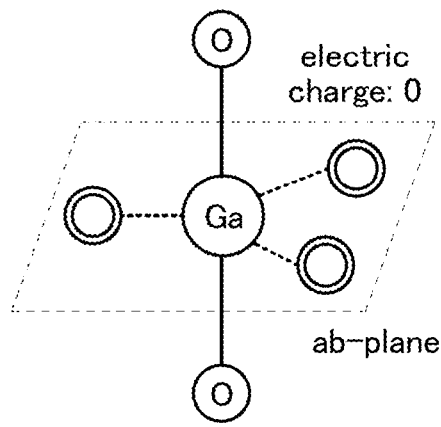

FIG. 11B illustrates a structure B including one pentacoordinate Ga atom, three tricoordinate oxygen (hereinafter referred to as tricoordinate O) atoms proximate to the Ga atom, and two tetracoordinate O atoms proximate to the Ga atom.

All the three tricoordinate O atoms exist on the a-b plane. One tetracoordinate O atom exists in each of the upper half and the lower half in the structure B.

An In atom can also have the structure B because the In atom can have five ligands. The electric charge of the small group in the structure B is 0.

Figure 11E:
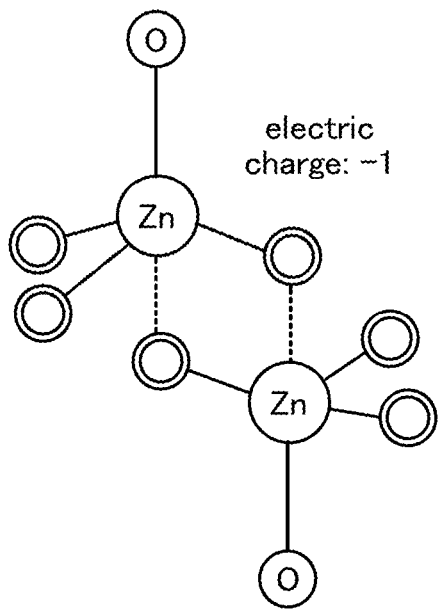
Figure 11C:
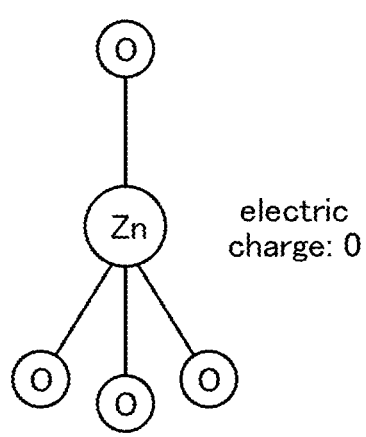

FIG. 11C illustrates a structure C including one tetracoordinate Zn atom and four tetracoordinate O atoms proximate to the Zn atom.

In the structure C, one tetracoordinate O atom exists in the upper half and three tetracoordinate O atoms exist in the lower half. The electric charge of the small group in the structure C is 0.

FIG. 11D illustrates a structure D including one hexacoordinate Sn atom and six tetracoordinate O atoms proximate to the Sn atom.

In the structure D, three tetracoordinate O atoms exist in each of the upper half and the lower half.

The electric charge of the small group in the structure D is +1.

FIG. 11E illustrates a structure E including two Zn atoms.

In the structure E, one tetracoordinate O atom exists in each of the upper half and the lower half. The electric charge of the small group in the structure E is −1.

In this embodiment, a plurality of small groups form a medium group, and a plurality of medium groups form a large group (also referred to as a unit cell).

A rule of bonding between the small groups is described below.

The three O atoms in the upper half with respect to the In atom each have three proximate In atoms in the downward direction, and the three O atoms in the lower half each have three proximate In atoms in the upward direction.

The one O atom in the upper half with respect to the Ga atom has one proximate Ga atom in the downward direction, and the one O atom in the lower half has one proximate Ga atom in the upward direction.

The one O atom in the upper half with respect to the Zn atom has one proximate Zn atom in the downward direction, and the three O atoms in the lower half each have three proximate Zn atoms in the upward direction.

In this manner, the number of tetracoordinate O atoms above a metal atom is equal to the number of metal atoms proximate to and below the tetracoordinate O atoms; similarly, the number of tetracoordinate O atoms below a metal atom is equal to the number of metal atoms proximate to and above the tetracoordinate O atoms.

Since the coordination number of the tetracoordinate O atom is 4, the sum of the number of metal atoms proximate to and below the O atom and the number of metal atoms proximate to and above the O atom is 4.

Accordingly, when the sum of the number of tetracoordinate O atoms above a metal atom and the number of tetracoordinate O atoms below another metal atom is 4, the two kinds of small groups including the metal atoms can be bonded to each other.

The reason therefor is described below. For example, in the case where the hexacoordinate metal (In or Sn) atom is bonded through three tetracoordinate O atoms in the upper half, it is bonded to the pentacoordinate metal (Ga or In) atom or the tetracoordinate metal (Zn) atom.

A metal atom whose coordination number is 4, 5, or 6 is bonded to another metal atom through a tetracoordinate O atom in the c-axis direction.

In addition, a medium group can also be formed in a different manner by combining a plurality of small groups so that the total electric charge of the layered structure is 0.

FIG. 12A illustrates a model of a medium group A included in a layered structure of an In—Sn—Zn—O-based material.

FIG. 12B illustrates a large group B including three medium groups.

FIG. 12C illustrates an atomic arrangement where the layered structure shown in FIG. 12B is observed from the c-axis direction.

In the medium group A, a tricoordinate O atom is omitted for simplicity, and only the number of tetracoordinate O atoms is shown in a circle.

For example, three tetracoordinate O atoms existing in each of the upper half and the lower half with respect to a Sn atom are denoted by circled 3.

Similarly, in the medium group A, one tetracoordinate O atom existing in each of the upper half and the lower half with respect to an In atom is denoted by circled 1.

In addition, in the medium group A, a Zn atom proximate to one tetracoordinate O atom in the lower half and three tetracoordinate O atoms in the upper half, and a Zn atom proximate to one tetracoordinate O atom in the upper half and three tetracoordinate O atoms in the lower half are shown.

In the medium group A included in the layered structure of the In—Sn—Zn—O-based material, in the order starting from the top, a Sn atom proximate to three tetracoordinate O atoms in each of the upper half and the lower half is bonded to an In atom proximate to one tetracoordinate O atom in each of the upper half and the lower half.

The In atom is bonded to a Zn atom proximate to three tetracoordinate O atoms in the upper half.

The Zn atom is bonded to an In atom proximate to three tetracoordinate O atoms in each of the upper half and the lower half through one tetracoordinate O atom in the lower half with respect to the Zn atom.

The In atom is bonded to a small group that includes two Zn atoms and is proximate to one tetracoordinate O atom in the upper half.

The small group is bonded to a Sn atom proximate to three tetracoordinate O atoms in each of the upper half and the lower half through one tetracoordinate O atom in the lower half with respect to the small group.

A plurality of such medium groups are bonded to form a large group.

Here, electric charge for one bond of a tricoordinate O atom and electric charge for one bond of a tetracoordinate O atom can be assumed to be −0.667 and −0.5, respectively.

For example, electric charge of a (hexacoordinate or pentacoordinate) In atom, electric charge of a (tetracoordinate) Zn atom, and electric charge of a (pentacoordinate or hexacoordinate) Sn atom are +3, +2, and +4, respectively. Accordingly, electric charge in a small group including a Sn atom is +1.

Therefore, electric charge of −1, by which the electric charge of +1 is canceled, is needed to form a layered structure including a Sn atom.

As a structure having electric charge of −1, the small group including two Zn atoms as in the structure E can be given.

For example, with one small group including two Zn atoms, electric charge of one small group including a Sn atom can be cancelled, so that the total electric charge of the layered structure can result in 0.

Specifically, by repeating the large group B, an In—Sn—Zn—O-based crystal ($In_2SnZn_3O_8$) can be obtained.

The layered structure of the In—Sn—Zn—O-based crystal can be expressed by a composition formula, $In_2SnZn_2O_7(ZnO)_m$ (m is 0 or a natural number).

The variable m is preferably large because the larger the variable m, the higher the crystallinity of the In—Sn—Zn—O-based crystal.

The same applies to the case where an oxide semiconductor other than the In—Sn—Zn—O-based material is used.

Figures 13A, 13B, 13C:
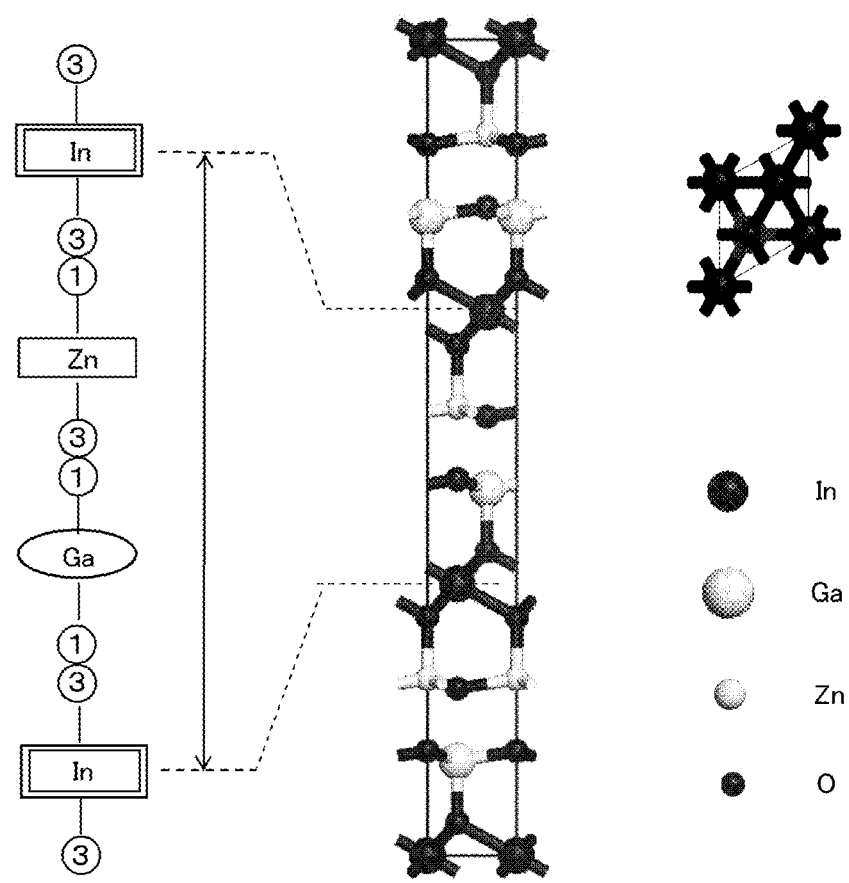
FIGS. 13A to 13C are examples of oxide semiconductors.

For example, FIG. 13A illustrates a model of a medium group L included in a layered structure of an In—Ga—Zn—O-based material.

In the medium group L included in the layered structure of the In—Ga—Zn—O-based material, in the order starting from the top, an In atom proximate to three tetracoordinate O atoms in each of the upper half and the lower half is bonded to a Zn atom proximate to one tetracoordinate O atom in the upper half.

The Zn atom is bonded to a Ga atom proximate to one tetracoordinate O atom in each of the upper half and the lower half through three tetracoordinate O atoms in the lower half with respect to the Zn atom.

The Ga atom is bonded to an In atom proximate to three tetracoordinate O atoms in each of the upper half and the lower half through one tetracoordinate O atom in the lower half with respect to the Ga atom.

A plurality of such medium groups are bonded to form a large group.

FIG. 13B illustrates a large group M including three medium groups.

FIG. 13C illustrates an atomic arrangement where the layered structure shown in FIG. 13B is observed from the c-axis direction.

Here, since electric charge of a (hexacoordinate or pentacoordinate) In atom, electric charge of a (tetracoordinate) Zn atom, and electric charge of a (pentacoordinate) Ga atom are +3, +2, and +3, respectively, electric charge of a small group including any of the In atom, the Zn atom, and the Ga atom is 0.

As a result, the total electric charge of a medium group having a combination of these small groups always results in 0.

In order to form the layered structure of the In—Ga—Zn—O-based material, a large group can be formed using not only the medium group L but also a medium group in which the arrangement of the In atom, the Ga atom, and the Zn atom is different from that of the medium group L.

The contents of this embodiment or part thereof can be implemented in combination with any of the other embodiments and examples.

Embodiment 8

The actually measured field-effect mobility of an insulated gate transistor is lower than its inherent mobility because of a variety of reasons, which occurs not only in the case of using an oxide semiconductor.

One of causes for reduction in the mobility is a defect inside a semiconductor or a defect at an interface between the semiconductor and an insulating film. With a Levinson model, the field-effect mobility based on the assumption that no defect exists inside the semiconductor can be calculated theoretically.

Assuming a potential barrier (such as a grain boundary) exists in a semiconductor, the measured field-effect mobility of the semiconductor, denoted by $\mu$, can be expressed by Formula A where the inherent mobility of the semiconductor is $\mu_0$.

$$\mu = \mu_0 \exp\left(-\frac{E}{kT}\right) \quad \text{[Formula A]}$$

In Formula A, E denotes the height of the potential barrier, k denotes the Boltzmann constant, and T denotes the absolute temperature.

Further, on the assumption that the potential barrier is attributed to a defect, the height of the potential barrier can be expressed by Formula B according to the Levinson model.

$$E = \frac{e^2 N^2}{8\varepsilon n} = \frac{e^3 N^2 t}{8\varepsilon C_{ox} V_g} \quad \text{[Formula B]}$$

In Formula B, e denotes the elementary charge, N denotes the average defect density per unit area in a channel, $\varepsilon$ denotes the permittivity of the semiconductor, n denotes the number of carriers per unit area in the channel, $C_{ox}$ denotes the capacitance per unit area, $V_g$ denotes the gate voltage, and t denotes the thickness of the channel.

In the case where the thickness of the semiconductor layer is less than or equal to 30 nm, the thickness of the channel can be regarded as being the same as the thickness of the semiconductor layer.

The drain current $I_d$ in a linear region is expressed by Formula C.

$$I_d = \frac{W \mu V_g V_d C_{ox}}{L} \exp\left(-\frac{E}{kT}\right) \quad \text{[Formula C]}$$

In Formula C, L denotes the channel length and W denotes the channel width, and L and W are each 10 μm in this example.

In addition, $V_d$ denotes the drain voltage.

Both sides of Formula C are divided by $V_g$ and then logarithms of both the sides are taken, resulting in Formula D.

$$\ln\left(\frac{I_d}{V_g}\right) = \ln\left(\frac{W \mu V_d C_{ox}}{L}\right) - \frac{E}{kT} = \ln\left(\frac{W \mu V_d C_{ox}}{L}\right) - \frac{e^3 N^2 t}{8 k T \varepsilon C_{ox} V_g} \quad \text{[Formula D]}$$

The right side of Formula D is a function of $V_g$.

From Formula D, it is found that the defect density N can be obtained from a line in a graph that is obtained by plotting actual measured values with $\ln(I_d/V_g)$ as the ordinate and $1/V_g$ as the abscissa.

That is, the defect density can be evaluated from the $I_d$-$V_g$ characteristics of the transistor.

The defect density N of an oxide semiconductor in which the ratio of indium (In), tin (Sn), and zinc (Zn) is 1:1:1 is about $1 \times 10^{12}/\text{cm}^2$.

On the basis of the defect density obtained in this manner, or the like, $\mu_0$ can be calculated to be 120 cm$^2$/Vs.

The measured mobility of an In—Sn—Zn oxide including a defect is about 35 cm$^2$/Vs.

However, assuming that no defect exists inside an oxide semiconductor and at the interface between the oxide semiconductor and an insulating film, the mobility $\mu_0$ of the oxide semiconductor is estimated to be 120 cm$^2$/Vs.

Note that even when no defect exists inside the semiconductor, scattering at an interface between a channel and a gate insulating film affects the transport property of the transistor. In other words, the mobility $\mu_1$ at a position that is a distance x away from the interface between the channel and the gate insulating film is expressed by Formula E.

$$\frac{1}{\mu_1} = \frac{1}{\mu_0} + \frac{D}{B} \exp\left(-\frac{x}{G}\right) \quad \text{[Formula E]}$$

In Formula E, D denotes the electric field in the gate direction, and B and G are constants. The values of B and G can be obtained from actual measurement results; according to the above measurement results, B is 4.75×10$^7$ cm/s and G is 10 nm (the depth to which the influence of interface scattering reaches).

As D increases (i.e., as the gate voltage increases), the second term of Formula E is increased and accordingly the mobility $\mu_1$ is decreased.

Figure 15:
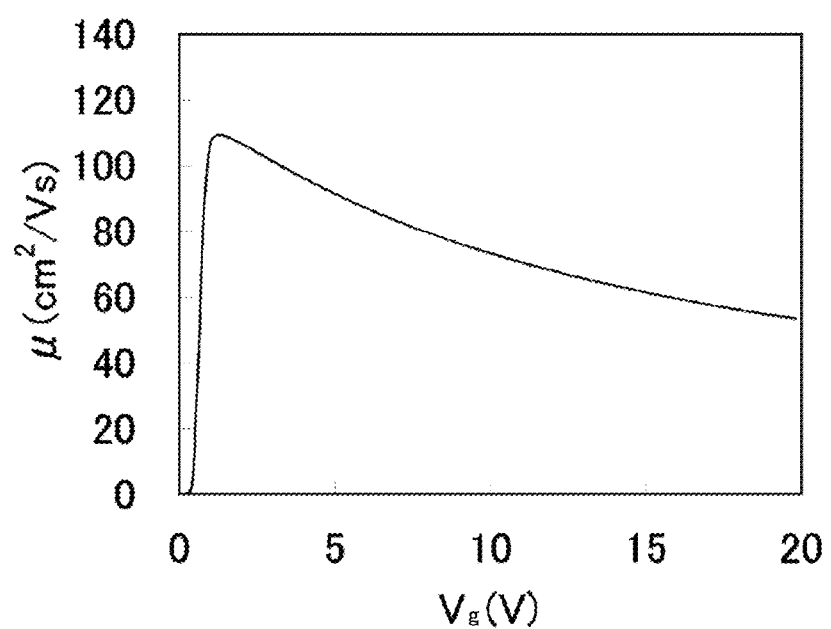
FIG. 15 illustrates a relation between gate voltage and field-effect mobility.

FIG. 15 shows calculation results E of the mobility $\mu_2$ of a transistor whose channel is formed in an ideal oxide semiconductor without a defect inside the semiconductor.

For the calculation, Sentaurus Device, the software manufactured by Synopsys, Inc., was used.

For the calculation, the band gap, the electron affinity, the relative permittivity, and the thickness of the oxide semiconductor were set to 2.8 eV, 4.7 eV, 15, and 15 nm, respectively.

Those values were obtained according to measurement of a thin film of an oxide semiconductor that was formed by sputtering.

Further, the work functions of a gate, a source, and a drain of the transistor were set to 5.5 eV, 4.6 eV, and 4.6 eV, respectively.

The thickness of a gate insulating film was set to 100 nm, and the relative permittivity thereof was set to 4.1. The channel length and the channel width were each 10 μm, and the drain voltage $V_d$ was set to 0.1 V.

As shown in the calculation results E, the mobility has a peak of more than 100 cm$^2$/Vs at a gate voltage that is a little over 1 V, and decreases as the gate voltage becomes higher because the influence of interface scattering is increased.

In order to reduce interface scattering, it is preferable that a surface of the semiconductor layer be flat at the atomic level (atomic layer flatness).

Characteristics of a minute transistor which was manufactured using an oxide semiconductor having such mobility were calculated.

The transistor used for calculation includes an oxide semiconductor layer in which a channel formation region is provided between a pair of n-type semiconductor regions.

For the calculation, the resistivity of the pair of n-type semiconductor regions was set to $2 \times 10^{-3}$ Ω·cm.

The channel length was set to 33 nm and the channel width was set to 40 nm for the calculation.

Further, a sidewall is provided on a side face of the gate electrode.

The calculation was performed under the condition that part of the semiconductor region which overlaps with the sidewall is an offset region.

For the calculation, Sentaurus Device, the software manufactured by Synopsys, Inc., was used.

Figure 16A:
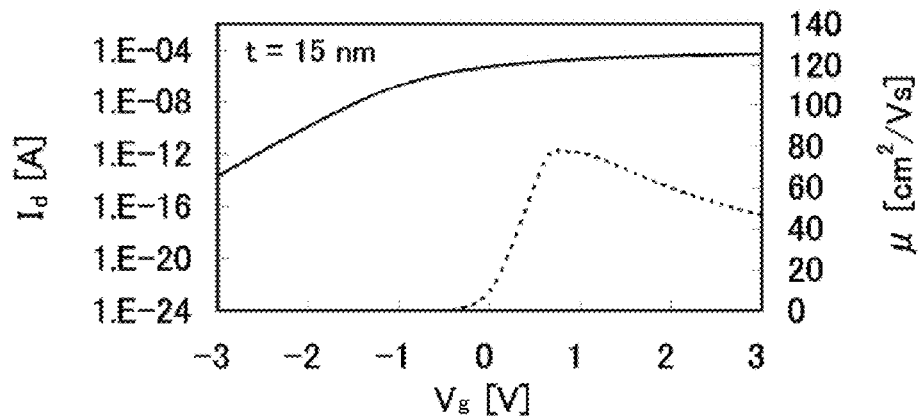
FIGS. 16A to 16C each illustrate a relation between gate voltage and drain current.
Figure 16B:
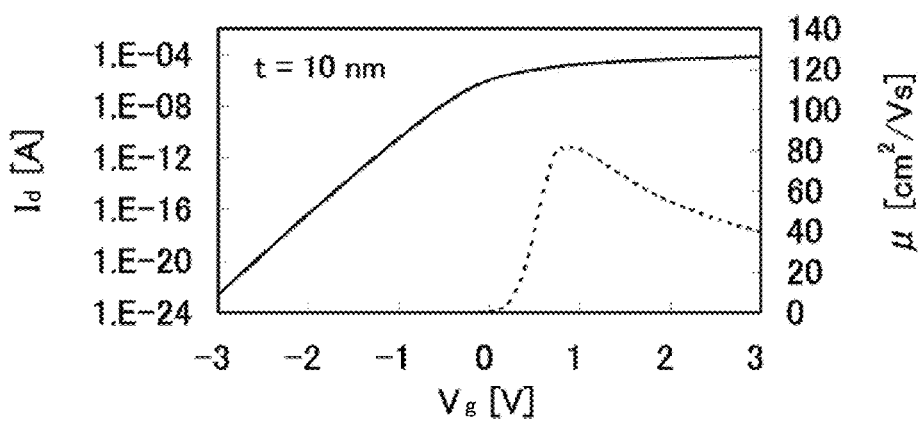
Figure 16C:
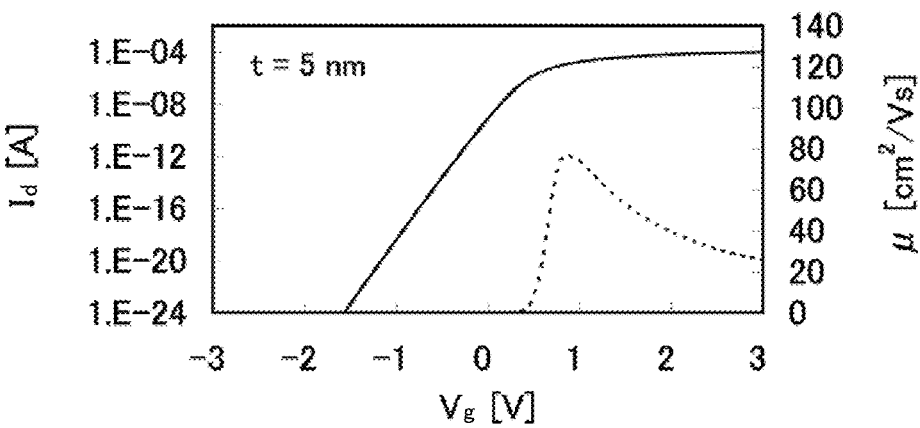

FIGS. 16A to 16C show the gate voltage ($V_g$: a potential difference between the gate and the source) dependence of the drain current ($I_d$, indicated by a solid line) and the mobility (μ, indicted by a dotted line) of the transistor.

The drain current $I_d$ was calculated under the assumption that the drain voltage (a potential difference between the drain and the source) was +1 V, and the mobility μ was calculated under the assumption that the drain voltage was +0.1 V.

FIG. 16A shows the calculation result where the thickness of the gate insulating film was 15 nm.

FIG. 16B shows the calculation result where the thickness of the gate insulating film was 10 nm.

FIG. 16C shows the calculation result where the thickness of the gate insulating film was 5 nm.

As the gate insulating film is thinner, the drain current $I_d$ in the off state (off-state current) in particular is significantly decreased.

In contrast, there is no remarkable change in the peak value of the mobility μ and the drain current $I_d$ in the on state (on-state current).

Figure 17A:
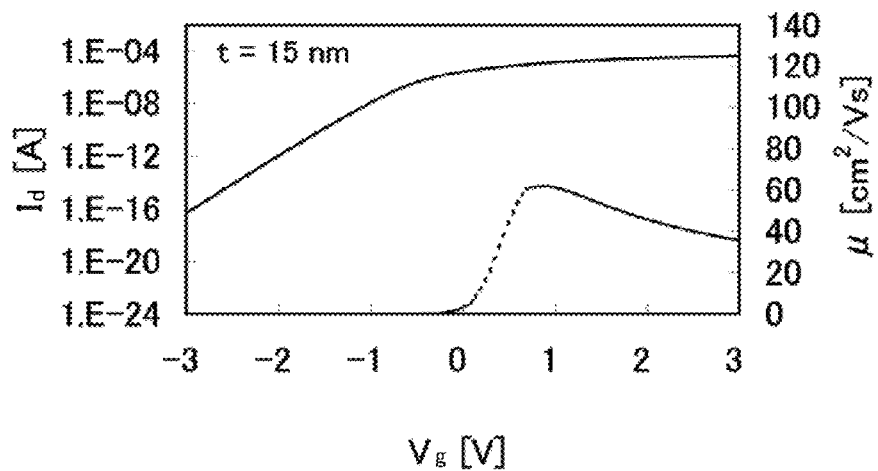
FIGS. 17A to 17C each illustrate a relation between gate voltage and drain current.
Figure 17B:
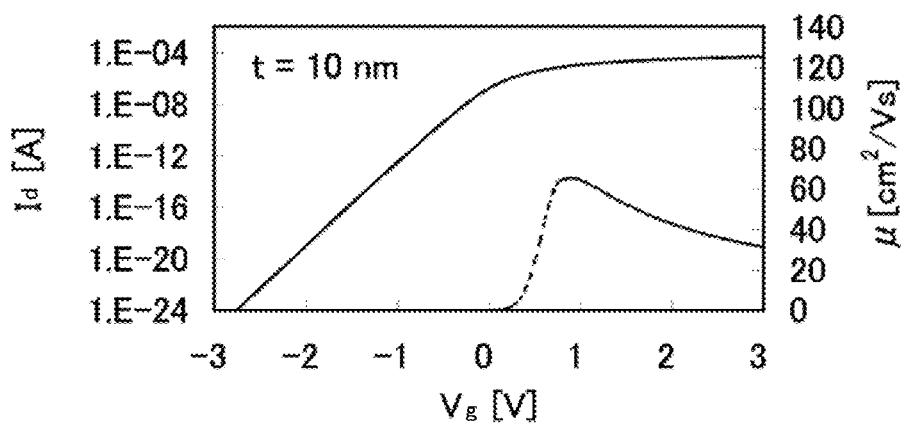
Figure 17C:
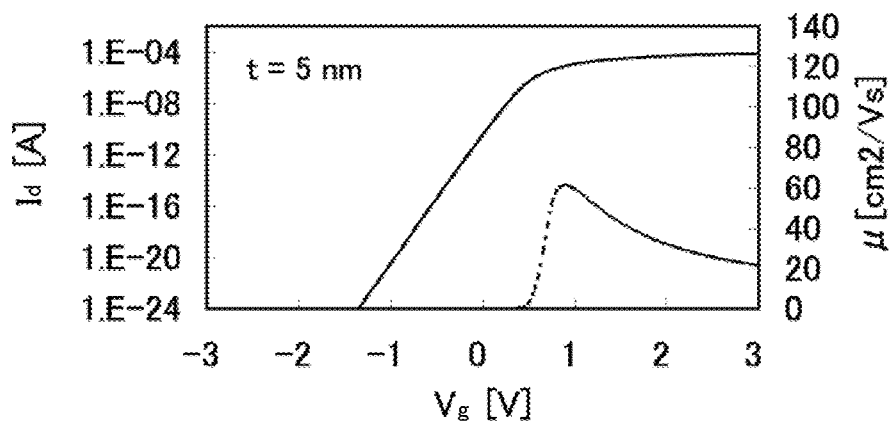

FIGS. 17A to 17C show the gate voltage $V_g$ dependence of the drain current $I_d$ (indicated by a solid line) and the mobility μ (indicated by a dotted line) of the transistor where the offset length (sidewall length) $L_{off}$ was 5 nm.

The drain current $I_d$ was calculated on the assumption the drain voltage was +1 V, and the mobility μ was calculated on the assumption the drain voltage was +0.1 V.

FIG. 17A shows the calculation result where the thickness of the gate insulating film was 15 nm.

FIG. 17B shows the calculation result where the thickness of the gate insulating film was 10 nm.

FIG. 17C shows the calculation result where the thickness of the gate insulating film was 5 nm.

Figure 18A:
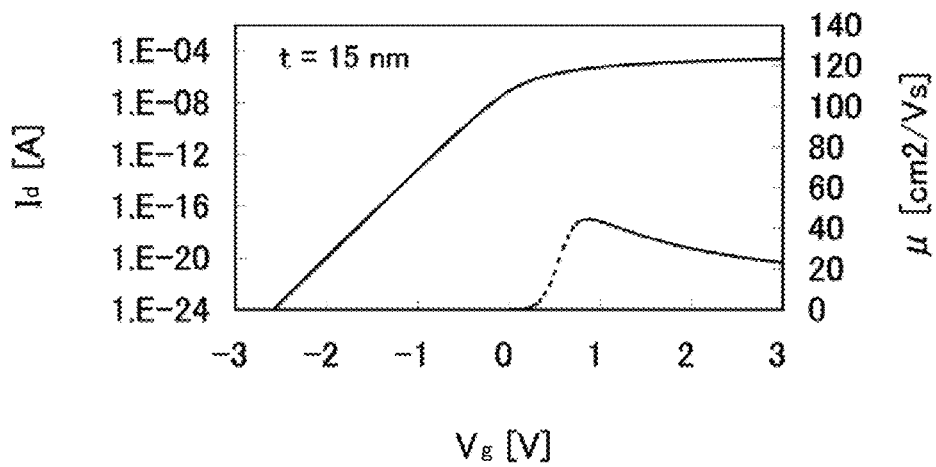
FIGS. 18A to 18C each illustrate a relation between gate voltage and drain current.
Figure 18B:
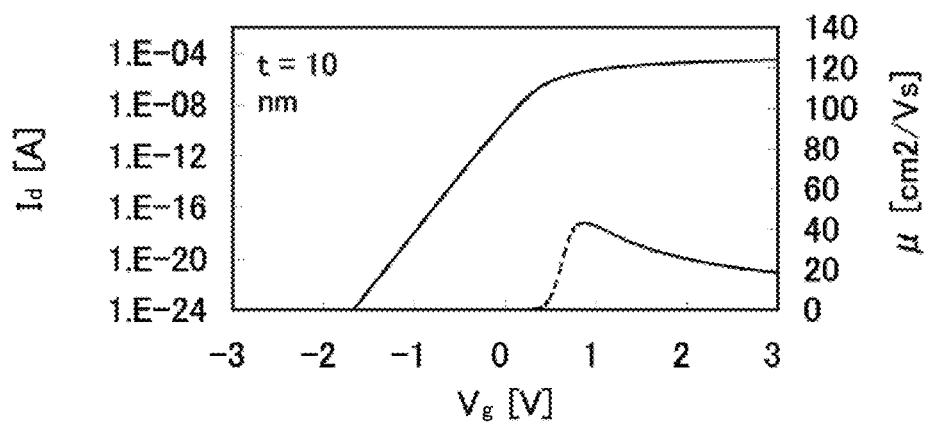
Figure 18C:
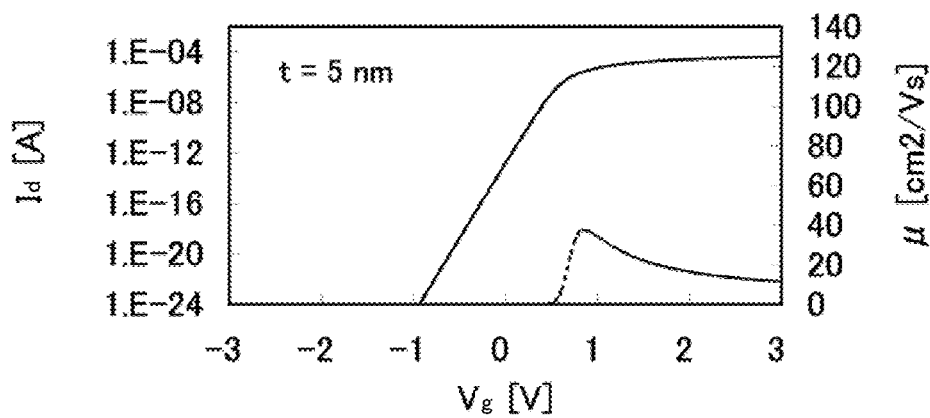

FIGS. 18A to 18C show the gate voltage dependence of the drain current $I_d$ (indicated by a solid line) and the mobility μ (indicated by a dotted line) of the transistor where the offset length (sidewall length) $L_{off}$ was 15 nm.

The drain current $I_d$ was calculated on the assumption that the drain voltage was +1 V, and the mobility μ was calculated on the assumption that the drain voltage was +0.1 V.

FIG. 18A shows the calculation result where the thickness of the gate insulating film was 15 nm.

FIG. 18B shows the calculation result where the thickness of the gate insulating film was 10 nm.

FIG. 18C shows the calculation result where the thickness of the gate insulating film was 5 nm.

In any of the structures, as the gate insulating film is thinner, the off-state current is significantly decreased, whereas no remarkable change occurs in the peak value of the mobility μ and the on-state current.

The peak of the mobility μ is about 80 cm$^2$/Vs in FIGS. 16A to 16C, about 60 cm$^2$/Vs in FIGS. 17A to 17C, and about 40 cm$^2$/Vs in FIGS. 18A to 18C; thus, the peak of the mobility μ decreases as the offset length $L_{off}$ is increased.

The same applies to the off-state current.

The on-state current also decreases as the offset length $L_{off}$ is increased; however, the decrease in the on-state current is much more gradual than the decrease in the off-state current.

Further, any of the graphs shows that the drain current exceeds 10 μA, which is needed for a memory element or the like, at a gate voltage of around 1 V.

The contents of this embodiment or part thereof can be implemented in combination with any of the other embodiments and examples.

Embodiment 9

A magnetic tunnel junction element (MTJ element) is generally known as a nonvolatile random access memory. The MTJ element is put in a low resistance state when the spin directions in films provided above and below an insulating film are parallel, and put in a high resistance state when the spin directions are not parallel, thereby storing data. On the other hand, the nonvolatile storage circuit in the above embodiments utilizes a transistor whose channel is formed in an oxide semiconductor layer, and thus has a principle that is completely different from that of the MTJ element. Table 1 shows comparison between the MTJ element (indicated by "spintronics (MTJ element)" in the table) and the nonvolatile storage circuit containing an oxide semiconductor in the above embodiments (indicated by "OS/Si" in the table).

TABLE 1

|  | Spintronics (MTJ element) | OS/Si |
|---|---|---|
| Heat resistance | Curie temperature | Process temperature at 500° C. (reliability at 150° C.) |
| Driving method | Current driving | Voltage driving |
| Writing principle | Changing spin direction of magnetic material | Turning on/off FET |
| Si LSI | Suitable for bipolar LSI (For highly integrated circuit, MOS LSI is preferable to bipolar LSI, which is unsuitable for high integration. Note that W becomes larger.) | Suitable for MOS LSI |

TABLE 1-continued

|  | Spintronics (MTJ element) | OS/Si |
|---|---|---|
| Overhead | Large (because of high Joule heat) | Smaller than overhead of MTJ element by 2 to 3 or more orders of magnitude (because of utilizing charging and discharging of parasitic capacitance) |
| Nonvolatility | Utilizing spin | Utilizing low off-state current |
| Read cycles | No limitation | No limitation |
| 3D structure | Difficult (at most two layers) | Easy (with a limitless number of layers) |
| Integration degree ($F^2$) | 4 to 15 $F^2$ | Depending on the number of layers stacked in 3D structure (need heat resistance high enough to withstand process of forming upper OS FET) |
| Material | Magnetic rare-earth element | OS material |
| Cost per bit | High | Low (might be slightly high depending on constituent of OS (e.g., In)) |
| Resistance to magnetic field | Low | High |

The MTJ element is disadvantageous in that its magnetic properties are lost when the temperature is the Curie temperature or higher because it contains a magnetic material. Further, the MTJ element is driven by current and thus is compatible with a silicon bipolar device. However, a silicon bipolar device is unsuitable for high integration. Furthermore, the MTJ element has a problem in that its power consumption is increased with the increase in memory capacity, although the MTJ element requires low write current.

In principle, the MTJ element has low resistance to a magnetic field, so that the spin direction is likely to change when the MTJ element is exposed to a high magnetic field. Moreover, it is necessary to control magnetic fluctuation due to a nanoscale magnetic material used for the MTJ element.

In addition, a rare earth element is used for the MTJ element; thus, it requires special attention to incorporate a process of forming the MTJ element in a process of forming a silicon semiconductor that is sensitive to metal contamination. Further, the MTJ element is expensive in terms of the material cost per bit.

On the other hand, the transistor whose channel is formed in an oxide semiconductor layer, which is included in the nonvolatile storage circuit in the above embodiments, has an element structure and an operation principle similar to those of a silicon MOSFET except that the region in which the channel is formed is composed of a metal oxide. Further, the transistor whose channel is formed in an oxide semiconductor layer is not affected by a magnetic field, and does not cause soft errors. These facts show that the transistor is highly compatible with a silicon integrated circuit.

Example 1

With the use of a signal processing circuit according to one embodiment of the present invention, an electronic device with low power consumption can be provided. In particular, when a signal processing circuit with low power consumption according to one embodiment of the present invention is added as a component of a portable electronic device that has difficulty in continuously receiving power, the portable electronic device can have a long continuous operation time.

A signal processing circuit according to one embodiment of the present invention can be used for display devices, personal computers, or image reproducing devices provided with recording media (typically, devices that reproduce the content of recording media such as digital versatile discs (DVDs) and have displays for displaying the reproduced images). Other examples of electronic devices that can include a signal processing circuit according to one embodiment of the present invention are mobile phones, game machines including portable game machines, personal digital assistants, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines.

The case where a signal processing circuit according to one embodiment of the present invention is applied to mobile electronic devices such as a mobile phone, a smartphone, and an e-book reader will be described.

FIG. 9 is a block diagram of a portable electronic device. The portable electronic device illustrated in FIG. 9 includes an RF circuit 421, an analog baseband circuit 422, a digital baseband circuit 423, a battery 424, a power supply circuit 425, an application processor 426, a flash memory 430, a display controller 431, a memory circuit 432, a display 433, a touch sensor 439, an audio circuit 437, a keyboard 438, and the like. The display 433 includes a display portion 434, a source driver 435, and a gate driver 436. The application processor 426 includes a CPU 427, a DSP 428, and an interface 429. For example, when the signal processing circuit described in any of the above embodiments is used for any or all of the CPU 427, the digital baseband circuit 423, the memory circuit 432, the DSP 428, the interface 429, the display controller 431, and the audio circuit 437, power consumption can be reduced.

Figure 10:
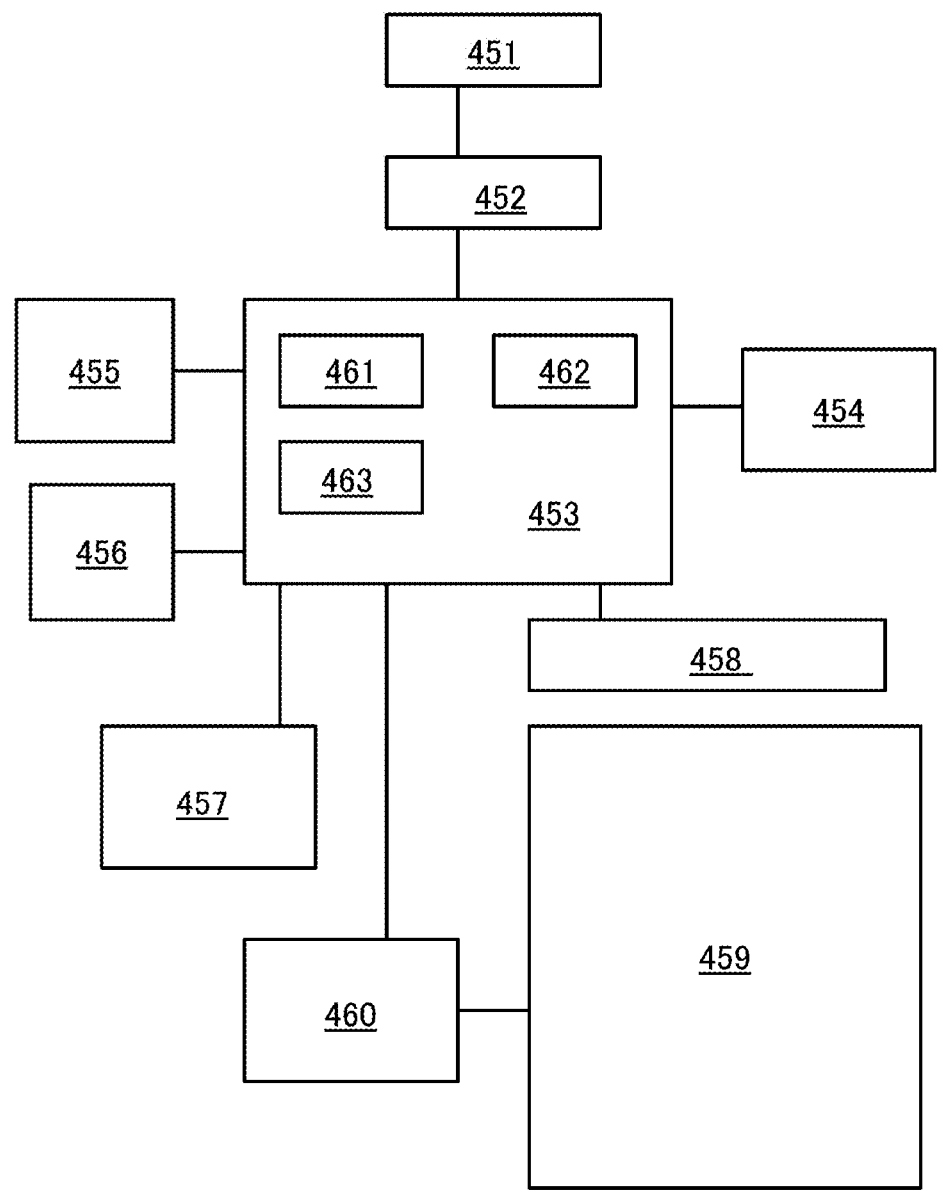
FIG. 10 is a block diagram of an e-book reader.

FIG. 10 is a block diagram of an e-book reader. The e-book reader includes a battery 451, a power supply circuit 452, a microprocessor 453, a flash memory 454, an audio circuit 455, a keyboard 456, a memory circuit 457, a touch panel 458, a display 459, and a display controller 460. The microprocessor 453 includes a CPU 461, a DSP 462, and an interface 463. For example, when the signal processing circuit described in any of the above embodiments is used for any or all of the CPU 461, the audio circuit 455, the memory circuit 457, the display controller 460, the DSP 462, and the interface 463, power consumption can be reduced.

This example can be implemented in combination with any of the above embodiments as appropriate.

Example 2

A transistor including an oxide semiconductor containing In, Sn, and Zn can have favorable characteristics by deposition of the oxide semiconductor while heating a substrate or by heat treatment after deposition of an oxide semiconductor film.

The oxide semiconductor preferably contains 5 atomic % or more of each of In, Sn, and Zn.

By intentionally heating the substrate after the deposition of the oxide semiconductor film containing In, Sn, and Zn, the field-effect mobility of the transistor can be increased.

Moreover, the threshold voltage of an n-channel transistor can be shifted in the positive direction.

The positive shift of the threshold voltage of the n-channel transistor makes the absolute value of a voltage used for keeping the n-channel transistor off to decrease, so that power consumption can be reduced.

Further, the n-channel transistor can become a normally-off transistor by a positive shift of the threshold voltage such that the threshold voltage is 0 V or more.

Characteristics of transistors using an oxide semiconductor containing In, Sn, and Zn will be described below.
(Common Conditions of Samples A to C)

An oxide semiconductor layer was formed over a substrate to have a thickness of 15 nm under the following conditions: a target having a composition ratio of In:Sn:Zn=1:1:1 was used; the gas flow rate was $Ar/O_2=6/9$ sccm; the deposition pressure was 0.4 Pa; and the deposition power was 100 W.

Next, the oxide semiconductor layer was etched in an island shape.

Then, a tungsten layer was deposited over the oxide semiconductor layer to have a thickness of 50 nm and was etched, so that a source electrode and a drain electrode were formed.

Next, a silicon oxynitride film (SiON) was formed as a gate insulating film to have a thickness of 100 nm by plasma-enhanced CVD using silane gas ($SiH_4$) and dinitrogen monoxide ($N_2O$).

Then, a gate electrode was formed in the following manner: a tantalum nitride layer was formed to a thickness of 15 nm; a tungsten layer was formed to a thickness of 135 nm; and the layers were etched.

Further, a silicon oxynitride film (SiON) was formed to a thickness of 300 nm by plasma-enhanced CVD and a polyimide film was formed to a thickness of 1.5 μm, thereby forming an interlayer insulating film.

Next, a pad for measurement was formed in the following manner: a contact hole was formed in the interlayer insulating film; a first titanium film was formed to a thickness of 50 nm; an aluminum film was formed to a thickness of 100 nm; a second titanium film was formed to a thickness of 50 nm; and the films were etched.

In this manner, a semiconductor device having a transistor was fabricated.
(Sample A)

In Sample A, heating was not performed to the substrate during the deposition of the oxide semiconductor layer.

Furthermore, in Sample A, heat treatment was not performed after the deposition of the oxide semiconductor layer and before the etching of the oxide semiconductor layer.
(Sample B)

In Sample B, the oxide semiconductor layer was deposited with the substrate heated at 200° C.

Further, in Sample B, heat treatment was not performed after the deposition of the oxide semiconductor layer and before the etching of the oxide semiconductor layer.

The oxide semiconductor layer was deposited while the substrate was heated in order to remove hydrogen serving as a donor in the oxide semiconductor layer.
(Sample C)

In Sample C, the oxide semiconductor layer was deposited with the substrate heated at 200° C.

Further, in Sample C, after the oxide semiconductor layer was deposited and before the oxide semiconductor layer was etched, heat treatment in a nitrogen atmosphere was performed at 650° C. for 1 hour and then heat treatment in an oxygen atmosphere was performed at 650° C. for 1 hour.

The heat treatment at 650° C. for 1 hour in a nitrogen atmosphere was performed in order to remove hydrogen serving as a donor in the oxide semiconductor layer.

Oxygen is also removed by the heat treatment for removing hydrogen, which serves as a donor in the oxide semiconductor layer, causing oxygen vacancy serving as a carrier in the oxide semiconductor layer.

Hence, heat treatment was performed at 650° C. for 1 hour in an oxygen atmosphere to reduce oxygen vacancy.
(Characteristics of Transistors of Samples A to C)

Figure 19A:
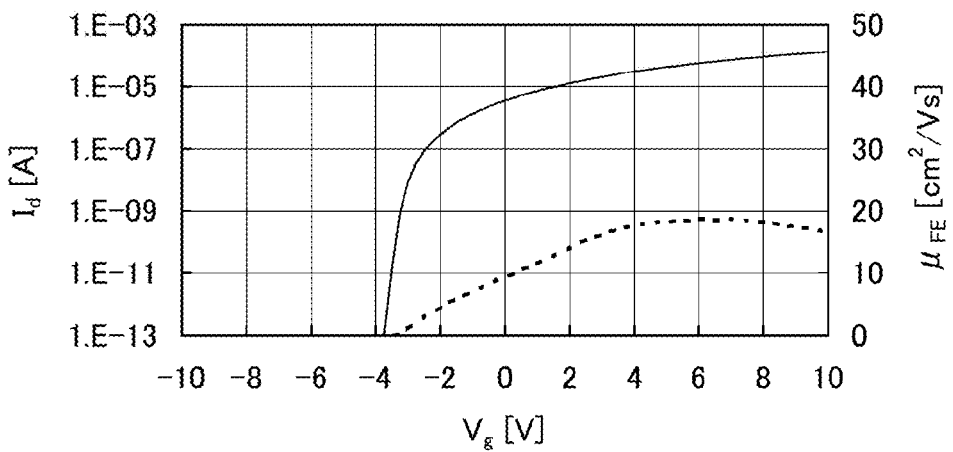
FIGS. 19A to 19C each illustrate characteristics of a transistor.

FIG. 19A shows initial characteristics of a transistor of Sample A.

Figure 19B:
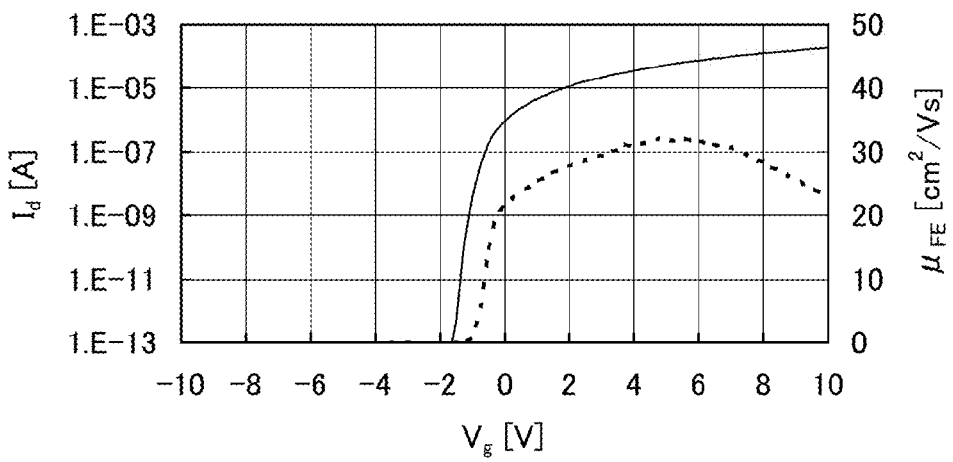

FIG. 19B shows initial characteristics of a transistor of Sample B.

Figure 19C:
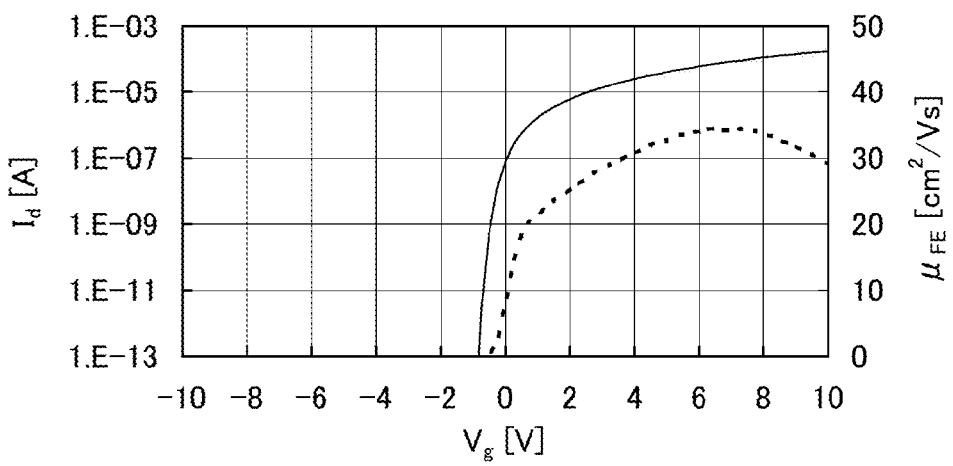

FIG. 19C shows initial characteristics of a transistor of Sample C.

The field-effect mobility of the transistor of Sample A was 18.8 $cm^2/Vs$.

The field-effect mobility of the transistor of Sample B was 32.2 $cm^2/Vs$.

The field-effect mobility of the transistor of Sample C was 34.5 $cm^2/Vs$.

According to observation of cross sections of oxide semiconductor layers, which were formed by deposition methods similar to those of Samples A to C, with a transmission electron microscope (TEM), crystallinity was observed in samples formed by the deposition methods similar to those of Sample B and Sample C, substrates of which were heated during deposition.

Further, surprisingly, the samples, the substrates of which were heated during deposition, had a non-crystalline portion and a crystalline portion having a c-axis crystalline orientation.

In a conventional polycrystal, crystals in the crystalline portion are not aligned and point in different directions. This means that the samples, the substrates of which were heated during deposition, have a novel structure.

Comparison of FIGS. 19A to 19C brings understanding that heat treatment performed on the substrate during or after deposition can remove an hydrogen element serving as a donor, thereby shifting the threshold voltage of the n-channel transistor in the positive direction.

That is, the threshold voltage of Sample B with heating of the substrate during deposition is shifted in the positive direction as compared to the threshold voltage of Sample A without heating of the substrate during deposition.

In addition, it is found from comparison of Sample B and Sample C, the substrates of which were heated during deposition, that the threshold voltage of Sample C with the heat treatment after deposition is more shifted in the positive direction than the threshold voltage of Sample B without the heat treatment after deposition.

As the temperature of heat treatment is higher, a light element such as hydrogen is removed more easily; therefore, hydrogen is more likely to be removed as the temperature of heat treatment is higher.

Accordingly, it is likely that the threshold voltage can be more shifted in the positive direction by further increasing the temperature of the heat treatment during or after deposition. (Results of Gate BT Stress Test of Sample B and Sample C)

A gate BT stress test was performed on Sample B (without heat treatment after deposition) and Sample C (with heat treatment after deposition).

First, the $V_g$-$I_d$ characteristics of each transistor were measured at a substrate temperature of 25° C. and $V_{ds}$ of 10 V to measure the characteristics of the transistor before heating and application of high positive voltage.

Next, the substrate temperature was set to 150° C. and $V_{ds}$ was set to 0.1 V.

After that, $V_g$ of 20 V was applied to the gate insulating film and was kept for 1 hour.

Then, $V_g$ was set to 0 V.

Next, the $V_g$-$I_d$ characteristics of the transistor were measured at a substrate temperature of 25° C. and $V_{ds}$ of 10 V to measure the characteristics of the transistor after heating and application of high positive voltage.

Comparison of the characteristics of the transistor before and after heating and application of high positive voltage as described above is referred to as a positive BT test.

On the other hand, first, the $V_g$-$I_d$ characteristics of each transistor were measured at a substrate temperature of 25° C. and $V_{ds}$ of 10 V to measure the characteristics of the transistor before heating and application of high negative voltage.

Then, the substrate temperature was set to 150° C. and $V_{ds}$ was set to 0.1 V.

Next, $V_g$ of −20 V was applied to the gate insulating film and was kept for 1 hour.

Next, $V_g$ was set to 0 V.

Then, the $V_g$-$I_d$ characteristics of the transistor were measured at a substrate temperature of 25° C. and $V_{ds}$ of 10 V to measure the characteristics of the transistor after heating and application of high negative voltage.

Comparison of the characteristics of the transistor before and after heating and application of high negative voltage as described above is referred to as a negative BT test.

Figure 20A:
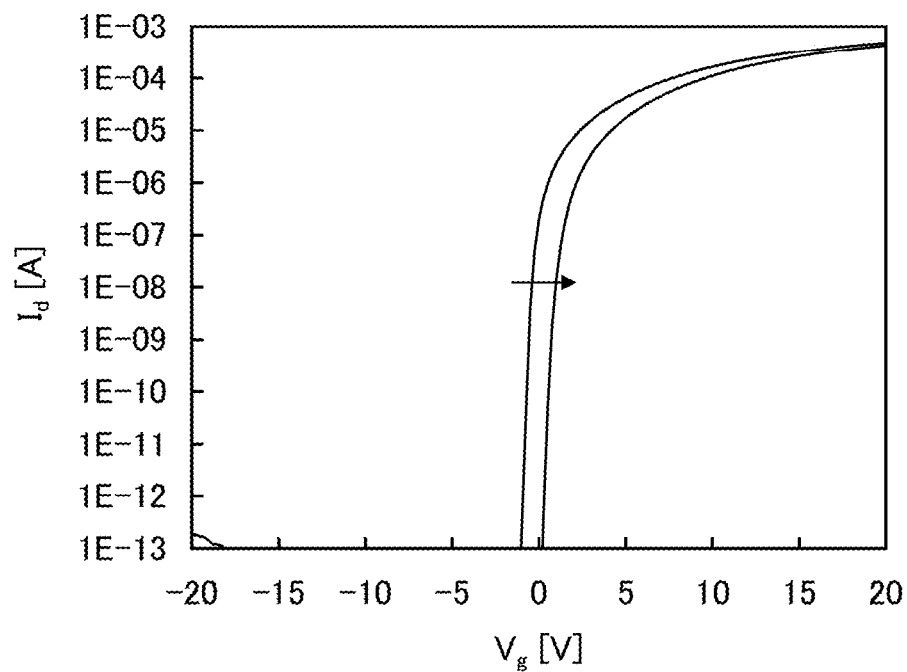
FIGS. 20A and 20B each illustrate characteristics of a transistor.
Figure 20B:
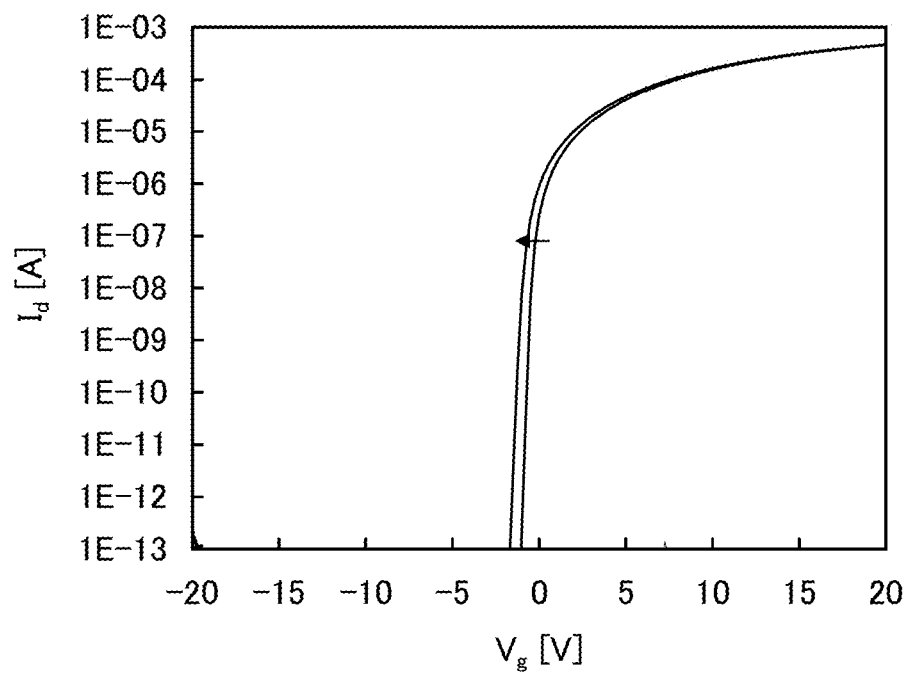

FIG. 20A shows the result of the positive BT test of Sample B. FIG. 20B shows the result of the negative BT test of Sample B.

Figure 21A:
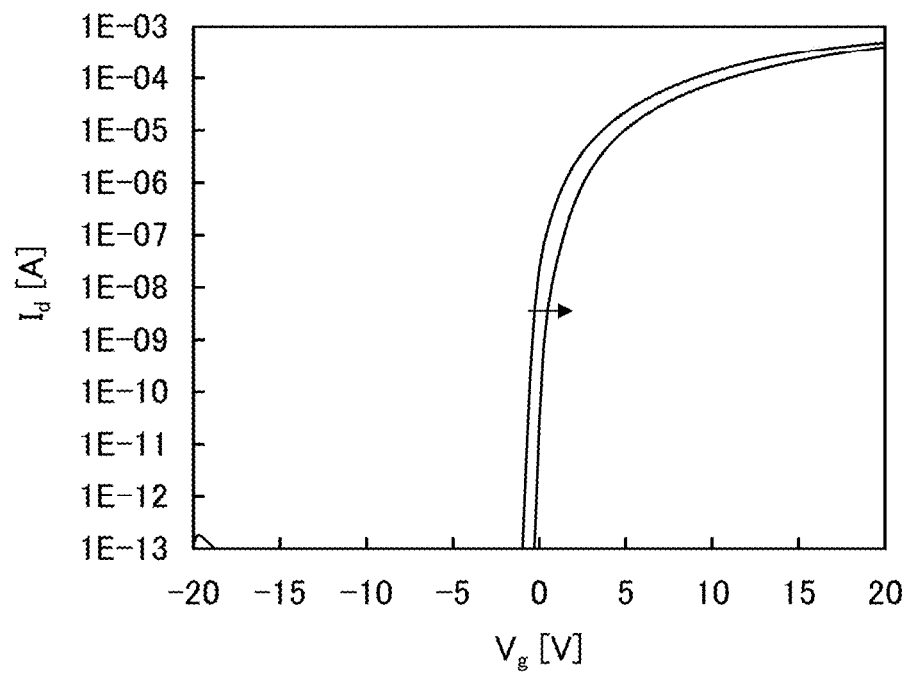
FIGS. 21A and 21B each illustrate characteristics of a transistor.
Figure 21B:
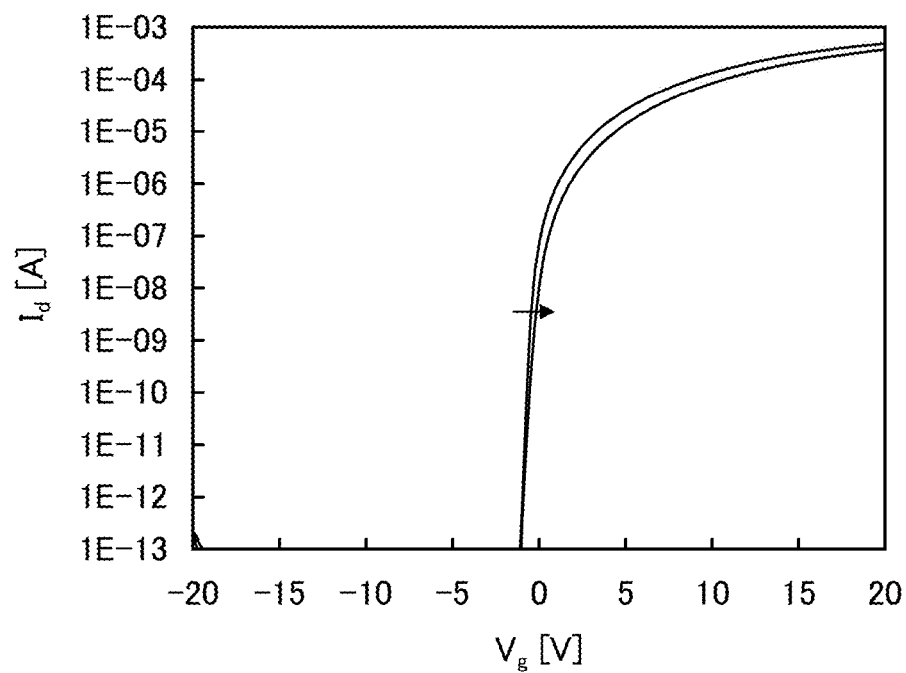

FIG. 21A shows the result of the positive BT test of Sample C. FIG. 21B shows the result of the negative BT test of Sample C.

Although the positive BT test and the negative BT test are tests for determining the deterioration degree of a transistor, it is found from FIG. 20A and FIG. 21A that the threshold voltage can be shifted in the positive direction by performing at least the positive BT test.

In particular, FIG. 20A reveals that the positive BT test made the transistor a normally-off transistor.

It is therefore found that performing the positive BT test in addition to the heat treatment in the fabrication process of the transistor makes it possible to promote a shift of the threshold voltage in the positive direction and consequently a normally-off transistor can be fabricated.

Figure 14:
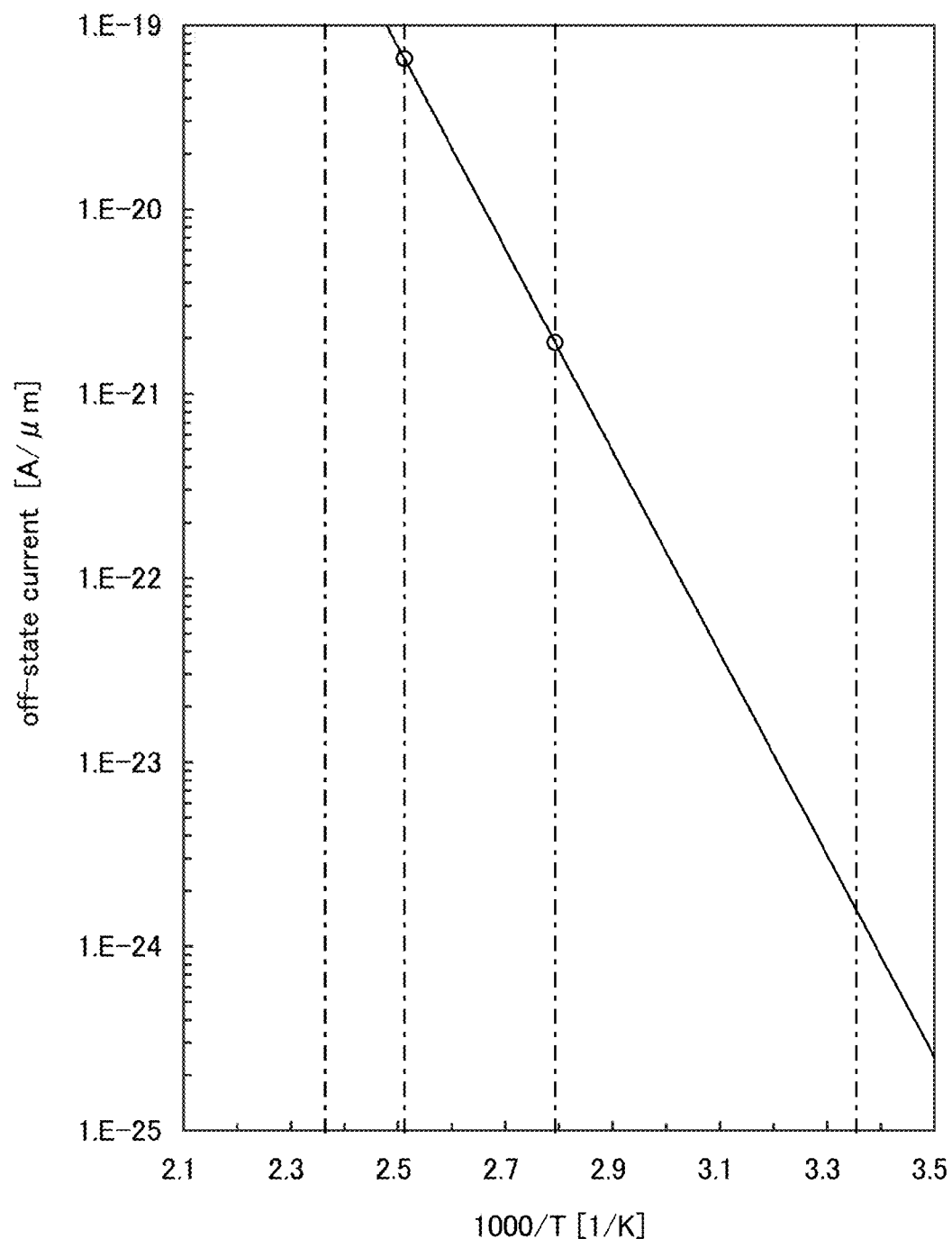
FIG. 14 illustrates temperature dependence of off-state current of a transistor.

FIG. 14 shows the relation between the off-state current of the transistor of Sample A and the inverse of the substrate temperature (absolute temperature) at measurement.

In FIG. 14, the horizontal axis represents a value (1000/T) obtained by multiplying the inverse of the substrate temperature at measurement by 1000.

The amount of current in FIG. 14 is the amount of current per micrometer in the channel width.

The off-state current was less than or equal to $1\times10^{-19}$ A at a substrate temperature of 125° C. (1000/T is about 2.51).

The off-state current was less than or equal to $1\times10^{-20}$ A at a substrate temperature of 85° C. (1000/T is about 2.79).

In other words, it was found that the off-state current of the transistor containing an oxide semiconductor is extremely low as compared to a transistor containing a silicon semiconductor.

The off-state current is decreased as the temperature decreases; therefore, it is clear that the off-state current at ordinary temperature is still lower.

This application is based on Japanese Patent Applications serial No. 2011-094774 and No. 2011-108894 filed with Japan Patent Office on Apr. 21, 2011 and May 14, 2011, respectively, the entire contents of which are hereby incorporated by reference.

What is claimed is:

1. A signal processing circuit comprising:
   a circuit; and
   a nonvolatile storage circuit comprising a first transistor and a node,
   wherein the circuit is configured to output a first signal to a first terminal of the first transistor when a first power supply potential is supplied to the circuit,
   wherein the nonvolatile storage circuit is configured to store data corresponding to the first signal in the node electrically connected to a second terminal of the first transistor when a second signal is supplied to a gate of the first transistor,
   wherein the nonvolatile storage circuit is configured to hold the data while a third signal is supplied to the gate of the first transistor and the first power supply potential is not supplied to the circuit,
   wherein a potential of the first signal is a first potential and equal to the first power supply potential,
   wherein a potential of the second signal is a second potential,
   wherein a potential of the third signal is a ground potential,
   wherein a potential of the data is the first potential, and
   wherein the second potential is higher than the first potential.

2. The signal processing circuit according to claim 1,
   wherein the circuit comprises a first arithmetic circuit, a second arithmetic circuit, and a second transistor,
   wherein an input terminal of the first arithmetic circuit is electrically connected to an output terminal of the second arithmetic circuit,
   wherein an output terminal of the first arithmetic circuit is electrically connected to a first terminal of the second transistor,
   wherein an input terminal of the second arithmetic circuit is electrically connected to a second terminal of the second transistor and the first terminal of the first transistor,
   wherein the first arithmetic circuit is configured to output the first signal from the output terminal of the first arithmetic circuit, and
   wherein the second transistor is configured to output the first signal to the first terminal of the first transistor when the second transistor is turned on.

3. The signal processing circuit according to claim 2,
   wherein the first transistor comprises an oxide semiconductor layer comprising a channel formation region.

4. The signal processing circuit according to claim 2,
wherein the nonvolatile storage circuit comprises a capacitor,
wherein a first terminal of the capacitor is electrically connected to the node, and
wherein a second terminal of the capacitor is configured to be supplied with the ground potential.

5. The signal processing circuit according to claim 2,
wherein the second potential is higher than a potential obtained by addition of a threshold voltage of the first transistor to the first potential.

6. The signal processing circuit according to claim 2, further comprising a step-up circuit configured to boost the first power supply potential to generate a second power supply potential, and
wherein the potential of the second signal is equal to the second power supply potential.

7. The signal processing circuit according to claim 2, further comprising a step-up circuit configured to boost the first power supply potential to generate a second power supply potential,
wherein the potential of the second signal is equal to the second power supply potential,
wherein the step-up circuit comprises a third to (n+3)th transistors (n is a natural number) electrically connected in series with each other, and
wherein each of the third to (n+3)th transistors comprises an oxide semiconductor.

8. A signal processing circuit comprising:
a circuit; and
a nonvolatile storage circuit comprising a first transistor and a node,
wherein the circuit is configured to output a first signal to a first terminal of the first transistor when a first power supply potential is supplied to the circuit,
wherein the nonvolatile storage circuit is configured to store data corresponding to the first signal in the node electrically connected to a second terminal of the first transistor when a second signal is supplied to a gate of the first transistor,
wherein the nonvolatile storage circuit is configured to hold the data while a third signal is supplied to the gate of the first transistor and the first power supply potential is not supplied to the circuit,
wherein a potential of the first signal is a first potential and equal to the first power supply potential,
wherein a potential of the second signal is a second potential,
wherein a potential of the third signal is a ground potential,
wherein a potential of the data is the first potential,
wherein the second potential is higher than the first potential,
wherein the circuit comprises a first arithmetic circuit and a second arithmetic circuit,
wherein an input terminal of the first arithmetic circuit is electrically connected to an output terminal of the second arithmetic circuit,
wherein an output terminal of the first arithmetic circuit is electrically connected to the first terminal of the first transistor,
wherein an input terminal of the second arithmetic circuit is electrically connected to the second terminal of the first transistor, and
wherein the first arithmetic circuit is configured to output the first signal from the output terminal of the first arithmetic circuit.

9. The signal processing circuit according to claim 8,
wherein the first transistor comprises an oxide semiconductor layer comprising a channel formation region.

10. The signal processing circuit according to claim 8,
wherein the nonvolatile storage circuit comprises a capacitor,
wherein a first terminal of the capacitor is electrically connected to the node, and
wherein a second terminal of the capacitor is configured to be supplied with the ground potential.

11. The signal processing circuit according to claim 8,
wherein the second potential is higher than a potential obtained by addition of a threshold voltage of the first transistor to the first potential.

12. The signal processing circuit according to claim 8, further comprising a step-up circuit configured to boost the first power supply potential to generate a second power supply potential, and
wherein the potential of the second signal is equal to the second power supply potential.

13. The signal processing circuit according to claim 8, further comprising a step-up circuit configured to boost the first power supply potential to generate a second power supply potential,
wherein the potential of the second signal is equal to the second power supply potential,
wherein the step-up circuit comprises a third to (n+3)th transistors (n is a natural number) electrically connected in series with each other, and
wherein each of the third to (n+3)th transistors comprises an oxide semiconductor.

14. A signal processing circuit comprising:
a circuit; and
a nonvolatile storage circuit comprising a first transistor and a node,
wherein the circuit is configured to output a first signal to a first terminal of the first transistor when a first power supply potential is supplied to the circuit,
wherein the nonvolatile storage circuit is configured to store data corresponding to the first signal in the node electrically connected to a second terminal of the first transistor when a second signal is supplied to a gate of the first transistor,
wherein the nonvolatile storage circuit is configured to hold the data while a third signal is supplied to the gate of the first transistor and the first power supply potential is not supplied to the circuit,
wherein a potential of the first signal is a first potential and equal to the first power supply potential,
wherein a potential of the second signal is a second potential,
wherein a potential of the third signal is a ground potential,
wherein a potential of the data is the first potential,
wherein the second potential is higher than the first potential,
wherein the circuit comprises a first arithmetic circuit, a second arithmetic circuit, an inverter, and a second transistor,
wherein an input terminal of the first arithmetic circuit is electrically connected to an output terminal of the second arithmetic circuit and a first terminal of the second transistor, wherein an output terminal of the first arithmetic circuit is electrically connected to an input terminal of the second arithmetic circuit and the first terminal of the first transistor, wherein an input terminal of the inverter is electrically connected to the second terminal of the first transistor, wherein an output terminal of the inverter is electrically connected to a second terminal of the second transistor, and wherein the first arithmetic circuit is configured to output the first signal from the output terminal of the first arithmetic circuit.

15. The signal processing circuit according to claim 14, wherein the first transistor comprises an oxide semiconductor layer comprising a channel formation region.

16. The signal processing circuit according to claim 14, wherein the nonvolatile storage circuit comprises a capacitor, wherein a first terminal of the capacitor is electrically connected to the node, and wherein a second terminal of the capacitor is configured to be supplied with the ground potential.

17. The signal processing circuit according to claim 14, wherein the second potential is higher than a potential obtained by addition of a threshold voltage of the first transistor to the first potential.

18. The signal processing circuit according to claim 14, further comprising a step-up circuit configured to boost the first power supply potential to generate a second power supply potential, and wherein the potential of the second signal is equal to the second power supply potential.

19. The signal processing circuit according to claim 14, further comprising a step-up circuit configured to boost the first power supply potential to generate a second power supply potential, wherein the potential of the second signal is equal to the second power supply potential, wherein the step-up circuit comprises a third to (n+3)th transistors (n is a natural number) electrically connected in series with each other, and wherein each of the third to (n+3)th transistors comprises an oxide semiconductor.

* * * * *